(12) United States Patent
Jikutani et al.

(10) Patent No.: US 8,891,571 B2
(45) Date of Patent: Nov. 18, 2014

(54) VERTICAL CAVITY SURFACE EMITTING LASER DEVICE, VERTICAL CAVITY SURFACE EMITTING LASER ARRAY, OPTICAL SCANNING APPARATUS, IMAGE FORMING APPARATUS, OPTICAL TRANSMISSION MODULE AND OPTICAL TRANSMISSION SYSTEM

(75) Inventors: Naoto Jikutani, Miyagi (JP); Shunichi Sato, Miyagi (JP); Satoru Sugawara, Miyagi (JP); Hiroshi Motomura, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 167 days.

(21) Appl. No.: 12/989,538

(22) PCT Filed: Apr. 28, 2009

(86) PCT No.: PCT/JP2009/058733
§ 371 (c)(1),
(2), (4) Date: Oct. 25, 2010

(87) PCT Pub. No.: WO2009/133966
PCT Pub. Date: Nov. 5, 2009

(65) Prior Publication Data
US 2011/0037825 A1 Feb. 17, 2011

(30) Foreign Application Priority Data

May 2, 2008 (JP) ................. 2008-120062
Jun. 11, 2008 (JP) ................. 2008-152427
Apr. 7, 2009 (JP) ................. 2009-093021

(51) Int. Cl.
*H01S 5/00* (2006.01)
*B41J 2/385* (2006.01)
(Continued)

(52) U.S. Cl.
CPC ............. *B41J 2/442* (2013.01); *H01S 5/18347* (2013.01); *H01S 5/18358* (2013.01);
(Continued)

(58) Field of Classification Search
USPC ......... 347/111, 112, 129, 130, 224, 225, 233, 347/238; 372/39, 43.01, 44.01, 45.01, 372/45.012, 46.01, 50.1, 50.12, 50.124
See application file for complete search history.

(56) References Cited

U.S. PATENT DOCUMENTS 5,357,123 A 10/1994 Sugawara
5,493,577 A 2/1996 Choquette et al.
(Continued)

FOREIGN PATENT DOCUMENTS

JP 5-29716 2/1993
JP 10-223951 8/1998
(Continued)

OTHER PUBLICATIONS

International Search Report in PCT/JP2009/058733.
(Continued)

*Primary Examiner* — Justin Seo
*Assistant Examiner* — Kendrick Liu
(74) *Attorney, Agent, or Firm* — Cooper & Dunham LLP

(57) ABSTRACT

A disclosed vertical cavity surface emitting laser device emits light orthogonally in relation to a substrate and includes a resonator structure including an active layer; and semiconductor multilayer reflectors disposed in such a manner as to sandwich the resonator structure between them and including a confinement structure which confines an injected current and transverse modes of oscillation light at the same time. The confinement structure has an oxidized region which surrounds a current passage region. The oxidized region is formed by oxidizing a part of a selective oxidation layer which includes aluminum and includes at least an oxide. The selective oxidation layer is at least 25 nm in thickness. The semiconductor multilayer reflectors include an optical confinement reducing section which reduces optical confinement in a transverse direction. The optical confinement reducing section is disposed on the substrate side in relation to the resonator structure.

8 Claims, 53 Drawing Sheets

(51) Int. Cl.
  *B41J 2/45* (2006.01)
  *B41J 2/47* (2006.01)
  *B41J 2/44* (2006.01)
  *H01S 5/183* (2006.01)
  *H01S 5/42* (2006.01)
  *H01S 5/065* (2006.01)
  *H01S 5/32* (2006.01)

(52) U.S. Cl.
  CPC ............ *H01S 5/18311* (2013.01); *H01S 5/423* (2013.01); *H01S 5/0655* (2013.01); *B41J 2/473* (2013.01); *H01S 5/3202* (2013.01); *H01S 2301/166* (2013.01); *H01S 5/18308* (2013.01)
  USPC ............ 372/46.013; 372/45.012; 372/50.124; 347/130; 347/238

(56) References Cited

U.S. PATENT DOCUMENTS

| | | | |
|---|---|---|---|
| 5,923,691 | A | 7/1999 | Sato |
| 5,939,733 | A | 8/1999 | Sato |
| 6,002,700 | A | 12/1999 | Sato |
| 6,072,196 | A | 6/2000 | Sato |
| 6,207,973 | B1 | 3/2001 | Sato et al. |
| 6,233,264 | B1 | 5/2001 | Sato |
| 6,320,893 | B1 * | 11/2001 | Ueki .......................... 372/96 |
| 6,542,528 | B1 | 4/2003 | Sato et al. |
| 6,563,851 | B1 | 5/2003 | Jikutani et al. |
| 6,614,821 | B1 | 9/2003 | Jikutani et al. |
| 6,674,785 | B2 | 1/2004 | Sato et al. |
| 6,714,573 | B2 | 3/2004 | Coldren et al. |
| 6,720,585 | B1 * | 4/2004 | Wasserbauer et al. ......... 257/98 |
| 6,765,232 | B2 | 7/2004 | Takshashi et al. |
| 6,803,604 | B2 | 10/2004 | Takahashi et al. |
| 6,927,412 | B2 | 8/2005 | Takahashi et al. |
| 6,959,025 | B2 | 10/2005 | Jikutani et al. |
| 6,975,663 | B2 | 12/2005 | Sekiya et al. |
| 7,372,886 | B2 | 5/2008 | Song et al. |
| 7,466,738 | B2 | 12/2008 | Jikutani |
| 7,542,499 | B2 | 6/2009 | Jikutani |
| 7,684,458 | B2 | 3/2010 | Sato et al. |
| 7,693,204 | B2 | 4/2010 | Sato et al. |
| 7,720,125 | B2 | 5/2010 | Jikutani et al. |
| 7,746,912 | B2 | 6/2010 | Motomura et al. |
| 7,800,805 | B2 | 9/2010 | Hayashi et al. |
| 2004/0208216 | A1 * | 10/2004 | Naone et al. ................. 372/45 |
| 2004/0209386 | A1 * | 10/2004 | Spilios ........................ 438/22 |
| 2005/0013334 | A1 * | 1/2005 | Watanabe et al. ............ 372/44 |
| 2005/0147143 | A1 * | 7/2005 | Jikutani ....................... 372/43 |
| 2006/0093006 | A1 | 5/2006 | Jikutani |
| 2006/0098706 | A1 | 5/2006 | Sato et al. |
| 2007/0153856 | A1 * | 7/2007 | Kageyama et al. ...... 372/45.012 |
| 2007/0280322 | A1 | 12/2007 | Sato et al. |
| 2007/0297484 | A1 | 12/2007 | Mochizuki |
| 2008/0024849 | A1 * | 1/2008 | Hayashi et al. ............... 359/204 |
| 2008/0049329 | A1 | 2/2008 | Takeuchi |
| 2008/0055672 | A1 | 3/2008 | Watanabe et al. |
| 2008/0056321 | A1 | 3/2008 | Motomura et al. |
| 2008/0088893 | A1 * | 4/2008 | Ishida et al. ................. 358/509 |
| 2008/0212631 | A1 * | 9/2008 | Takeuchi et al. ........... 372/45.01 |
| 2008/0233017 | A1 | 9/2008 | Sato et al. |
| 2009/0022199 | A1 | 1/2009 | Jikutani et al. |
| 2009/0262770 | A1 | 10/2009 | Itoh et al. |
| 2009/0295902 | A1 | 12/2009 | Sato et al. |
| 2010/0060712 | A1 | 3/2010 | Sato et al. |
| 2010/0172654 | A1 | 7/2010 | Enami et al. |

FOREIGN PATENT DOCUMENTS

| | | |
|---|---|---|
| JP | 11-48520 | 2/1999 |
| JP | 2003-347670 | 12/2003 |
| JP | 2004-311834 | 11/2004 |
| JP | 2004-342970 | 12/2004 |
| JP | 2005-251860 | 9/2005 |
| JP | 2005-340779 | 12/2005 |
| JP | 2005-354061 | 12/2005 |
| JP | 2006-135226 | 5/2006 |
| JP | 2006-140446 | 6/2006 |
| JP | 2007-266592 | 10/2007 |
| JP | 2007-299897 | 11/2007 |
| JP | 2007-300429 | 11/2007 |
| JP | 2007-318064 | 12/2007 |
| JP | 2008-34797 | 2/2008 |
| JP | 2008-60322 | 3/2008 |
| JP | 2008-78615 | 4/2008 |

OTHER PUBLICATIONS

Choquette, K.D. et al. (1994), "Low threshold voltage vertical-cavity lasers fabricated by selective oxidation", Electronics Letters, vol. 30, No. 24, pp. 2043-2044.

Nakayama, H. et al. (2004), "780nm VCSELs for Home Networks and Printers", Electronic Components and Technology Conference Proceedings, 54th, vol. 2, pp. 1371-1375.

Japanese official action dated Dec. 10, 2013 in corresponding Japanese patent application No. 2009-93021.

Japanese official action dated Apr. 11, 2013 in corresponding Japanese patent application No. 2009-093021.

* cited by examiner

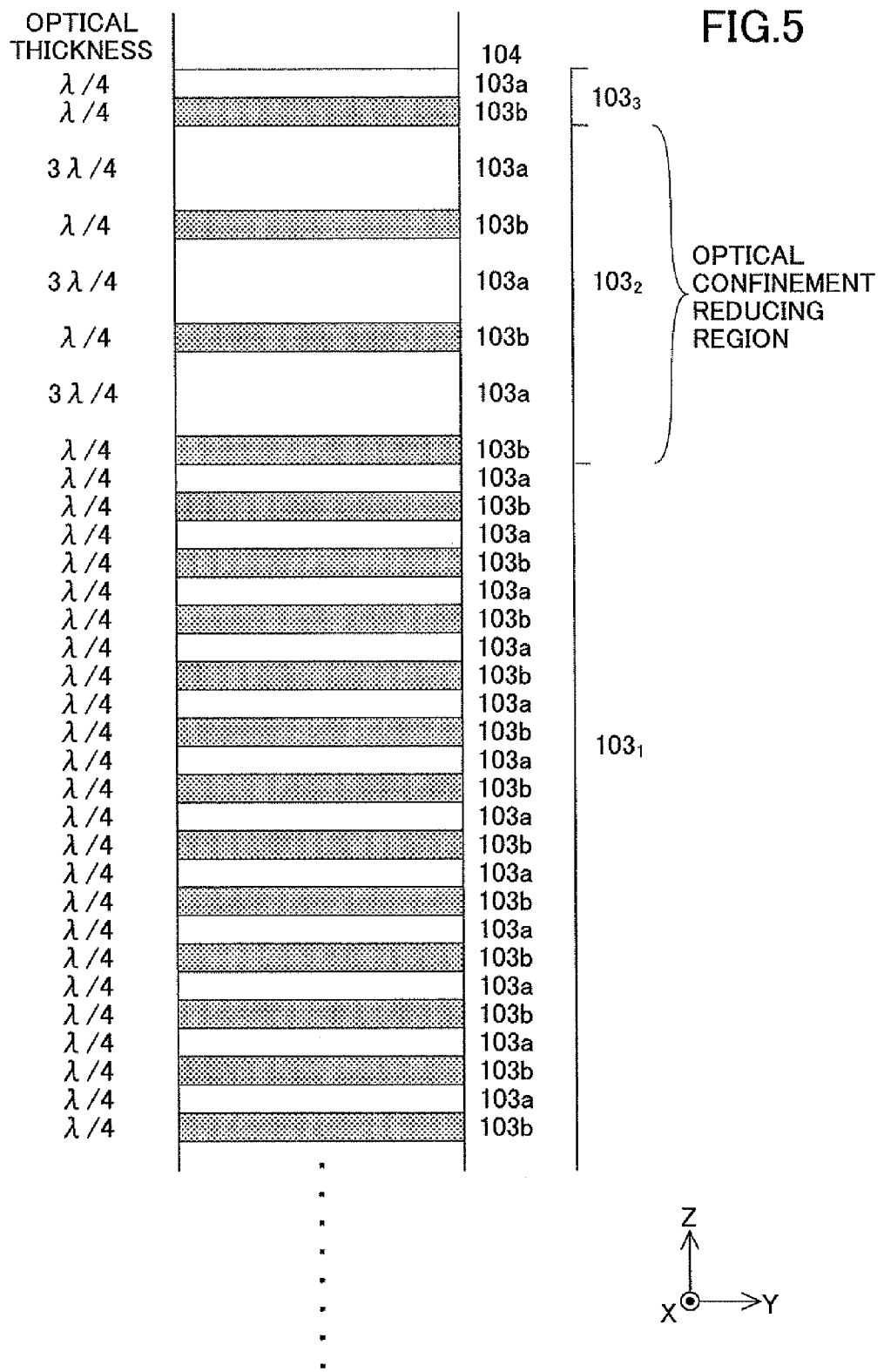

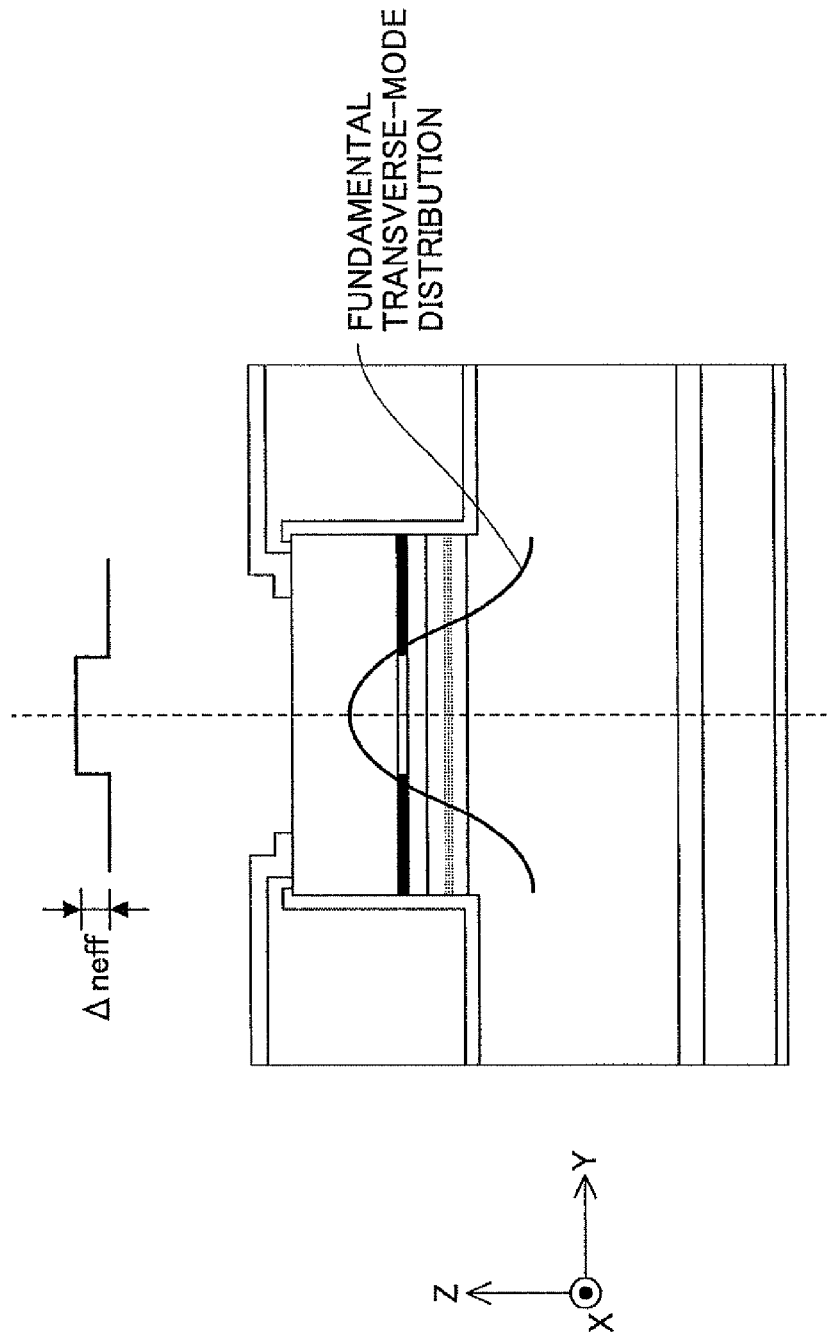

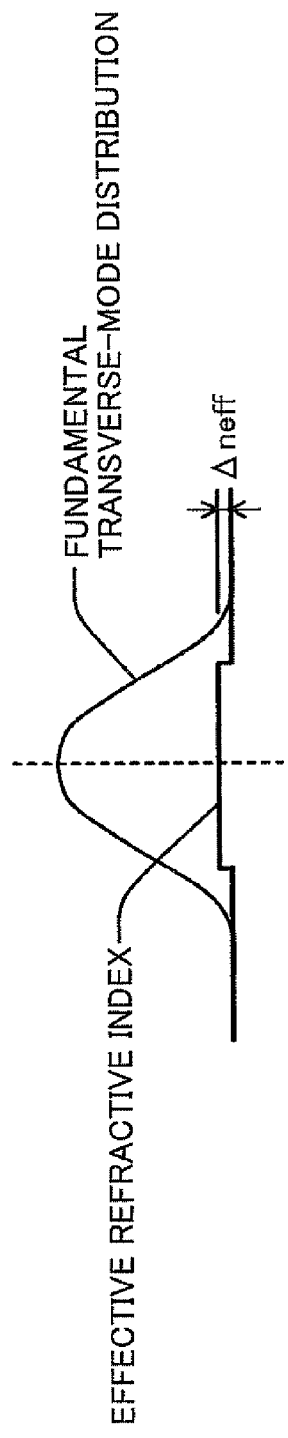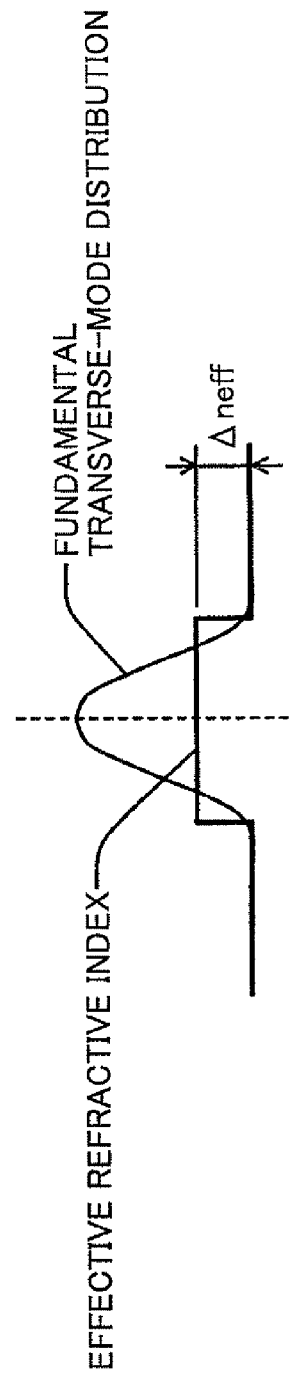

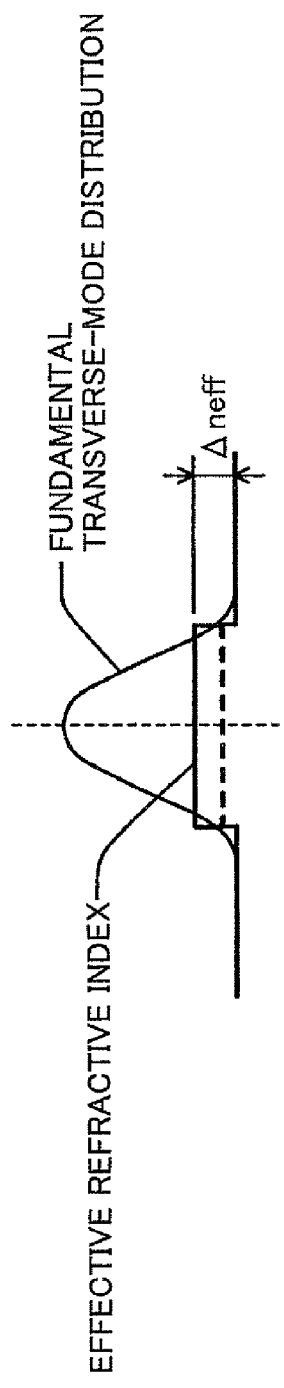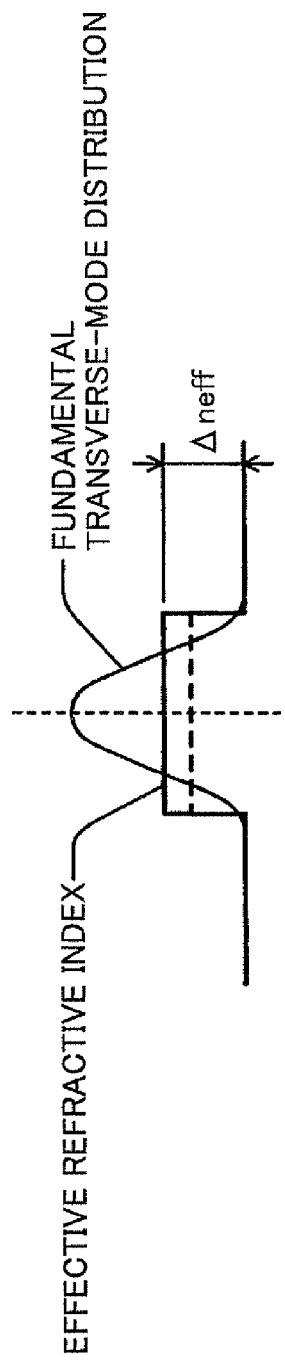

FIG.14

| | REFRACTIVE INDEX |
|---|---|
| $Al_{0.3}Ga_{0.7}As$ | 3.4924 |
| $Al_{0.9}Ga_{0.1}As$ | 3.0901 |
| AlAs | 3.0179 |
| GaAs | 3.6771 |
| $AlO_x$ | 1.6 |

FIG.15

| THICKNESS OF SELECTIVE OXIDATION LAYER [nm] | OXIDE CONFINEMENT DIAMETER (DIAMETER) [μm] | | | |
|---|---|---|---|---|
| | 3.5 | 4.0 | 4.5 | 5.0 |
| 20 | 0.707 | 0.788 | 0.846 | 0.891 |
| 25 | 0.871 | 0.921 | 0.949 | 0.967 |
| 28 | 0.930 | 0.959 | 0.974 | 0.984 |
| 30 | 0.953 | 0.973 | 0.983 | 0.989 |

| THICKNESS OF SELECTIVE OXIDATION LAYER [nm] | OXIDE CONFINEMENT DIAMETER (DIAMETER) [μm] | | | |
|---|---|---|---|---|
| | 3.5 | 4.0 | 4.5 | 5.0 |
| 20 | × | × | × | × |
| 25 | × | ○ | ○ | ○ |
| 28 | ○ | ○ | ○ | ○ |
| 30 | ○ | ○ | ○ | ○ |

FIG.27

| NUMBER OF PAIRS | FUNDAMENTAL TRANSVERSE-MODE OPTICAL CONFINEMENT COEFFICIENT (%) |
|---|---|
| 0 | 95.78 |
| 1 | 95.14 |
| 2 | 94.64 |
| 3 | 94.27 |

FIG.33

| NUMBER OF PAIRS | FUNDAMENTAL TRANSVERSE-MODE OPTICAL CONFINEMENT COEFFICIENT (%) |
|---|---|
| 0 | 95.78 |
| 1 | 94.86 |
| 2 | 94.12 |
| 3 | 93.55 |

| NUMBER OF PAIRS | FUNDAMENTAL TRANSVERSE-MODE OPTICAL CONFINEMENT COEFFICIENT (%) |
|---|---|
| 0 | 95.78 |
| 1 | 94.20 |
| 2 | 92.94 |
| 3 | 91.95 |

FIG.39

<table>
<tr><th rowspan="3">TYPE</th><th colspan="3">OPTICAL CONFINEMENT REDUCING REGION</th><th colspan="2">FUNDAMENTAL TRANSVERSE-MODE OPTICAL CONFINEMENT COEFFICIENT (%)</th><th colspan="2">OPTICAL-CONFINEMENT -COEFFICIENT REDUCTION RATE (%)</th></tr>
<tr><th colspan="2">OPTICAL THICKNESS</th><th rowspan="2"></th><th colspan="2">ABSORPTION LOSS REDUCING LAYER</th><th colspan="2">ABSORPTION LOSS REDUCING LAYER</th></tr>
<tr><th>HIGH REFRACTIVE INDEX LAYER</th><th>LOW REFRACTIVE INDEX LAYER</th><th>ABSENT</th><th>PRESENT</th><th>ABSENT</th><th>PRESENT</th></tr>
<tr><td>A</td><td>3λ/4</td><td>λ/4</td><td></td><td>94.27</td><td>94.88</td><td>98.42</td><td>99.06</td></tr>
<tr><td>B</td><td>λ/4</td><td>3λ/4</td><td></td><td>93.55</td><td>94.14</td><td>97.67</td><td>98.29</td></tr>
<tr><td>C</td><td>3λ/4</td><td>3λ/4</td><td></td><td>91.95</td><td>92.95</td><td>96.00</td><td>97.05</td></tr>
</table>

| STANDING WAVE DISTRIBUTION | OPTICAL THICKNESS | | |
|---|---|---|---|
| | | 104 | |
| ANTINODE → | | | |
| NODE → | $\lambda/4$ | 103a | 103$_3$ |
| ANTINODE → | $\lambda/4$ | 103b | |
| NODE → | | | |
| ANTINODE → | $3\lambda/4$ | 103a | |
| NODE → | | | |
| ANTINODE → | $\lambda/4$ | 103b | |
| NODE → | | | |
| ANTINODE → | $3\lambda/4$ | 103a | 103$_2$ |
| NODE → | | | |
| ANTINODE → | $\lambda/4$ | 103b | |
| NODE → | | | |
| ANTINODE → | $3\lambda/4$ | 103a | |
| NODE → | | | |
| ANTINODE → | $\lambda/4$ | 103b | |
| NODE → | $\lambda/4$ | 103a | |
| ANTINODE → | $\lambda/4$ | 103b | |
| NODE → | $\lambda/4$ | 103a | |
| ANTINODE → | $\lambda/4$ | 103b | |
| NODE → | $\lambda/4$ | 103a | |
| ANTINODE → | $\lambda/4$ | 103b | |
| NODE → | $\lambda/4$ | 103a | |
| ANTINODE → | $\lambda/4$ | 103b | |
| NODE → | $\lambda/4$ | 103a | |
| ANTINODE → | $\lambda/4$ | 103b | |
| NODE → | $\lambda/4$ | 103a | |
| ANTINODE → | $\lambda/4$ | 103b | 103$_1$ |
| NODE → | $\lambda/4$ | 103a | |
| ANTINODE → | $\lambda/4$ | 103b | |
| NODE → | $\lambda/4$ | 103a | |
| ANTINODE → | $\lambda/4$ | 103b | |
| NODE → | $\lambda/4$ | 103a | |
| ANTINODE → | $\lambda/4$ | 103b | |
| NODE → | $\lambda/4$ | 103a | |
| ANTINODE → | $\lambda/4$ | 103b | |
| NODE → | $\lambda/4$ | 103a | |
| ANTINODE → | $\lambda/4$ | 103b | |
| NODE → | $\lambda/4$ | 103a | |
| ANTINODE → | $\lambda/4$ | 103b | |

FIG.51

VERTICAL CAVITY SURFACE EMITTING LASER DEVICE, VERTICAL CAVITY SURFACE EMITTING LASER ARRAY, OPTICAL SCANNING APPARATUS, IMAGE FORMING APPARATUS, OPTICAL TRANSMISSION MODULE AND OPTICAL TRANSMISSION SYSTEM

TECHNICAL FIELD

The present invention is directed to a vertical cavity surface emitting laser device, a vertical cavity surface emitting laser array, an optical scanning apparatus, an image forming apparatus, an optical transmission module and an optical transmission system. In particular, the present invention is directed to a vertical cavity surface emitting laser device which emits light orthogonally in relation to a substrate; a vertical cavity surface emitting laser array in which such vertical cavity surface emitting laser devices are integrated; an optical scanning apparatus including such a vertical cavity surface emitting laser device or such a vertical cavity surface emitting laser array; an image forming apparatus including such an optical scanning apparatus; and an optical transmission module and an optical transmission system including such a vertical surface emitting laser array.

BACKGROUND ART

Because of their structures, vertical cavity surface emitting laser devices are characterized by ease of lowering the threshold current and the power consumption. In recent years, oxide-confined vertical cavity surface emitting laser devices have been intensively studied, which devices allow lowering the threshold current and provide a higher-speed response compared to ion-implanted vertical cavity surface emitting laser devices that were previously studied (see Non-patent Document 1, for example).

Oxide-confined vertical cavity surface emitting laser devices have an advantage of having favorable transverse mode confinement provided by an oxide, which results in a stable oscillation mode; however, since the optical confinement by the oxide is too strong, it is difficult to obtain a single fundamental transverse-mode oscillation. Note that an oxide-confined vertical cavity surface emitting laser device is referred to simply as "vertical cavity surface emitting laser device" below.

A widely adopted conventional technique for achieving a single fundamental transverse-mode operation is to provide a small area of an unoxidized region, which is a current injection region (current passage region), so that higher-order transverse modes are confined and do not oscillate. In other words, the technique is to cut off higher-order transverse modes.

Another proposed method for achieving a single fundamental transverse mode operation is to reduce the strength of the transverse mode confinement provided by an oxide. If the strength of the transverse mode confinement is reduced, higher-order mode oscillation is suppressed. In this case, there is no need to make the area of the unoxidized region small, and therefore, both thermal and electrical characteristics are improved. This results in an increase in the saturation power and also an increase in the modulation rate. In order to reduce the strength of the optical confinement by an oxide, conventionally, the oxide is provided at a position away from the active layer, or the oxide is made to be thin.

Vertical cavity surface emitting laser devices may be readily arranged in two-dimensions at high density since each laser device emits laser light orthogonally in relation to its substrate. Accordingly, their applications to high-speed and high-definition electrophotographic systems and the like have begun to be explored. For example, Non-patent Document 2 discloses a printer using a 780-nm band VCSEL array (vertical cavity surface emitting laser array). Patent Document 1 discloses a multi-spot image forming apparatus having a multi-spot light source. In general, higher-speed optical writing can be achieved by using a vertical cavity surface emitting laser device capable of performing high-power operations in a single fundamental transverse mode.

Such a vertical cavity surface emitting laser device includes a current confinement structure in order to increase the efficiency of current influx. A commonly used current confinement structure is formed through selective oxidation of an AlAs (aluminum arsenide) layer (the current confinement structure is also referred to as "oxide current confinement structure" below) (see Patent Document 2, for example). An oxide current confinement structure is obtained by forming, in a precursor structure, a mesa of a predetermined size, in which a p-AlAs layer to be selectively oxidized is exposed along the lateral sides and placing the precursor structure in a high-temperature water vapor atmosphere so that Al is selectively oxidized from the lateral sides in such a manner that a central portion of the mesa remains unoxidized. The unoxidized portion functions as a passage region (current injection region) of the current for driving the vertical cavity surface emitting laser. In this way, current confinement is readily obtained.

Regarding a vertical cavity surface emitting laser, if heat generated in the active layer is rapidly released, a rise in the junction temperature (temperature of the active layer) can be suppressed and a decrease in gain can be prevented. This leads not only to a high output but also to favorable temperature characteristics, and hence longer operating life.

Semiconductor multilayer reflectors are in general made of AlGaAs materials. The thermal conductivity of an AlGaAs material largely varies depending on the Al component, and AlAs has the highest thermal conductivity (see FIG. 65).

Given this factor, it has been proposed that each AlAs low refractive index layer, which is included in a semiconductor multilayer reflector disposed on the heat release path side and is adjacent to the resonator structure, is designed to have an optical thickness larger than usual (see Patent Documents 3 to 5, for example).

[Patent Document 1] Japanese Laid-open Patent Application Publication No. H11-48520
[Patent Document 2] U.S. Pat. No. 5,493,577
[Patent Document 3] Japanese Laid-open Patent Application Publication No. 2005-354061
[Patent Document 4] Japanese Laid-open Patent Application Publication No. 2007-299897
[Patent Document 5] U.S. Pat. No. 6,720,585
[Non-patent Document 1] K. D. Choquette, R. P. Schneider, Jr., K. L. Lear & K. M. Geib, "Low threshold voltage vertical-cavity lasers fabricated by selective oxidation", Electronics Letters, No. 24, Vol. 30, 1994, pp. 2043-2044
[Non-patent Document 2] H. Nakayama, T. Nakamura, M. Funada, Y. Ohashi & M. Kato, "780 nm VCSELs for Home Networks and Printers", Electronic Components and Technology Conference Proceedings, 54th, Vol. 2, June, 2004, pp. 1371-1375

In electrophotography or the like, a significant influence is exerted on image quality by the rising behavior of the optical output response waveform of the light source, obtained when a drive current is applied to the light source. The optical output response waveform represents the time change in the optical output, and is hereinafter also referred to as "optical waveform". For example, image quality may be degraded by a fractional change in light intensity not only during the rise time of the optical waveform but also after the optical output has reached constant light intensity at the beginning of the rise.

This is because parts of an image formed during the rise and fall times of the optical waveform are the contour of the image. If the light intensity changes especially during the rise time of the optical waveform and during a certain time period after the optical waveform can be regarded to have substantially risen, the contour of the image becomes blurred, resulting in poor image quality with lack of visual sharpness.

For example, in the case where 300 μs is required to scan one line on an A4 sheet having a width (lengthwise direction) of about 300 mm, the scan distance in 1 μs is about 1 mm. It is said that the human eye has the highest visual sensitivity for change in image density when the width is 1 to 2 mm. Therefore, if the image density changes over about 1 mm in width, the density change is sufficient to be detected by the human eye, giving an impression of a blurred contour.

Another problem that the present invention addresses relates to the optical thickness of the low refractive index layers in the semiconductor multilayer reflector. If the optical thickness of each low refractive index layer is changed from $\lambda/4$ ($\lambda$ is the oscillation wavelength) to $3\lambda/4$, the absorption of light (hereinafter, also referred to simply as "absorption" for convenience) is increased by three-fold). Within the semiconductor multilayer reflector, the closer to the resonator structure, the stronger the electric field intensity, and therefore, a significant influence of the absorption is exerted. As a result, the methods disclosed in Patent Documents 3 to 5 leave the problem of causing a decrease in the slope efficiency and an increase in the threshold current.

DISCLOSURE OF INVENTION

In view of a new finding of the inventors described below, the present invention includes the following aspects.

The first aspect of the present invention is a vertical cavity surface emitting laser device which emits light orthogonally in relation to a substrate and includes a resonator structure including an active layer; and semiconductor multilayer reflectors disposed in such a manner as to sandwich the resonator structure between them and including a confinement structure which confines an injected current and transverse modes of oscillation light at the same time. The confinement structure has an oxidized region which surrounds a current passage region. The oxidized region is formed by oxidizing a part of a selective oxidation layer which includes aluminum and includes at least an oxide. The selective oxidation layer is at least 25 nm in thickness. The semiconductor multilayer reflectors include an optical confinement reducing section which reduces optical confinement in a transverse direction. The optical confinement reducing section is disposed on the substrate side in relation to the resonator structure.

The second aspect of the present invention is a vertical cavity surface emitting laser device that emits light orthogonally in relation to a substrate and includes a resonator structure including an active layer and semiconductor multilayer reflectors disposed in such a manner as to sandwich the resonator structure between them and including multiple pairs of a first layer and a second layer. The first layer and the second layer have different refractive indexes. The second layer has higher thermal conductivity than the first layer. The semiconductor multilayer reflectors include a first partial reflector and a second partial reflector. The first partial reflector includes at least one of the pairs, in which the second layer is greater in optical thickness than the first layer. The second partial reflector is disposed between the first partial reflector and the resonator structure, and includes at least one of the pairs, in which each of the first layer and the second layer is less in the optical thickness than the second layer of the first partial reflector.

The third aspect of the present invention is a vertical cavity surface emitting laser array on which multiple vertical cavity surface emitting laser devices of the present invention are integrated.

The fourth aspect of the present invention is an optical scanning apparatus for scanning a scanning surface with light. The optical scanning apparatus includes a light source including the vertical cavity surface emitting laser device of the present invention; a deflector configured to deflect light emitted from the light source; and a scanning optical system configured to focus the deflected light on the scanning surface.

The fifth aspect of the present invention is an optical scanning apparatus for scanning a scanning surface with light. The optical scanning apparatus includes a light source including the vertical cavity surface emitting laser array of the present invention; a deflector configured to deflect light emitted from the light source; and a scanning optical system configured to focus the deflected light on the scanning surface.

The sixth aspect of the present invention is an image forming apparatus including at least one image carrier; and one or more of the optical scanning apparatuses of the present invention configured to irradiate, on the at least one image carrier, light which includes image information.

The seventh aspect of the present invention is an optical transmission module for generating an optical signal according to an input electrical signal. The optical transmission module includes the vertical cavity surface emitting laser array; and a drive device configured to drive the vertical cavity surface emitting laser array according to the input electrical signal.

The eighth aspect of the present invention is an optical transmission system including the optical transmission module; an optical transmission medium configured to transmit the optical signal generated by the optical transmission module; and a converter configured to convert the transmitted optical signal into an electrical signal.

BRIEF DESCRIPTION OF DRAWINGS

These and other objects, features and advantages of the invention will be apparent to those skilled in the art from the following detailed description of the invention, when read in conjunction with the accompanying drawings in which:

FIG. 5 is an enlarged view showing a part of a lower semiconductor DBR of FIG. 3;

FIG. 9 is an illustrative diagram of a built-in effective refractive index difference Δneff (Part 1);

FIGS. 10A and 10B are illustrative diagrams of the built-in effective refractive index difference Δneff (Part 2);

FIGS. 11A and 11B are illustrative diagrams of the built-in effective refractive index difference Δneff obtained when an internal temperature increases;

FIG. 14 shows refractive indexes used for calculation;

FIG. 15 shows the relationship among an optical confinement coefficient, thickness of a selective oxidation layer and an oxide confinement diameter (Part 1);

FIG. 27 shows the relationship between the number of pairs in an optical confinement reducing region A and the fundamental transverse-mode optical confinement coefficient;

FIG. 33 shows the relationship between the number of pairs in the optical confinement reducing region B and the fundamental transverse-mode optical confinement coefficient;

FIG. 39 is a diagram illustrating an influence of the absorption loss reducing layer on the optical confinement coefficient;

FIG. 51 is an enlarged view showing a part of the lower semiconductor DBR;

BEST MODE OF CARRYING OUT THE INVENTION a. First Embodiment

Figure 49:
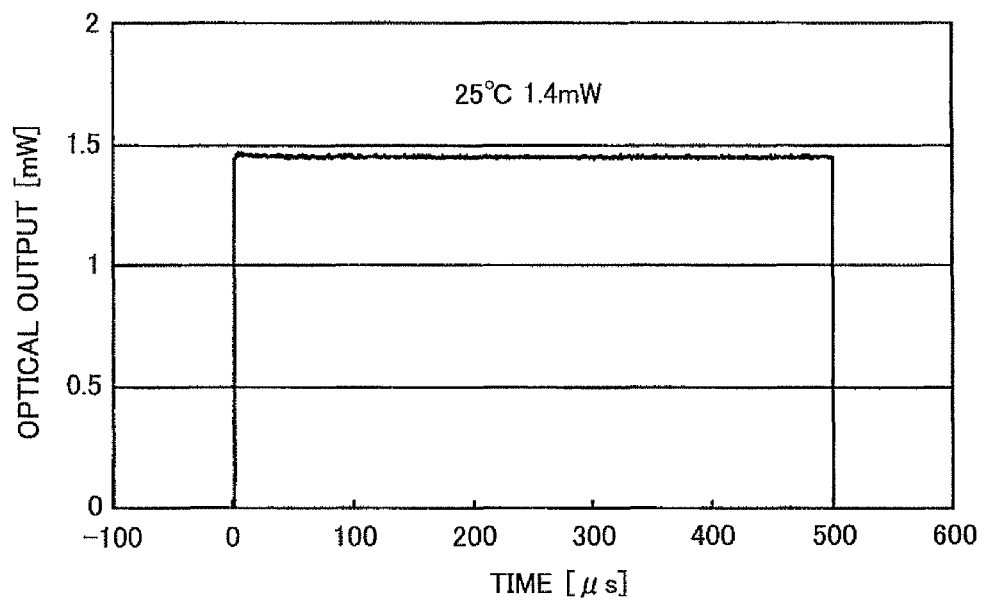
FIG. 49 illustrates an optical waveform of the conventional vertical cavity surface emitting laser device.

FIG. 49 shows an optical waveform obtained when a vertical cavity surface emitting laser device is driven under pulse conditions of a pulse width of 500 μs and a duty of 50% (pulse period: 1 ms). As shown in FIG. 49, after reaching a peak immediately after the rise time, the optical output falls off and becomes steady when seen over a relatively long period of time. The change in the optical output is due to self-heating of the vertical cavity surface emitting laser device, and is in general referred to as "droop characteristic".

Figure 50:
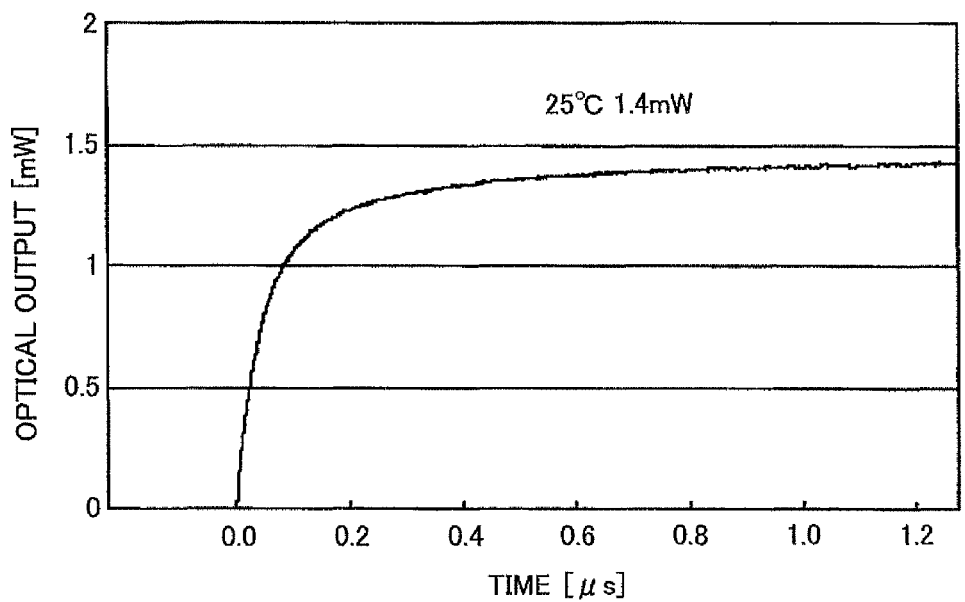
FIG. 50 shows an enlarged view of a rise and its vicinity in the optical waveform of FIG. 49.

In an in-depth examination conducted by the inventors of the present invention, a new finding has been made that changes in the optical output different from the "droop characteristic" occur over a short period of time, as shown in FIG. 50 which provides an enlarged view of the rise and its vicinity in the optical waveform of FIG. 49.

According to FIG. 50, the optical output has yet to fully rise after 10 ns. The optical output substantially fully rises after about 200 ns, and subsequently increases gradually until about 1 μs. This phenomenon (characteristic) is a new finding made by the inventors of the present invention. In this specification, such a characteristic is referred to as "negative droop characteristic". Note that the negative droop characteristic is not found in conventional edge emitting semiconductor laser devices.

In order to obtain high image quality with a vertical cavity surface emitting laser device, the optical response waveform during the rise time needs to be appropriately controlled, and it has been made clear that it is difficult to obtain high-quality images using vertical cavity surface emitting laser devices having the negative droop characteristic.

Figure 1:
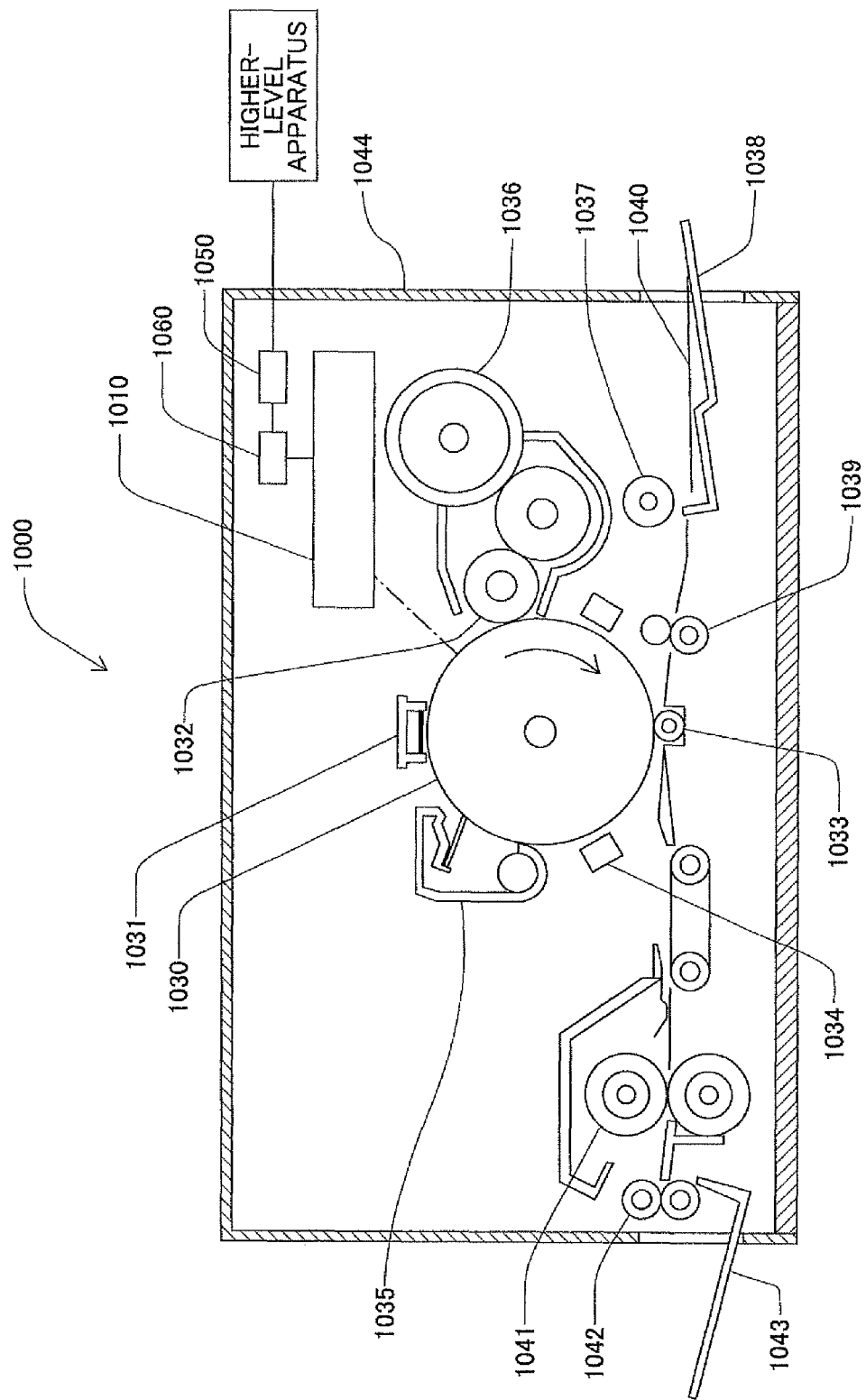
FIG. 1 shows a schematic structure of a laser printer according to one embodiment of the present invention.

Next is described one embodiment of the present invention with reference to FIGS. 1 through 41. FIG. 1 shows a general structure of a laser printer 1000 according to one embodiment of the present invention.

The laser printer 1000 includes, for example, an optical scanning apparatus 1010, a photoreceptor drum 1030, a charger 1031, a developing roller 1032, a transfer charger 1033, a neutralizing unit 1034, a cleaning unit 1035, a toner cartridge 1036, a sheet feeding roller 1037, a sheet feed tray 1038, paired resist rollers 1039, fixing rollers 1041, sheet discharge rollers 1042, a catch tray 1043, a communication control unit 1050, and a printer control unit 1060 for exercising overall control over the aforementioned components. All of these components are disposed at predetermined positions in a printer chassis 1044.

The communication control unit 1050 controls bidirectional communications with a higher-level apparatus (e.g. a personal computer), which is connected to the laser printer 1000 via a network.

The photoreceptor drum 1030 has a cylindrical body, on the surface of which a photosensitive layer is formed. That is, the surface of the photoreceptor drum 1030 is a surface on which scanning is performed. The photoreceptor drum 1030 is designed to rotate in a direction indicated by the arrow in FIG. 1.

The charger 1031, the developing roller 1032, the transfer charger 1033, the neutralizing unit 1034 and the cleaning unit 1035 are disposed adjacent to the surface of the photoreceptor drum 1030. Specifically, these components are disposed along the rotational direction of the photoreceptor drum 1030 in the stated order.

The charger 1031 uniformly charges the surface of the photoreceptor drum 1030.

The optical scanning apparatus 1010 emits, onto the surface of the photoreceptor drum 1030 which is charged by the charger 1031, a beam of light modulated based on image information sent from a higher-level apparatus. Accordingly, a latent image corresponding to the image information is formed on the surface of the photoreceptor drum 1030. The latent image is then moved toward the developing roller 1032 as the photoreceptor drum 1030 rotates. Note that the structure of the optical scanning apparatus 1010 is described later.

The toner cartridge 1036 houses toner, which is to be supplied to the developing roller 1032.

The developing roller 1032 applies toner supplied from the toner cartridge 1036 to the latent image formed on the surface of the photoreceptor drum 1030 so as to develop the latent image into a visible image. Then, the visible image with toner (hereinafter, also referred to as "toner image" for convenience) is moved toward the transfer charger 1033 as the photoreceptor drum 1030 rotates.

The sheet feed tray 1038 houses recording sheets 1040. The sheet feeding roller 1037 is provided near the sheet feed tray 1038. The sheet feeding roller 1037 takes out one recording sheet 1040 at a time from the sheet feed tray 1038 and conveys it to the paired resist rollers 1039. The resist rollers 1039 first hold the recording sheet 1040 taken out by the sheet feeding roller 1037, and then send the recording sheet 1040 out to the gap between the photoreceptor drum 1030 and the transfer charger 1033 in accordance with the rotation of the photoreceptor drum 1030.

A voltage having a polarity opposite to that of the toner on the surface of the photoreceptor drum 1030 is applied to the transfer charger 1033 in order to electrically attract the toner. By the voltage, the toner image on the photoreceptor drum 1030 is transferred to the recording sheet 1040. The recording sheet 1040 onto which the toner image has been transferred is sent to the fixing rollers 1041.

The fixing rollers 1041 apply heat and pressure to the recording sheet 1040, whereby the toner is fixed onto the recording sheet 1040. Then, the recording sheet 1040 on which the toner has been fixed is sent to the catch tray 1043 via the sheet discharge rollers 1042. Multiple recording sheets 1040 subjected to such processing procedures are sequentially stacked on the catch tray 1043.

The neutralizing unit 1034 renders the surface of the photoreceptor drum 1030 electrically neutral.

The cleaning unit 1035 removes toner remaining (residual toner) on the surface of the photoreceptor drum 1030. The surface of the photoreceptor drum 1030 from which the residual toner has been removed returns to a position opposing the charger 1031.

Next is described the structure of the optical scanning apparatus 1010.

Figure 2:
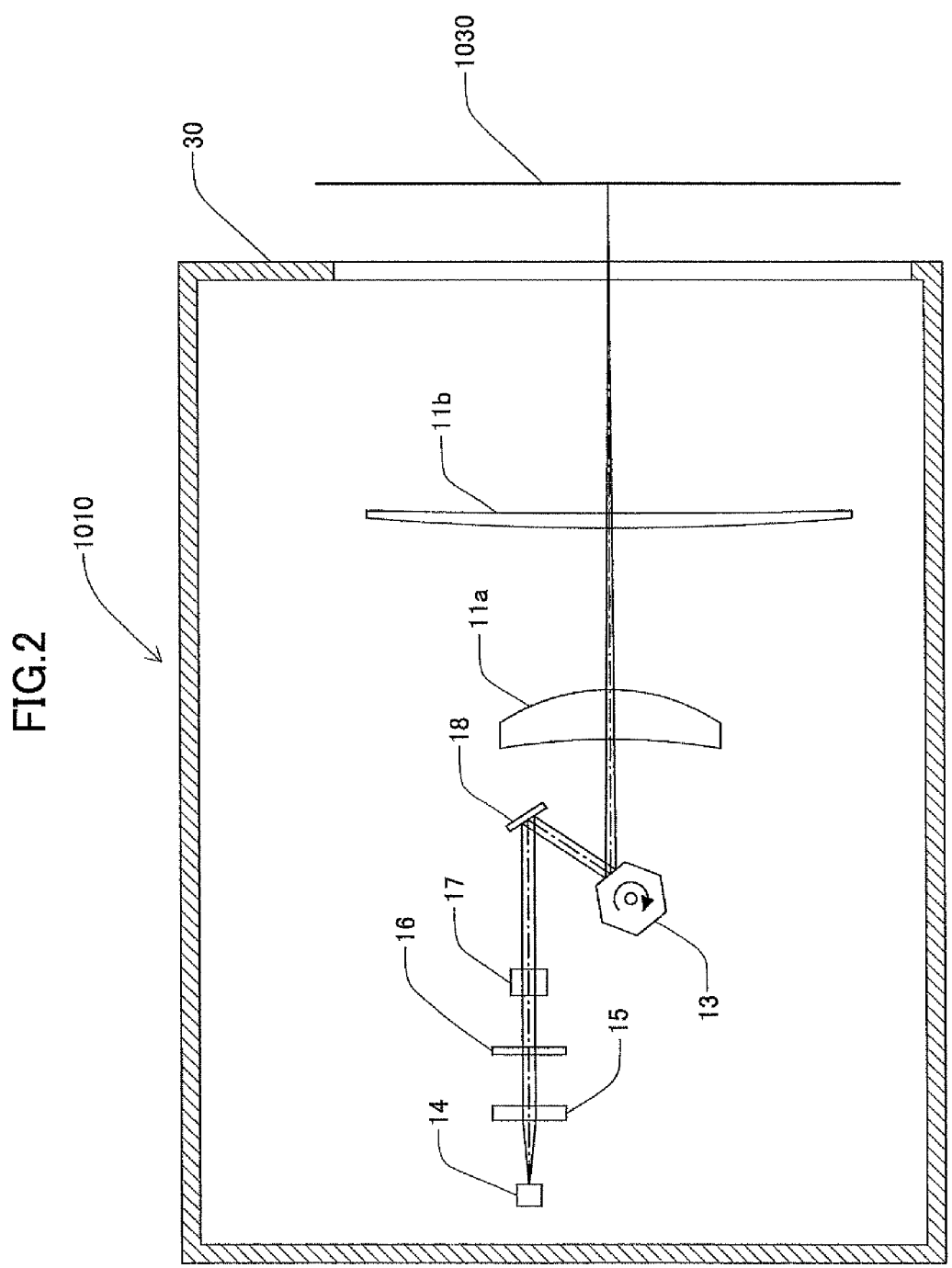
FIG. 2 is a schematic diagram showing an optical scanning apparatus of FIG. 1.

As an example as shown in FIG. 2, the optical scanning apparatus 1010 includes a deflector-side scanning lens 11a, an image plane-side scanning lens 11b, a polygon mirror 13, a light source 14, a coupling lens 15, an aperture plate 16, an anamorphic lens 17, a reflector mirror 18, a scan controller (not shown) and the like. These components are disposed and fixed at predetermined positions in a housing 30.

Note that a direction corresponding to the main scanning direction and a direction corresponding to the sub-scanning direction are hereinafter simply referred to as "main scanning corresponding direction" and "sub-scanning corresponding direction", respectively.

The coupling lens 15 converts a light beam emitted from the light source 14 into substantially parallel light.

The aperture plate 16 has an aperture and defines the beam diameter of the light passing through the coupling lens 15.

The anamorphic lens 17 converts the beam of light having passed through the aperture of the aperture plate 16 so that the beam of light forms, via the reflector mirror 18, an image in the sub-scanning corresponding direction near the deflecting reflection surfaces of the polygon mirror 13.

An optical system disposed in the light path between the light source 14 and the polygon mirror 13 may be referred to as a pre-deflector optical system. In the present embodiment, the pre-deflector optical system includes the coupling lens 15, the aperture plate 16, the anamorphic lens 17 and the reflector mirror 18.

The polygon mirror 13 includes, for example, a six-faceted mirror whose diameter of an inscribed circle is 18 mm. Each facet of the polygon mirror 13 is a deflecting reflection surface. The polygon mirror 13 deflects the beam of light reflected by the reflector mirror 18 as it rotates around an axis parallel to the sub-scanning corresponding direction at a uniform velocity.

The deflector-side scanning lens 11a is disposed in the light path of the beam of light deflected by the polygon mirror 13.

The image plane-side scanning lens 11b is disposed in the light path of the beam of light having passed through the deflector-side scanning lens 11a. The beam of light having passed through the image plane-side scanning lens 11b is projected on the surface of the photoreceptor drum 1030, whereby an optical spot is formed. The optical spot shifts in the longitudinal direction of the photoreceptor drum 1030 as the polygon mirror 13 rotates. That is, the optical spot scans across the photoreceptor drum 1030. The direction in which the optical spot moves is the "main scanning direction". On the other hand, the rotational direction of the photoreceptor drum 1030 is the "sub-scanning direction".

An optical system disposed in the light path between the polygon mirror 13 and the photoreceptor drum 1030 may be referred to as a scanning optical system. In the present embodiment, the scanning optical system includes the deflector-side scanning lens 11a and the image plane-side scanning lens 11b. Note that at least one light-path bending mirror may be disposed in at least one of the light path between the deflector-side scanning lens 11a and the image plane-side scanning lens 11b and the light path between the image plane-side scanning lens 11b and the photoreceptor drum 1030.

Figure 3:
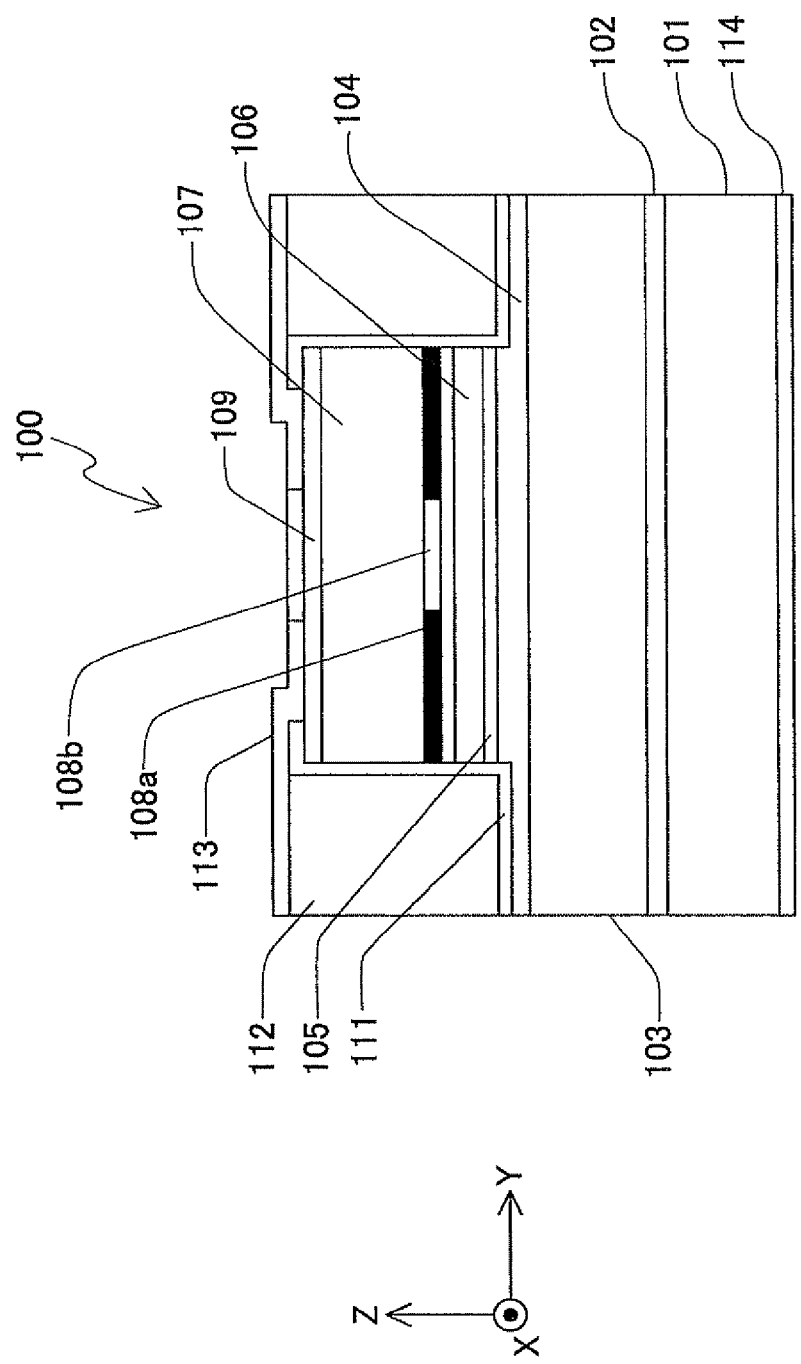
FIG. 3 shows a vertical cavity surface emitting laser device included in a light source of FIG. 2.

The light source 14 includes a vertical cavity surface emitting laser device 100, an example of which is shown in FIG. 3. In this specification, the laser oscillation direction is referred to as the Z direction, and two directions mutually orthogonal to each other in a plane perpendicular to the Z direction are referred to as the X and Y directions.

The vertical cavity surface emitting laser device 100 is designed to have an oscillation wavelength of 780 nm band, and includes a substrate 101, a buffer layer 102, a lower semiconductor DBR (distribution Bragg reflector) 103, a lower spacer layer 104, an active layer 105, an upper spacer layer 106, an upper semiconductor DBR 107 and a contact layer 109.

Figure 4A:
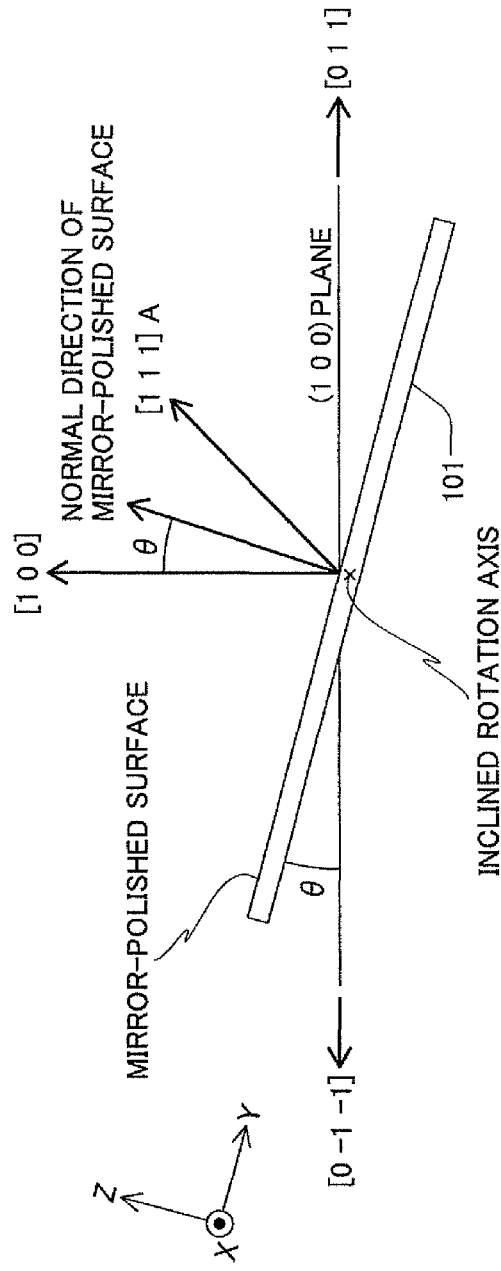
FIGS. 4A and 4B are illustrative diagrams of a substrate of FIG. 3.
Figure 4B:
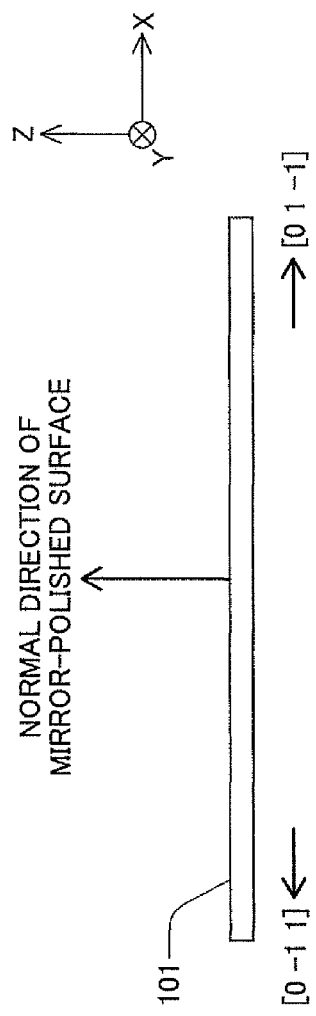

The substrate 101 included in the vertical cavity surface emitting laser device 100 has a mirror-polished surface. The substrate 101 is an n-GaAs monocrystalline substrate in which the normal direction of the mirror-polished surface is inclined by 15 degrees ($\theta$=15 degrees) from a crystal orientation [1 0 0] toward a crystal orientation [1 1 1]A, as shown in FIG. 4A. That is to say, the substrate 101 is an inclined substrate. In this embodiment, the substrate 101 is disposed in such a manner that a crystal orientation [0 1 -1] is aligned in the +X direction and a crystal orientation [0 -1 1] is aligned in the -X direction, as shown in FIG. 4B.

The buffer layer 102 is an n-GaAs layer laid on a +Z-direction surface of the substrate 101.

The lower semiconductor DBR 103 includes a first lower semiconductor DBR 103$_1$, a second lower semiconductor DBR 103$_2$ and a third lower semiconductor DBR 103$_3$, of which an example is shown in FIG. 5.

The first lower semiconductor DBR 103$_1$ is laid over a +Z-direction surface of the buffer layer 102. The first lower semiconductor DBR 103$_1$ includes 36.5 pairs of an n-AlAs low refractive index layer 103a and an n-Al$_{0.3}$Ga$_{0.7}$As high refractive index layer 103b. In order to reduce electrical resistance, a compositionally graded layer (not shown) is provided between each two neighboring refractive index layers. In the compositionally graded layer, the composition is gradually changed from one to another. It is designed that each refractive index layer has an optical thickness of $\lambda$/4 (where $\lambda$ is an oscillation wavelength) by including ½ the thickness of its neighboring compositionally graded layer. When the optical thickness is $\lambda$/4, the actual thickness d of the layer is $\lambda$/4N (where N is a refractive index of the material of the layer).

The second lower semiconductor DBR 103$_2$ is laid on a +Z-direction surface of the first lower semiconductor DBR 103$_1$, and includes three pairs of the low refractive index layer 103a and the high refractive index layer 103b. In order to reduce electrical resistance, a compositionally graded layer (not shown) is provided between each two neighboring refractive index layers. It is designed that each low refractive index layer 103a has an optical thickness of 3$\lambda$/4 by including ½ the thickness of its neighboring compositionally graded layer, and each high refractive index layer 103b has an optical thickness of $\lambda$/4 by including ½ the thickness of its neighboring compositionally graded layer. The second lower semiconductor DBR 103$_2$ is an "optical confinement reducing region".

The third lower semiconductor DBR 103$_3$ is laid on a +Z-direction surface of the second lower semiconductor DBR 103$_2$, and includes a pair of the low refractive index layer 103a and the high refractive index layer 103b. In order to reduce electrical resistance, a compositionally graded layer (not shown) is provided between each two neighboring refractive index layers. It is designed that each refractive index layer has an optical thickness of $\lambda$/4 by including ½ the thickness of its neighboring compositionally graded layer.

Thus, in the present embodiment, the lower semiconductor DBR 103 includes 40.5 pairs of the low and high refractive index layers 103a and 103b.

The lower spacer layer 104, which is a non-doped (Al$_{0.1}$Ga$_{0.9}$)$_{0.5}$In$_{0.5}$P layer, is laid on a +Z-direction surface of the third lower semiconductor DBR 103$_3$.

Figure 6:
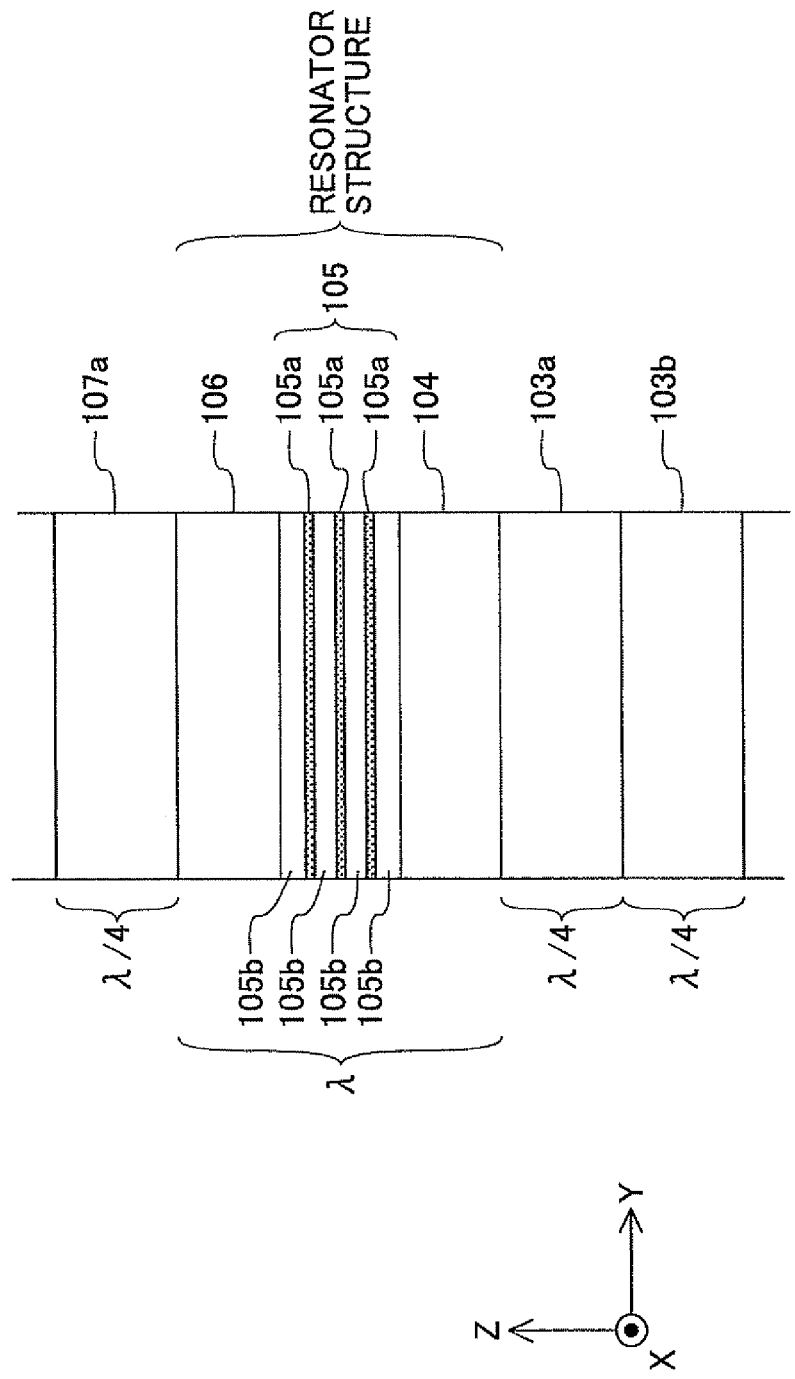
FIG. 6 is an enlarged view showing the vicinity of an active layer of FIG. 3.

The active layer 105 is laid on a +Z-direction surface of the lower spacer layer 104. The active layer 105 is a threefold quantum well active layer including GaInAsP quantum well layers 105a and GaInP barrier layers 105b, as an example as shown in FIG. 6. Each quantum well layer 105a is created by introducing As into a GaInP mixed crystal in order to obtain a 780 nm-band oscillation wavelength, and has a compression strain. The barrier layers 105b have large band gaps with the introduction of tensile strain, thereby providing high carrier confinement, and also function as a strain-compensation structure for the quantum well layers 105a.

In this embodiment, since an inclined substrate is used as the substrate 101, anisotropy is introduced into the gain of the active layer, thereby making possible to align the direction of polarization in a predetermined direction (polarization control).

The upper spacer layer 106, which is a non-doped $(Al_{0.1}Ga_{0.9})_{0.5}In_{0.5}P$ layer, is laid on a +Z-direction surface of the active layer 105.

A section including the lower spacer layer 104, the active layer 105 and the upper spacer layer 106 is referred to as a resonator structure, which is designed to have an optical thickness of $\lambda$. The PL wavelength of the active layer 105 is designed to be 772 nm, which is 8 nm shorter than the resonance wavelength, 780 nm, of the resonator structure, and the lowest threshold current is obtained at 17° C. The active layer 105 is provided in the center of the resonator structure, which corresponds to an antinode of the standing wave of the electric field, in order to achieve a high stimulated emission rate. The resonator structure is sandwiched between the lower semiconductor DBR 103 and the upper semiconductor DBR 107.

The upper semiconductor DBR 107 includes a first upper semiconductor DBR $107_1$ and a second upper semiconductor DBR $107_2$.

The first upper semiconductor DBR $107_1$ is laid on a +Z-direction surface of the upper spacer layer 106, and includes one pair of a p-$(Al_{0.7}Ga_{0.3})_{0.5}In_{0.5}P$ low refractive index layer and a p-$(Al_{0.1}Ga_{0.9})_{0.5}In_{0.5}P$ high refractive index layer. In order to reduce electrical resistance, a compositionally graded layer is provided between each two neighboring refractive index layers. It is designed that each refractive index layer has an optical thickness of $\lambda/4$ by including ½ the thickness of its neighboring compositionally graded layer.

The first upper semiconductor DBR $107_1$ has higher band gap energy compared to an AlGaAs layer, and functions as a blocking layer for blocking electrons injected into an active region.

Since an inclined substrate is used as the substrate 101, it is possible not only to reduce the occurrence of the hillock defect formation of the AlGaInP material and improve the crystallinity, but also to reduce the occurrence of natural superlattice and prevent a decrease in band gap energy. Accordingly, the first upper semiconductor DBR $107_1$ is able to maintain high band gap energy, and favorably functions as an electron blocking layer.

The second upper semiconductor DBR $107_2$ is laid on a +Z-direction surface of the first upper semiconductor DBR $107_1$, and includes 23 pairs of a p-$Al_{0.9}Ga_{0.1}As$ low refractive index layer and a p-$Al_{0.3}Ga_{0.7}As$ high refractive index layer. In order to reduce electrical resistance, a compositionally graded layer is provided between each two neighboring refractive index layers. It is designed that each refractive index layer has an optical thickness of $\lambda/4$ by including ½ the thickness of its neighboring compositionally graded layer.

In one low refractive index layer of the second upper semiconductor DBR $107_2$, a p-AlAs selective oxidation layer having a thickness of 30 nm is inserted. The selective oxidation layer is provided, within the low refractive index layer of the third pair from the upper spacer layer 106, at a position corresponding to nodes of the standing wave of the electric field.

The contact layer 109 is a p-GaAs layer laid on a +Z-direction surface of the second upper semiconductor DBR $107_2$.

A resultant structure in which multiple semiconductor layers are laid over the substrate 101 is hereinafter also referred to as "laminated body".

In addition, the optical thickness of each refractive index layer described below includes ½ the thickness of its neighboring compositionally graded layer.

Next is a brief description of a method for manufacturing the vertical cavity surface emitting laser device 100.

(1) The above-described laminated body is created by a crystal growth method, such as metal-organic chemical vapor deposition (MOCVD method) or molecular beam epitaxy (MBE method).

In this step, trimethylaluminium (TMA), trimethyl gallium (TMG) and trimethyl indium (TMI) ($AsH_3$) are used as the group-III materials, and arsine addition, carbon tetrabromide ($CBr_4$) is used as a p-type dopant, and hydrogen selenide ($H_2Se$) is used as an n-type dopant. Phosphine ($PH_3$) gas is used as the group-V P material of the AlGaInAsP material, and dimethylzinc (DMZn) is used as a p-type dopant of AlGaInP.

(2) A square resist pattern, each side of which is 25 μm, is formed on the surface of the laminated body.

(3) Using the square resist pattern as a photomask, a square columnar mesa is formed by ECR etching using $Cl_2$ gas. The etching bottom is positioned in the lower semiconductor DBR 103.

(4) The photomask is removed.

(5) The laminated body is heat-treated in water vapor. In this step, Al in the selective oxidation layer is selectively oxidized from the periphery of the mesa. Accordingly, an unoxidized region 108a which is surrounded by an AL oxidized layer 108b is left in the center of the mesa (see FIG. 3). In this manner, an oxidized current confinement structure is formed, in which a pathway of the current for driving a light-emitting part is limited to the center of the mesa. The unoxidized region 108a functions as a current passage region (current injection region). Appropriate conditions of the heat treatment (holding temperature, holding time and the like) are selected based on results of various preliminary experiments so that each side of the current passage region is about 4 μm. Specifically, the holding temperature is 360° C. and the holding time is 30 minutes.

(6) A protective layer 111 made of SiN or $SiO_2$ is formed by chemical vapor deposition (CVD method).

(7) Polyimide 112 is used to planarize the laminated body.

(8) Apertures for p-electrode contact are provided on the top of the mesa. In this step, a photoresist mask is provided on the top of the mesa, and then, locations on the mesa, at which the apertures are to be formed, are exposed to light to remove the photoresist mask from the locations. Subsequently, the apertures are formed by buffered HF etching (BHF etching) the polyimide 112 and the protective layer 111.

(9) A square resist pattern, each side of which is 10 μm, is formed on the top of the mesa at a region to be a light emitting part, and p-electrode materials are then deposited by vapor-deposition. As the p-electrode materials, a multilayer film made of Cr/AuZn/Au or Ti/Pt/Au is used.

(10) The p-electrode materials are lifted off from the region to be the light emitting part, whereby a p-electrode 113 is formed.

(11) The back side of the substrate 101 is polished so that the substrate 101 has a predetermined thickness (about 100 μm, for example), and then, an n-electrode 114 is formed. The n-electrode 114 is a multilayer film made of AuGe/Ni/Au.

(12) The p-electrode 113 and the n-electrode 114 are ohmically connected by annealing, whereby the mesa becomes a light-emitting part.

(13) The laminated body is cut into chips.

An examination was conducted by applying a square wave current pulse having a pulse period of 1 ms and a pulse width of 500 μs (a duty of 50%) to the vertical cavity surface emitting laser device 100 manufactured in the above-described manner, with a target of producing an optical output of 1.4 mW. The result was (P1−P2)/P2=−0.06, where P1 is the optical output obtained 10 ns after the application and P2 is the optical output obtained 1 μs after the application. Note that a value obtained from the formula (P1−P2)/P2×100 (unit: %) is also referred to as "droop rate" below. Thus, the droop rate of the vertical cavity surface emitting laser device 100 of the present embodiment is −6%. It should be noted that if a vertical cavity surface emitting laser device having a droop rate of less than −10% is used in a laser printer, an image output from the laser printer is highly likely to have a blurred contour, at least partially, when viewed by the naked eye.

In the above examination, the vertical cavity surface emitting laser device 100 produced a single fundamental transverse-mode output of more than 2 mW.

In addition, the vertical cavity surface emitting laser device 100 exhibited threshold current characteristics and an external differential quantum efficiency (slope efficiency) equivalent to those of conventional vertical cavity surface emitting laser devices.

Figure 7:
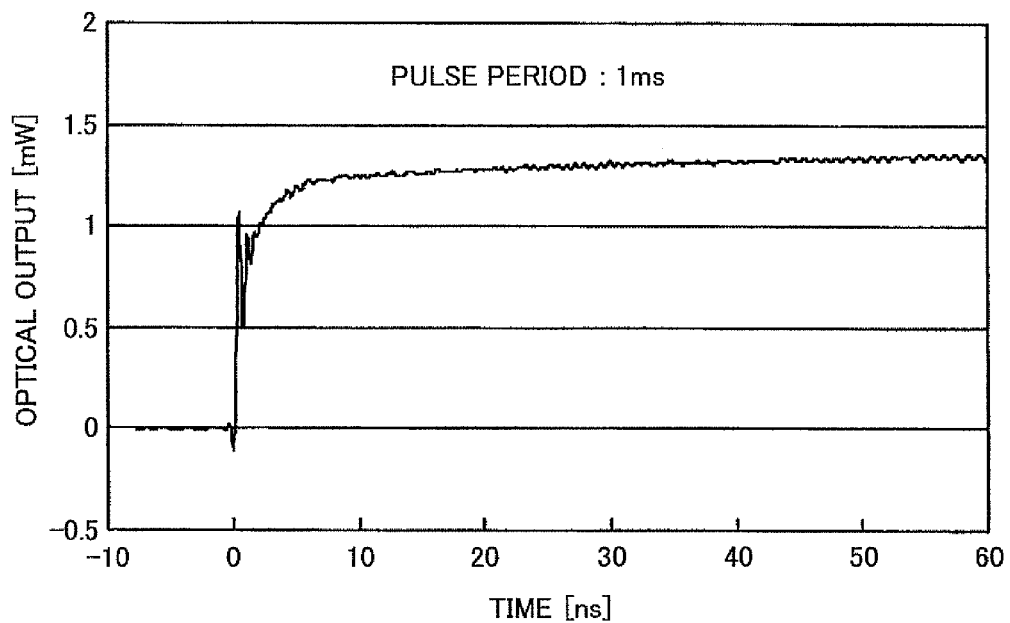
FIG. 7 shows an optical waveform obtained when a conventional vertical cavity surface emitting laser device is driven by a square wave current pulse having a pulse period of 1 ms and a duty of 50%.
Figure 8:
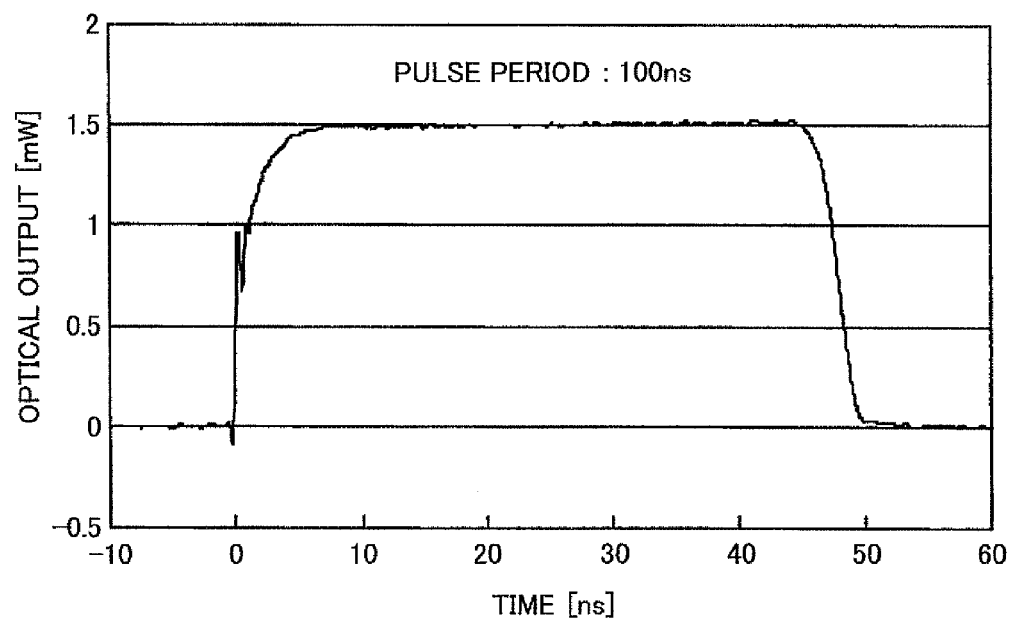
FIG. 8 shows an optical waveform obtained when the conventional vertical cavity surface emitting laser device is driven by a square wave current pulse having a pulse period of 100 ns and a duty of 50%.

The inventors of the present invention examined in detail optical waveforms obtained when a conventional vertical cavity surface emitting laser device having an oxidized current confinement structure was driven by various different square wave current pulses. FIG. 7 shows an optical waveform obtained with a pulse period of 1 ms and a duty of 50%, and FIG. 8 shows an optical waveform obtained with a pulse period of 100 ns and a duty of 50%.

According to the optical waveform of FIG. 7, the negative droop characteristic is shown in which the optical output gradually increases after the rise time. Even after 60 ns, the optical output does not reach the target value (1.5 mW). On the other hand, according to the optical waveform of FIG. 8, the optical output after the rise time is stable and the negative droop characteristic does not appear.

Accordingly, it is understood that, even if square wave current pulses applied to the conventional vertical cavity surface emitting laser device have the same duty, i.e. the same heating value, the negative droop characteristic appears if the applied square wave current pulse has a long pulse period and the negative droop characteristic does not appear if the applied square wave current pulse has a short pulse period.

It is contemplated that the difference in the pulse period leads to a difference in the internal temperature of the vertical cavity surface emitting laser device. That is, in the case of a long pulse period, the heating periods and the cooling-down periods are both long, the internal temperature of the vertical cavity surface emitting laser device largely changes. On the other hand, in the case of a short pulse period, cooling-down periods do not last long. Therefore, changes in the internal temperature of the vertical cavity surface emitting laser device are small, and the internal temperature remains relatively high on average. That is to say, with the driving conditions causing the negative droop characteristic, the internal temperature of the vertical cavity surface emitting laser device largely changes, and thus, it is deduced that the negative droop characteristic is a phenomenon attributable to the internal temperature of the vertical cavity surface emitting laser device.

If the internal temperature of the vertical cavity surface emitting laser device changes, an electric field intensity distribution of the oscillation modes in the transverse direction (hereinafter, referred to also as "transverse-mode distribution" below) also changes.

The oxidized layer in the oxidized current confinement structure has a refractive index of about 1.6, which is lower than that of the neighboring semiconductor layers (about 3). Accordingly, inside the vertical cavity surface emitting laser device, a so-called built-in effective refractive index difference $\Delta n_{eff}$ is present in the transverse direction (see FIG. 9).

By the effective refractive index difference $\Delta n_{eff}$, oscillation modes including the fundamental transverse mode are confined in the transverse direction. At this point, the spread of the oscillation modes in the transverse direction depends on the size of $\Delta n_{eff}$, and the larger $\Delta n_{eff}$, the smaller the spread in the transverse direction (see FIGS. 10A and 10B).

If a current (drive current) is injected into the vertical cavity surface emitting laser device, the current is concentrated in the central portion of the mesa (hereinafter, "mesa central portion"). Then, due to Joule heat, nonradiative recombination in the active layer region and the like, particularly a part of the mesa central portion close to the active layer has a higher local temperature compared to the surrounding region. If the temperature of a semiconductor material is increased, the semiconductor material has reduced band gap energy, which leads to a high refractive index. Therefore, if the local temperature of the mesa central portion is increased, the refractive index of the mesa central portion becomes higher compared to that of the surrounding region, and accordingly, the optical confinement in the transverse direction becomes significant.

As shown in FIG. 10A, in the case where the built-in effective refractive index difference $\Delta n_{eff}$ is small, if the local temperature of the mesa central portion is increased, a change in the effective refractive index difference $\Delta n_{eff}$ becomes large, as shown in FIG. 11A, which results in a large change in the transverse-mode distribution. In this case, the overlap between the gain region into which a current is being injected and the transverse mode increases, and the optical confinement in the transverse direction becomes significant. As a result, the light intensity in emission rate increases, and the threshold current is accordingly reduced.

Figure 12:
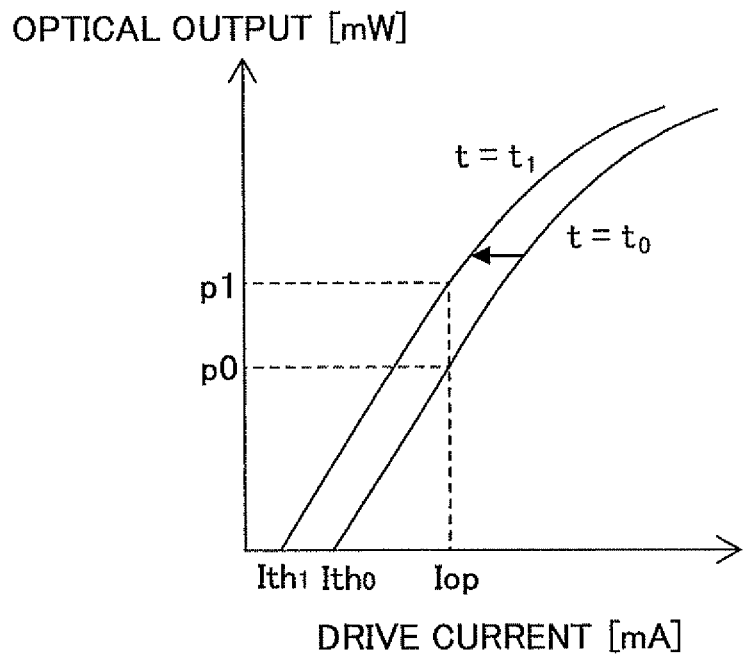
FIG. 12 is an illustrative diagram of a shift of an I-L curve due to an increase in the internal temperature of a vertical cavity surface emitting laser device having insufficient optical confinement in the transverse direction at room temperature.
Figure 13:
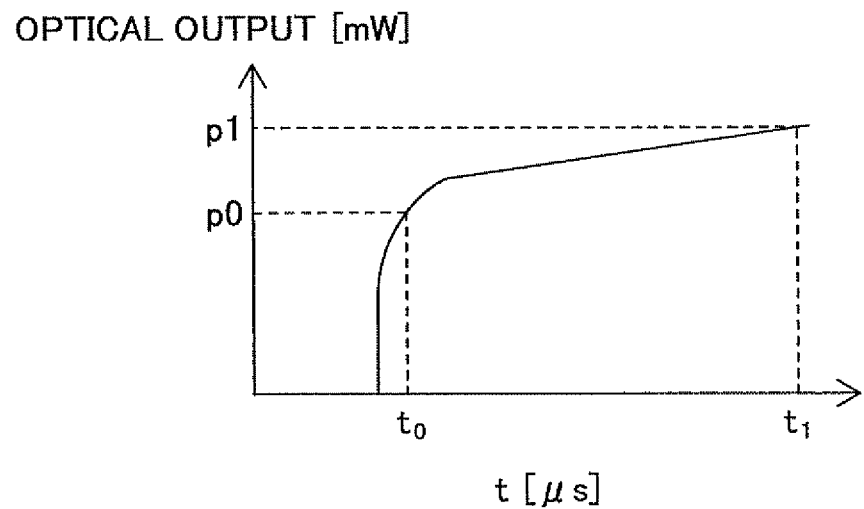
FIG. 13 shows an optical waveform obtained in the case of FIG. 12.

Thus, as to a vertical cavity surface emitting laser device having a small built-in effective refractive index difference $\Delta n_{eff}$ and having insufficient optical confinement in the transverse direction at room temperature, if the internal temperature increases, an I-L curve (injection current-optical output curves) is wholly shifted toward the lower current side, and the luminous efficiency is improved (see FIG. 12). In this case, the optical output obtained with the same drive current value increases over time, and thus, the negative droop characteristic is observed (see FIG. 13). FIG. 12 shows an estimated I-L characteristic for a time $t=t_0$ sec, which is prior to the increase of the internal temperature, and an estimated I-L characteristic for a time $t=t_1$ sec at which the internal temperature has sufficiently increased with the supply of a pulsed drive current. Along with the increase of the temperature, the luminous efficiency is improved and the threshold current is reduced, and therefore, the I-L characteristic of $t_1$ sec is shifted towards the Since the drive current is constant at $I_{op}$, the optical output is larger in the case of $t_1$ sec. The optical waveform of this case is shown in FIG. 13.

On the other hand, in the case where the built-in effective refractive index difference $\Delta n_{eff}$ is large, as shown in FIG. 10B, even if the local temperature of the mesa central portion is increased, a change in the effective refractive index difference $\Delta n_{eff}$ is small, as shown in FIG. 11B. Accordingly, little change is observed in the transverse-mode distribution.

Thus, as to a vertical cavity surface emitting laser device having a large built-in effective refractive index difference $\Delta n_{eff}$ and having sufficient optical confinement in the transverse direction at room temperature, even if the internal temperature increases, the transverse-mode distribution is stable and little change is seen in the luminous efficiency. In this case, the optical output obtained with the same drive current value remains substantially constant over time, and thus, the negative droop characteristic does not appear.

A transverse-direction optical confinement coefficient (hereinafter, referred to simply as "optical confinement coefficient") is used as an index indicating strength of the optical confinement in the transverse direction. Note that the optical confinement coefficient can be obtained from the ratio of "an integrated intensity of an electric field located within the radius range in which the current passage region is located" to "an integrated intensity of an electric field on the X-Y cross section passing through the center of the vertical cavity surface emitting laser device". The larger the optical confinement coefficient, the more the distribution of the electric field intensity acutely concentrates on the gain region. In other words, the larger the optical confinement coefficient obtained at room temperature, the more sufficiently the optical confinement is achieved by the oxidized current confinement structure, which indicates that the transverse mode distribution is stable even during a local temperature change of the gain region.

The transverse-mode distribution of the vertical cavity surface emitting laser device can be estimated by calculating the distribution of the electric field intensity using the following Helmholtz equations (Equations (1) and (2)).

[Equation 1]

$$\left(\frac{\partial^2}{\partial x^2} + \frac{\partial^2}{\partial y^2} + k_0^2(\varepsilon(x, y) - n_{eff,m}^2)\right)E_m(x, t, z) = 0 \quad (1)$$

[Equation 2]

$$E_m(x, y, z) = E_m(x, y)\exp(ik_0 n_{eff,m} z) \quad (2)$$

Note however that equations (1) and (2) are analytically difficult to calculate, and therefore, a numerical analysis using the finite element technique with a calculator is generally performed. Various tools can be used as a solver for the finite element technique, and a commercially-produced VCSEL simulator (e.g. LASER MOD) is an example of such.

A fundamental transverse-mode distribution of a 780 nm-band vertical cavity surface emitting laser device is calculated as an example.

In the vertical cavity surface emitting laser device used for the calculation, the active layer has a threefold quantum well structure including $Al_{0.12}Ga_{0.88}As$ layers (each having a thickness of 8 nm) and $Al_{0.3}Ga_{0.7}As$ layers (each having a thickness of 8 nm). Each spacer layer is made of $Al_{0.6}Ga_{0.4}As$. The lower semiconductor DBR includes 40.5 pairs of an $Al_{0.3}Ga_{0.7}As$ high refractive index layer and an AlAs low refractive index layer. The upper semiconductor DBR includes 24 pairs of an $Al_{0.3}Ga_{0.7}As$ high refractive index layer and an $Al_{0.9}Ga_{0.1}As$ low refractive index layer.

The vertical cavity surface emitting laser device has a cylindrical mesa having a diameter of 25 μm. The mesa etching has been carried out up to the boundary between the lower semiconductor DBR and the lower spacer layer, and the etched regions are filled with atmospheric air. That is, the vertical cavity surface emitting laser device has a simple etched mesa structure. The lower semiconductor DBR, which is not subjected to mesa etching, has a diameter of 35 μm, which is the maximum width concerned in the calculation.

The selective oxidation layer made of AlAs is disposed within the low refractive index layer having an optical thickness of 3λ/4 in the upper semiconductor DBR, and more specifically, disposed at a position corresponding to the third node of the standing wave counted from the active layer.

Note that the calculation does not take into account the gain of the active layer and the absorption by the semiconductor material, and obtains only an eigenmode distribution determined by the structure. The temperature of the vertical cavity surface emitting laser device is kept constant at 300 K. The refractive index of each material is as shown in FIG. 14. Note that the oxidized layer of the oxidized current confinement structure is also referred to simply as "oxidized layer", and the diameter of the current passage region is also referred to as "oxide confinement diameter".

Based on a fundamental transverse mode distribution calculated in the above-described manner, an optical confinement coefficient $\Gamma_1$ is calculated using the following equation (3). In the equation, a is the radius of the current passage region.

[Equation 3]

$$\Gamma_l = \frac{\int_0^a |E|^2 dr}{\int_0^\infty |E|^2 dr} \quad (3)$$

The fundamental transverse-mode optical confinement coefficient of the 780 nm-band vertical cavity surface emitting laser device at room temperature is calculated for various thicknesses of the selective oxidation layer and various oxide confinement diameters. The calculation results are shown in FIG. 15. According to the results, the optical confinement coefficient depends on the thickness of the selective oxidation layer and the oxide confinement diameter, and the greater the thickness of the selective oxidation layer and the larger the oxide confinement diameter, the higher the optical confinement coefficient.

Figures 16, 17:
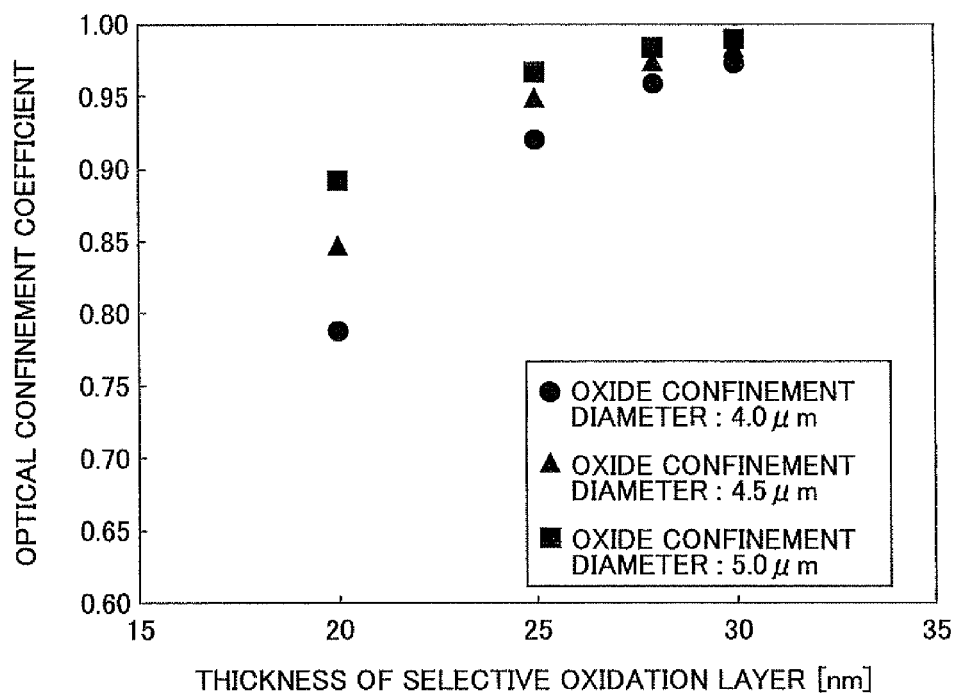
FIG. 16 shows the relationship among the optical confinement coefficient, the thickness of the selective oxidation layer and the oxide confinement diameter (Part 2)
FIG. 17 shows the relationship among the optical confinement coefficient, the thickness of the selective oxidation layer and the oxide confinement diameter (Part 3)

FIG. 16 is a graph illustrating the calculation results of FIG. 15 with the thickness of the selective oxidation layer on the horizontal axis and the optical confinement coefficient on the vertical axis. As for change in the optical confinement coefficient associated with an increase in the thickness of the selective oxidation layer, it can be seen for all the different oxide confinement diameters that the change is significant when the thickness of the selective oxidation layer is 25 nm or less and the change tends to be saturated when the thickness of the selective oxidation layer is 25 nm or more.

Multiple vertical cavity surface emitting laser devices having various thicknesses of the selective oxidation layer and various oxide confinement diameters were manufactured in order to evaluate the droop characteristic of them. FIG. 17 shows the evaluation results. In FIG. 17, "○" denotes a droop rate of −10% or more and "x" denotes a droop rate of less than −10%. According to FIGS. 15 and 17, it is understood that device structures having a fundamental transverse-mode optical confinement coefficient of 0.9 or more at room temperature exhibit a droop rate of −10% or more.

Figure 18:
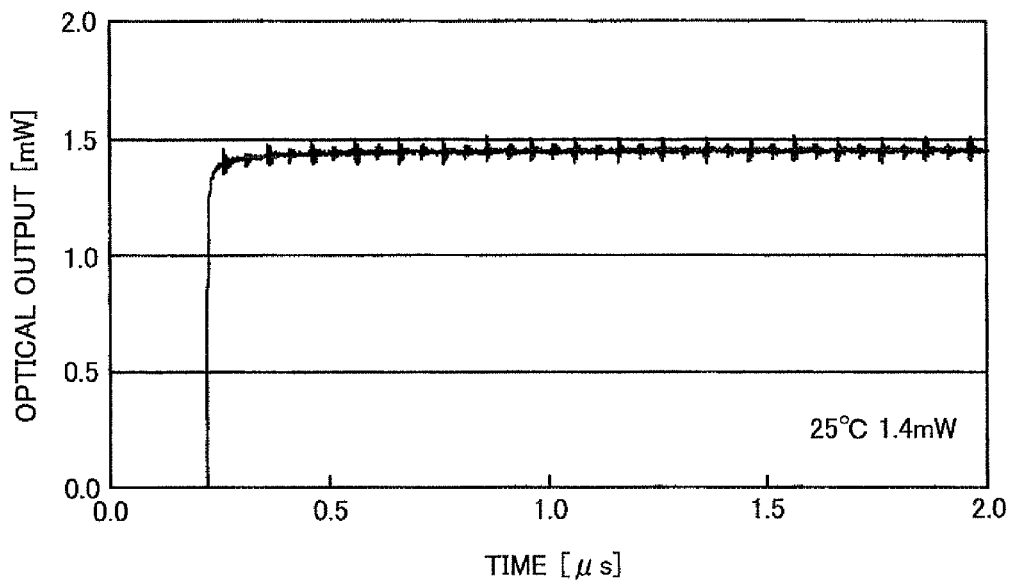
FIG. 18 shows an optical waveform of a vertical cavity surface emitting laser device having a fundamental transverse-mode optical confinement coefficient of about 0.983 at 25° C.

FIG. 18 shows an optical waveform of the vertical cavity surface emitting laser device having a fundamental transverse-mode optical confinement coefficient of about 0.983 at room temperature. The droop rate of this optical waveform is about −4.3%.

Figure 19:
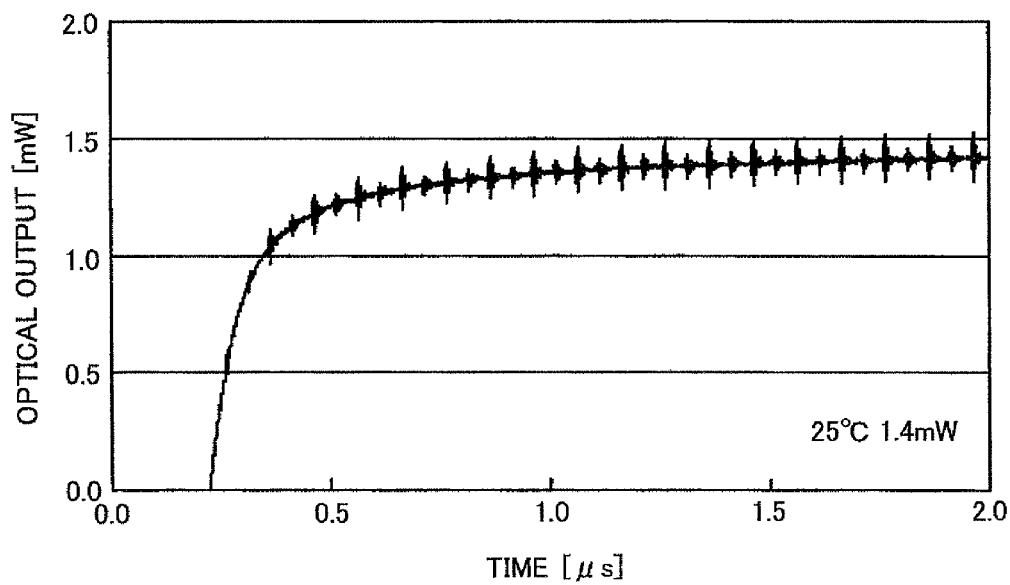
FIG. 19 shows an optical waveform of a vertical cavity surface emitting laser device having a fundamental transverse-mode optical confinement coefficient of about 0.846 at 25° C.

FIG. 19 shows an optical waveform of the vertical cavity surface emitting laser device having a fundamental transverse-mode optical confinement coefficient of about 0.846 at room temperature. The droop rate of this optical waveform is about −62.8%.

Various vertical cavity surface emitting laser devices having different optical confinement coefficients were manufactured, and an in-dept examination was performed. According to the examination, the droop rate is about −5% if the optical confinement coefficient is about 0.9, and if the optical confinement coefficient increases further, the droop rate increases along with the increase in the optical confinement coefficient. On the other hand, if the optical confinement coefficient is less than 0.9, the droop rate decreases as the optical confinement coefficient becomes smaller. In the examination, some vertical cavity surface emitting laser devices having small optical confinement coefficients exhibited a droop rate of −70% or less.

Thus, if the fundamental transverse-mode optical confinement coefficient at room temperature is 0.9 or more, the negative droop characteristic can be suppressed.

In general, the effective refractive index difference $\Delta neff$ at room temperature becomes larger as the selective oxidation layer is larger in thickness and as the selective oxidation layer is disposed closer to the active layer. Note however that if the degrees of influence of these two factors are compared, the thickness of the selective oxidation layer has a greater influence on the effective refractive index difference $\Delta neff$. Accordingly, the strength of the optical confinement in the transverse direction is determined chiefly by the thickness of the selective oxidation layer.

Commonly used oxide confinement diameters are 4.0 μm and more. As shown in FIG. 15, if the oxide confinement diameter is 4.0 μm or more and the thickness of the selective oxidation layer is 25 nm or more, an optical confinement coefficient of 0.9 or more can be obtained.

Figure 20:
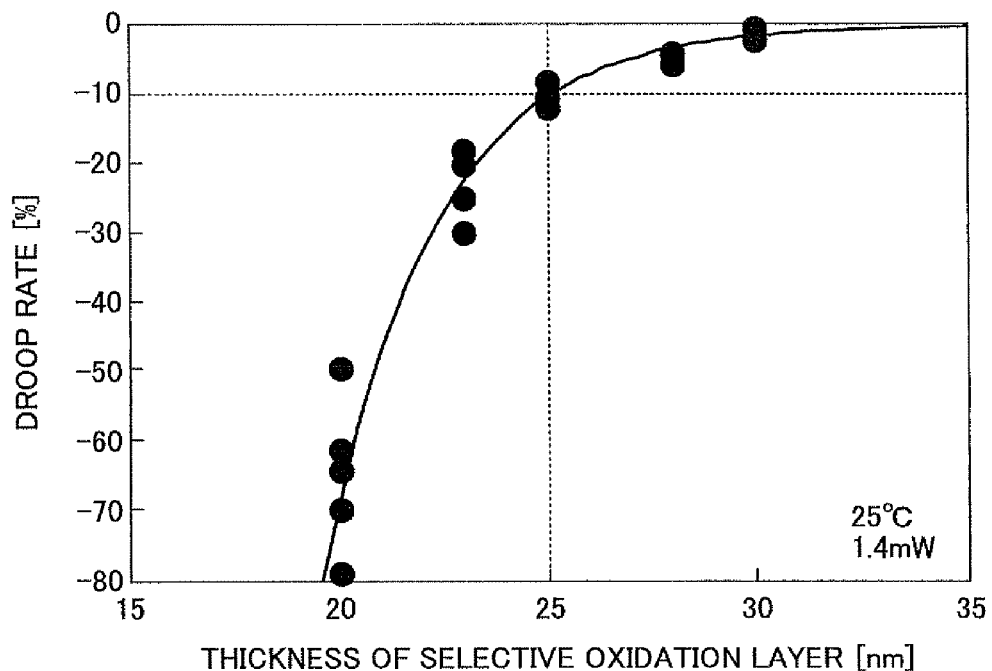
FIG. 20 shows the relationship between thickness of the selective oxidation layer and a droop rate related to a vertical cavity surface emitting laser device at 25° C.

FIG. 20 shows the relationship between the thickness of the selective oxidation layer 108 and the droop rate of a vertical cavity surface emitting laser device having a square columnar mesa and an oxide confinement diameter of 4 μm or more. The droop rate of FIG. 20 is calculated from an optical waveform obtained when the vertical cavity surface emitting laser device is driven by applying a square wave current pulse having a pulse period of 1 ms and a duty of 50%. According to FIG. 20, if the thickness of the selective oxidation layer decreases, the droop rate decreases in an exponential manner, and the negative droop characteristic becomes prominent. Also, variation in the droop rate among the vertical cavity surface emitting laser devices becomes prominent. In order to have a droop rate of −10% or more, the selective oxidation layer should be 25 nm or more in thickness.

Since the fundamental transverse-mode optical confinement coefficient depends mainly on both the oxide confinement diameter and the thickness of the selective oxidation layer, it is important how to select the combination of the oxide confinement diameter and the thickness of the selective oxidation layer.

The inventors experimented with various fitting techniques for the combination of the oxide confinement diameter and the thickness of the selective oxidation layer. As a result, it was found that the calculation results of FIG. 15 can be largely expressed by a quadratic form with two variables, the oxide confinement diameter (d [μm]) and the thickness of the selective oxidation layer (t [nm]). The following Equation (4) is obtained by fitting the fundamental transverse-mode optical confinement coefficient ($\Gamma$) into the quadratic form with the oxide confinement diameter (d) and the thickness of the selective oxidation layer (t). By assigning specific values of FIG. 15 into d and t, the fundamental transverse-mode optical confinement coefficient of FIG. 15 can be obtained with an error of roughly 1%.

$$\Gamma(d,t) = -2.54d^2 - 0.14t^2 - 0.998d \cdot t + 53.4d + 12.9t - 216 \quad \text{[Equation 4]}$$

As described above, in order to effectively suppress the negative droop characteristic, the optical confinement coefficient needs to be 0.9 or more. The combination (range) of the oxide confinement diameter (d) and the thickness of the selective oxidation layer (t) for obtaining an optical confinement coefficient of 0.9 or more can be found by the above Equation (4). That is, the range represents combinations of d and t that satisfy an inequality of $\Gamma(d, t) \geq 0.9$, and more specifically, the range is expressed by the next Equation (5).

$$-2.54d^2 - 0.14t^2 - 0.998d \cdot t + 53.4d + 12.9t - 216 \geq 0.9 \quad \text{[Equation 5]}$$

By selecting the oxide confinement diameter (d) and the thickness of the selective oxidation layer (t) so as to satisfy the above Equation (5), it is possible to achieve an optical confinement coefficient of 0.9 or more, thereby obtaining a vertical cavity surface emitting laser device free from negative droop characteristic.

In the past, it had not been known that $\Delta neff$ has influence on the droop characteristic, and the influence has been made known for the first time by the inventors of the present invention.

In the process of selectively oxidizing Al (the above process of (5)), oxidation progresses not only in the direction parallel to the substrate plane (in this case, X-Y in-plane direction) but also in the vertical direction (Z direction), if little. Therefore, it can be observed on the cross section of the mesa after the selective oxidation with an electron microscope that the oxidized layer is not uniform in thickness, and the periphery of the mesa (at which oxidation started) is thicker and the thickness of the oxidized layer is less where the oxidation ended (referred to simply as "oxidation end region"). Note however that in the region extending up to 2 to 3 μm toward the periphery from the oxidation end region, the thickness of the oxidized layer substantially corresponds to that of the selective oxidation layer. Since an oscillating light is affected chiefly by the effective refractive index difference of the oxidation end region, the selective oxidation layer is controlled to have a desired thickness (25 nm or more) in the above process (1), whereby the oxidation end region in the oxidized layer has a desired thickness.

A change in the internal temperature of the vertical cavity surface emitting laser device results in not only a change in the optical confinement coefficient but also a change in the amount of detuning. Next is described the relationship between the amount of detuning and the negative droop characteristic.

In an edge emitting semiconductor laser device, a laser oscillation occurs at a gain peak wavelength $\lambda g$ since resonant longitudinal modes are close by. On the other hand, a vertical cavity surface emitting laser device has a single resonance wavelength in general, and only a single longitudinal mode is present in the reflection band of the semiconductor DBR. In addition, since a laser oscillation occurs at a resonance wavelength $\lambda r$, the emission characteristics of the vertical cavity surface emitting laser device depend on the resonance wavelength $\lambda r$ and the gain peak wavelength $\lambda g$ of the active layer.

An amount of detuning $\Delta \lambda_0$ is defined by the following Equation (6). $\lambda r_0$ is the resonance wavelength, and $\lambda g_0$ is the gain peak wavelength. Note that the suffix "0" indicates that the value is obtained by driving the vertical cavity surface emitting laser device in a CW (Continuous Wave Oscillation) mode at the threshold current at room temperature. A value without the suffix "0" below indicates that the value is obtained under a different condition—for example, obtained by driving the vertical cavity surface emitting laser device at a current larger than the threshold current.

$$\Delta\lambda_0 = \lambda r_0 - \lambda g_0 \quad \text{[Equation 6]}$$

Figure 21:
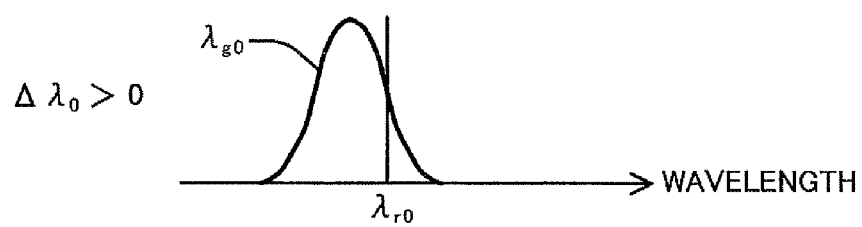
FIG. 21 is an illustrative diagram of $\Delta\lambda_0 > 0$.
Figure 22:
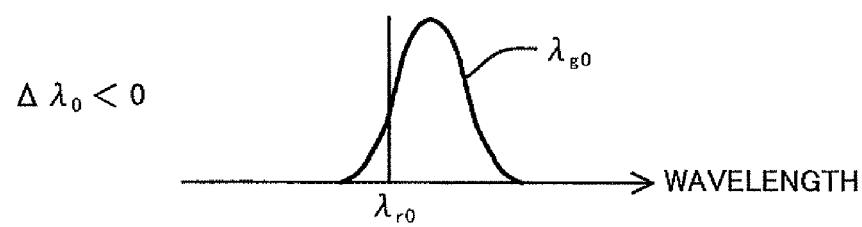
FIG. 22 is an illustrative diagram of $\Delta\lambda_0 < 0$.

FIG. 21 shows the case of $\Delta\lambda_0 > 0$, and FIG. 22 shows the case of $\Delta\lambda_0 < 0$.

The oscillation wavelength is determined not by the gain peak wavelength, but by the resonance wavelength, and therefore, the laser characteristics of the vertical cavity surface emitting laser device depend largely on whether $\Delta\lambda_0$ is a positive or negative value and the magnitude of the value. For example, the threshold current at room temperature tends to increase as the absolute value of $\Delta\lambda_0$ increases.

Along with an increase in the temperature, both the resonance wavelength and the gain peak wavelength become longer. The change of the resonance wavelength occurs due to a change in the refractive index of the materials making up the resonator structure, and the change of the gain peak wavelength occurs due to a change in the band gap energy of the materials of the active layer. Note that the rate of the change in the band gap energy is greater than the rate of the change in the refractive index by about one digit. Accordingly, the emission characteristics at a time when the temperature is changed depend mainly on the amount of change in the gain peak wavelength. Note that the resonance wavelength has a temperature change rate of about 0.05 nm/K, which is practically a negligible change.

In the vertical cavity surface emitting laser device, if the internal temperature (the temperature of the active layer) is increased by a change in the injected current or the like, the gain peak wavelength shifts to the longer wavelength side. In the case of $\Delta\lambda_0 > 0$ (see FIG. 21), the absolute value of $\Delta\lambda$ (the degree of detuning) decreases once, and then increases.

In general, a vertical cavity surface emitting laser device has the highest oscillation efficiency (luminous efficiency) when the gain peak wavelength and the resonance wavelength coincide with each other.

In the case of $\Delta\lambda_0 > 0$, if the temperature of the device (ambient temperature) is increased from room temperature, the threshold current starts decreasing with the increase in the temperature of the device. Then, the threshold current reaches the minimum value when the gain peak wavelength and the resonance wavelength coincide with each other, and starts increasing when the temperature is further increased. That is to say, the temperature at which the lowest threshold current is obtained is higher than room temperature.

In the case of $\Delta\lambda_0 < 0$ (see FIG. 22), if the internal temperature (the temperature of the active layer) is increased, the absolute value of $\Delta\lambda$ simply increases. Therefore, if the temperature of the device is increased from room temperature, the threshold current simply increases with the increase in the temperature of the device.

In this case, if the temperature of the device is decreased from room temperature, the gain peak wavelength $\Delta\lambda g$ shifts to the shorter wavelength side. Given this factor, if the temperature of the device is decreased from room temperature, the threshold current starts decreasing, and then reaches the minimum value when the gain peak wavelength and the resonance wavelength coincide with each other. Subsequently, if the temperature of the device is further decreased, the threshold current starts increasing. That is to say, in the case of $\Delta\lambda_0 < 0$, the temperature at which the lowest threshold current is obtained is lower than room temperature.

Figure 23:
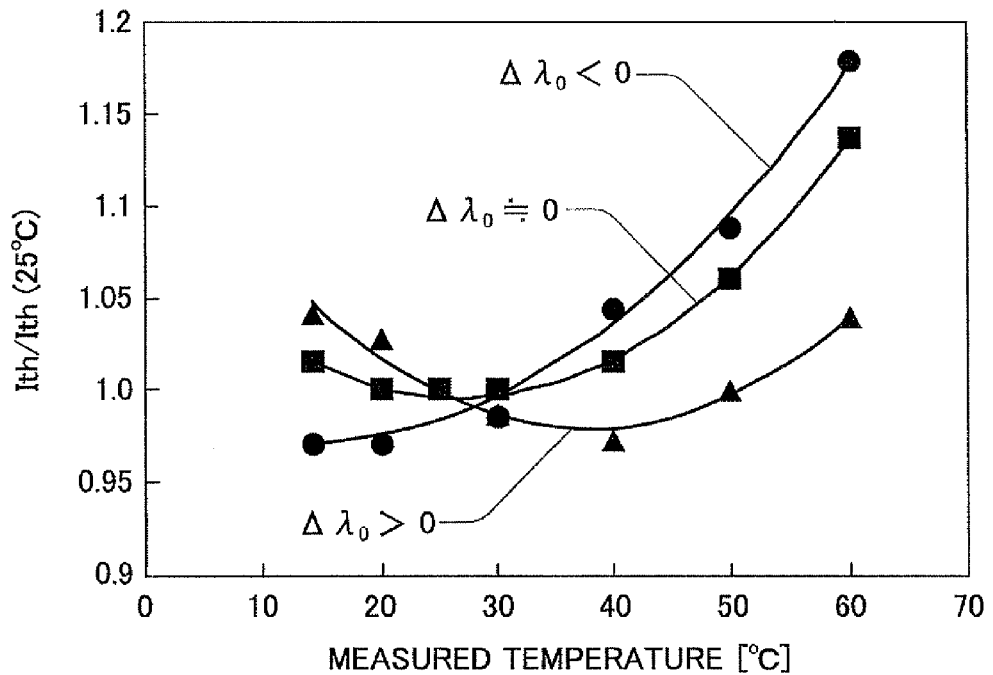
FIG. 23 shows the relationship between oscillation threshold current and measured temperature.

Using three devices having different $\Delta\lambda_0$ ($\Delta\lambda_0 < 0$, $\Delta\lambda_0 \approx 0$ and $\Delta\lambda_0 > 0$), the oscillation threshold current was measured by changing the temperature of each device (ambient temperature). The measurement results are shown as examples in FIG. 23. The vertical axis of FIG. 23 shows values obtained by standardizing an oscillation threshold current at each temperature (Ith) through division by an oscillation threshold current at 25° C. (room temperature) (Ith(25° C.)). The following can be seen from FIG. 23: in the case of $\Delta\lambda_0 < 0$, the threshold current becomes the lowest at a temperature lower than room temperature; in the case of $\Delta\lambda_0 \approx 0$, the threshold current becomes the lowest at a temperature around room temperature; and in the case of $\Delta\lambda_0 > 0$, the threshold current becomes the lowest at a temperature higher than room temperature).

In order to prevent degradation of the emission characteristics in high-temperature and high-power operations, a conventional vertical cavity surface emitting laser device is generally designed to have $\Delta\lambda_0 > 0$ so that the threshold current is reduced at high temperatures.

However, if the conventional vertical cavity surface emitting laser device with $\Delta\lambda_0 > 0$ is driven by a square wave current pulse, the I-L curve shifts to the lower current side with an increase in the internal temperature, and thus the threshold current decreases. Accordingly, the optical output obtained with a constant drive current value increases over time. That is, the negative droop characteristic occurs. On the other hand, in the case of $\Delta\lambda_0 < 0$, the I-L curve shifts to the higher current side with an increase in the internal temperature, and therefore, the optical output does not increase. That is, the negative droop characteristic does not occur. Thus, in order to suppress the negative droop characteristic, the following conditions have to be met besides the thickness of the oxidized layer: $\Delta\lambda_0 < 0$; and the lowest threshold current is not obtained at a temperature higher than room temperature.

In order to assign a desired value to $\lambda_0$, it is necessary to determine the gain peak wavelength $\lambda g_0$. In the case of an edge emitting semiconductor laser device, since the oscillation wavelength coincides with the gain peak wavelength, the gain peak wavelength can be determined from the oscillation wavelength. However, with a vertical cavity surface emitting laser device, the resonance wavelength is determined based on its structure. Therefore, it is difficult to estimate the gain peak wavelength, unlike the case of an edge emitting semiconductor laser device.

Accordingly, either one of the following methods is adopted: (1) manufacturing an edge emitting semiconductor laser device having the same active layer and estimating the gain peak wavelength from the oscillation wavelength at room temperature; and (2) manufacturing a double-hetero structure having the same active layer and estimating the gain peak wavelength from the photoluminescence wavelength (PL wavelength).

In the case of adopting the above method (1), for example, an oxide-stripe edge emitting semiconductor laser device having the same active layer structure with a stripe width of 40 μm and a resonator length of 500 μm is manufactured, and a wavelength of the edge emitting semiconductor laser device obtained at the threshold current in a CW operation at room temperature is used as the gain peak wavelength $\lambda g_0$.

In the case of adopting the above method (2), since the wavelength during the laser oscillation shifts in the longitudinal direction (wavelength shift) in relation to the PL wavelength, it is necessary to make an adjustment. The wavelength shift is attributable to the difference in the process of the excitation, such as photo-excitation and current excitation, or the influence of heat generated by the current in the case of current excitation. In general, the oscillation wavelength of an edge emitting semiconductor laser device is longer than a PL wavelength λPL by about 10 nm. Therefore, assume here that the amount of the wavelength shift is 10 nm.

Accordingly, based on the PL wavelength, the above Equation (6) can be expressed as the following Equation (7).

$$\Delta\lambda_0 = \lambda r_0 - \lambda g_0 = \lambda r_0 - (\Delta PL + 10) = \lambda r_0 - \lambda PL - 10 \quad \text{[Equation (7)]}$$

The above amount of the wavelength shift, 10 nm, is a general figure; however, it may be changed according to a material system used.

Figure 24:
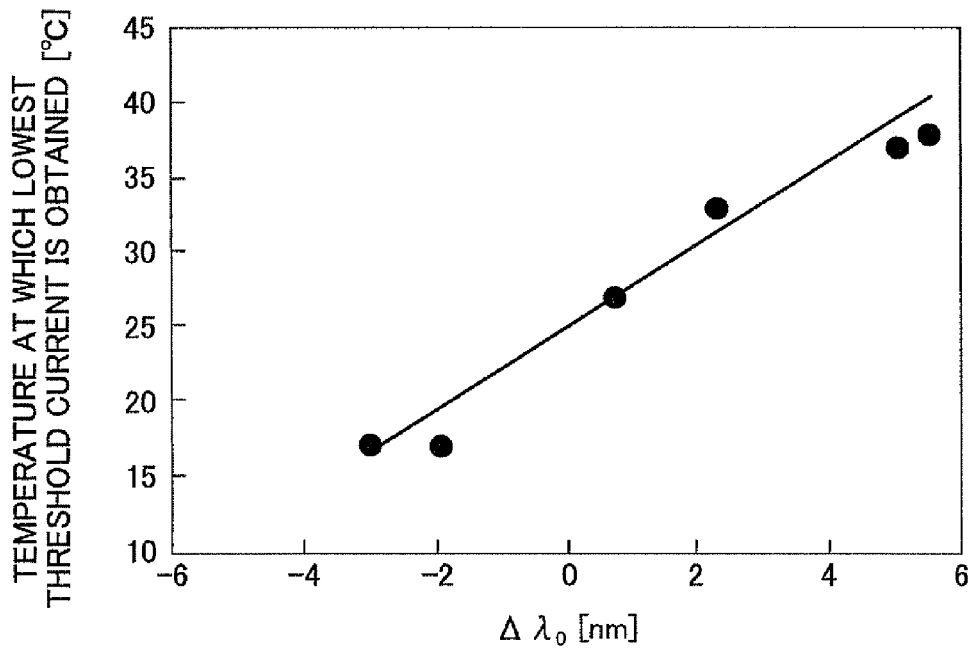
FIG. 24 shows the relationship between the amount of detuning and temperature at which the lowest threshold current is obtained.

In an experiment, various vertical cavity surface emitting laser devices each having a different $\Delta\lambda_0$ were manufactured, and the temperature at which the lowest threshold current was obtained was found for each vertical cavity surface emitting laser. FIG. 24 shows the experiment's results. It can be seen from FIG. 24 that the lowest threshold current is obtained at room temperature when $\Delta\lambda_0$ is 0.

Figure 25:
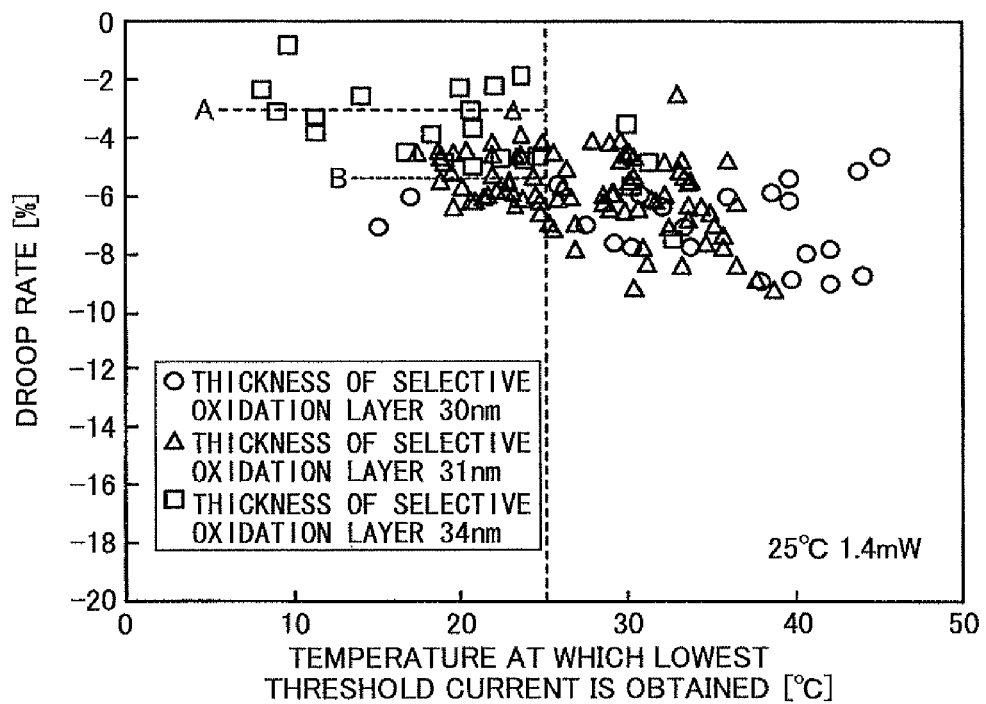
FIG. 25 shows the relationship between droop rate and temperature at which the lowest threshold current is obtained (Part 1)
Figure 26:
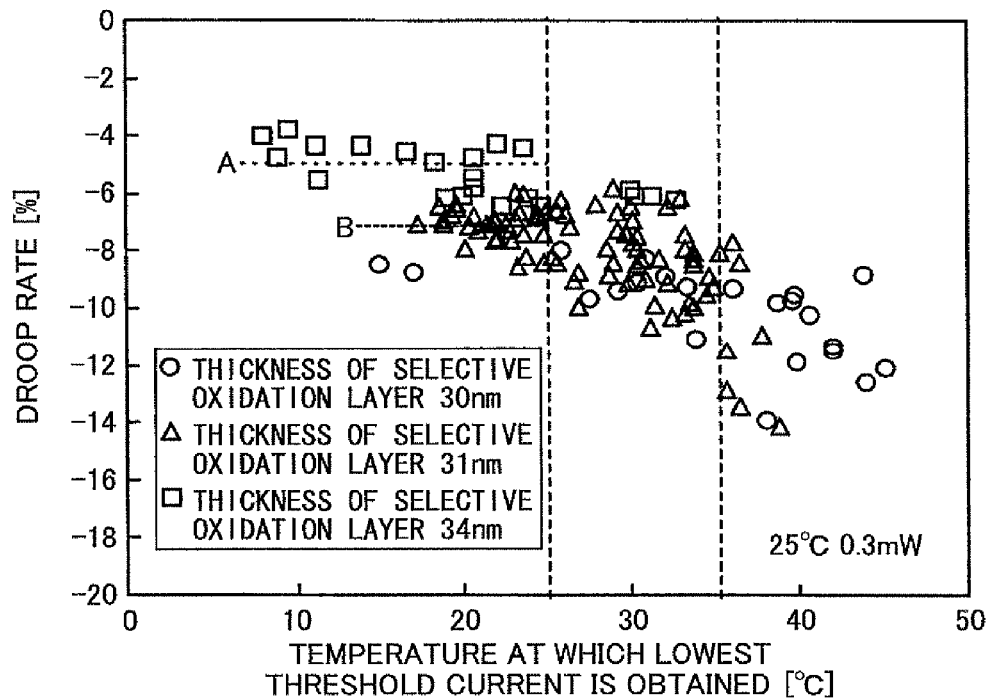
FIG. 26 shows the relationship between droop rate and temperature at which the lowest threshold current is obtained (Part 2)

In the next experiment, various vertical cavity surface emitting laser devices each having the selective oxidation layer of a different thickness (30, 31 or 34 nm) were manufactured. Each vertical cavity surface emitting laser device was driven by changing the optical pulse output in order to find the droop rate and the temperature at which the lowest threshold current was obtained. FIGS. 25 and 26 show, according to the thickness of the selective oxidation layer, the relationships between the droop rate and the temperature at which the lowest threshold current is obtained.

Specifically, FIG. 25 shows the droop rate obtained when the vertical cavity surface emitting laser devices were driven by current pulses yielding an optical output of 1.4 mW. FIG. 26 shows the droop rate obtained when the vertical cavity surface emitting laser devices, which are the same as those in FIG. 25, were driven by current pulses yielding an optical output of 0.3 mW.

When FIGS. 25 and 26 are compared, it can be seen that the droop rate changes depending on the optical output. With the smaller optical output (i.e. 0.3 mW), the droop rate is lower, and the negative droop characteristic appears prominently.

It is considered that in the case of a large optical output, the amount of the injected current is also large and the heating value of the device is large, and therefore, the influence of the power saturation due to heat appears prominently from the beginning of the current application. That is, it is considered that the normal droop characteristic appears at a relatively early stage. Note that the negative droop characteristic is a phenomenon in which the optical pulse output gradually increases from the beginning of the current application up to 1 μs. Therefore, according to the fact that the influence of the power saturation due to heat appears at the beginning of the current application, it can be considered that the negative droop characteristic has been improved.

Thus, even using the same devices, the droop rate is changed by changing the optical output of the devices. The lower the optical output, the more prominently the negative droop characteristic appears.

In printing systems, the optical pulse intensity is modulated in order to express gray scales of an image. Accordingly, in order to achieve a high-definition image, it is very important that the negative droop characteristic be suppressed over a wide output range from low to high output. As described above, since the negative droop characteristic appears more prominently with a lower output, it is very important to suppress the negative droop characteristic when the optical output is low. This is an issue newly found by the inventors of the present invention through detailed examinations of the droop characteristic under various driving conditions of the device.

Next is considered the relationship between the droop rate and the thickness of the selective oxidation layer of vertical cavity surface emitting laser devices having the lowest threshold current at 25° C. or less, with reference to FIGS. 25 and 26. As for the selective oxidation layers having a thickness of 30 nm or 31 nm, their distributions overlap with each other. However, when the selective oxidation layers having a thickness of 30 nm or 31 nm are compared to the selective oxidation layers having a thickness of 34 nm, it is understood that the thicker the selective oxidation layers, the larger the droop rate (closer to 0), and therefore, the negative droop characteristic is suppressed. The dashed line A in FIGS. 25 and 26 represents the average droop rate of the devices whose selective oxidation layers have a thickness of 34 nm and which have the lowest threshold current at 25° C. or less. The dashed line B represents the average droop rate of the devices whose selective oxidation layers have a thickness of 30 nm or 31 nm and which have the lowest threshold current at 25° C. or less. These results indicate that, as described above, the thicker the selective oxidation layer, the larger the optical confinement coefficient of the oxidized layer, and therefore, the fundamental transverse mode becomes stable even during changes in temperature.

As mentioned above, the droop rate at which the negative droop characteristic starts to influence the image quality is roughly −10%. If the droop rate becomes smaller than −10%, it is highly likely that a part of an image formed becomes blurred. As shown in FIG. 25, in the case where the optical output is 1.4 mW, the average droop rate of the devices whose selective oxidation layers have a thickness of 34 nm is about −3%, although the droop rate varies more or less. On the other hand, the average droop rate of the devices whose selective oxidation layers have a thickness of 30 nm or 31 nm is about −5%. Based on the difference in these average droop rates, a droop rate of −10% or more can be achieved if the thickness of the selective oxidation layer is 25 nm or more.

Also as shown in FIG. 26, in the case where the optical output is 0.3 mW, the average droop rate of the devices whose selective oxidation layers have a thickness of 34 nm is about −5%, although the droop rate varies more or less. On the other hand, the average droop rate of the devices whose selective oxidation layers have a thickness of 30 nm or 31 nm is about −7%. Based on the difference in these average droop rates, a droop rate of about −10% or more can be achieved if the thickness of the selective oxidation layer is 25 nm or more.

Thus, devices whose selective oxidation layers have a thickness of 25 nm or more and which has the lowest oscillation threshold current at 25° C. or less are capable of achieving a droop rate of about −10% or more over a wide output range from low to high output.

In vertical cavity surface emitting laser devices which has the lowest oscillation threshold current at a temperature higher than room temperature (25° C.), the oscillation efficiency increases when the temperature of the active layer is increased by current injection, and therefore, the negative droop characteristic appears, as described above. This trend is prominent in the case when vertical cavity surface emitting laser devices are driven by the pulse current yielding an optical output of 0.3 mW, as shown in FIG. 26.

As for both the optical confinement coefficient and the temperature at which the lowest threshold current is obtained (the amount of detuning), it is important to set them in such a manner that, in order to suppress the negative droop characteristic, the efficiency (luminous efficiency) of the vertical cavity surface emitting laser device does not increase more than the efficiency obtained at room temperature when the temperature of the active layer increases. In addition, even if the selective oxidation layer has a certain degree of thickness, the negative droop characteristic is likely to appear if the temperature at which the lowest threshold current is obtained is set higher.

If a vertical cavity surface emitting laser device having the lowest threshold current at 25° C. or more is driven by a current pulse yielding an optical output of 0.3 mW, the negative droop characteristic appears prominently, as shown in FIG. 26. However, if the temperature at which the lowest threshold current is obtained is 35° C. or less and the thickness of the selective oxidation layer is 30 nm or more, a droop rate of −10% or more is achieved on average.

As shown in FIG. 25, if the vertical cavity surface emitting laser device is driven by a current pulse yielding an optical output of 1.4 mW, a droop rate of −10% or more is achieved regardless of the thickness of the selective oxidation layer (30 nm, 31 nm, or 34 nm) over the range of temperature of FIG. 25 at which the lowest threshold current is obtained.

In conclusion, a vertical cavity surface emitting laser device whose selective oxidation layer is 30 nm or more in thickness and which has the lowest threshold current at 35° C. or less is able to achieve a droop rate of −10% or more over a wide output range. By using such a vertical cavity surface emitting laser device as a writing light source of a printer, a high-definition image free from brightness unevenness can be obtained. Note that, with reference to FIG. 24, vertical cavity surface emitting laser devices having the lowest threshold current at 35° C. have an amount of detuning of about 4 nm at room temperature.

In the case where a vertical cavity surface emitting laser device is used in a writing light source, having a large single fundamental transverse-mode output is of great advantage. In order to increase the single fundamental transverse-mode output, it is effective to reduce the strength of the optical confinement. This is incompatible with the reduction of the negative droop characteristic.

Given this factor, with the aim of increasing the single fundamental transverse-mode output while maintaining the suppression of the negative droop characteristic, the inventors of the present invention conducted an in-depth examination of the relationship between the configuration of the resonator structure and the optical confinement strength of the vertical cavity surface emitting laser device. As a result, it was found effective to provide an optical confinement reducing region to be explained below in the lower semiconductor DBR (n-type substrate-side multilayer reflector) in order to achieve the above aim.

The effect of the optical confinement reducing region is explained next.

Fundamental transverse-mode optical confinement coefficients at room temperature (300 K) were calculated for a conventional vertical cavity surface emitting laser device having no optical confinement reducing region and vertical cavity surface emitting laser devices having the optical confinement reducing region. FIG. 27 shows the calculation results. Each vertical cavity surface emitting laser device used in the calculation has a 780 nm-band oscillation wavelength, and basically includes a lower semiconductor DBR (n-type substrate-side multilayer reflector) having 40.5 pairs of an n-AlAs low refractive index layer and an $Al_{0.3}Ga_{0.7}As$ high refractive index layer; an upper semiconductor DBR (p-type emission-side multilayer reflector) having 24 pairs of a p-$Al_{0.9}Ga_{0.1}As$ refractive index layer and a p-$Al_{0.3}Ga_{0.7}As$ refractive index layer; and $Al_{0.6}Ga_{0.4}As$ spacer layers. The active layer has a threefold quantum well structure including $Al_{0.12}Ga_{0.88}As$ and $Al_{0.3}Ga_{0.7}As$ layers, and is disposed in the center of the spacer layers. The selective oxidation layer is disposed, within the upper semiconductor DBR, at a position corresponding to the third node of the standing wave counted from the active layer. The oxidized layer is 28 nm in thickness and the oxide confinement diameter is 4 μm.

Figure 28:
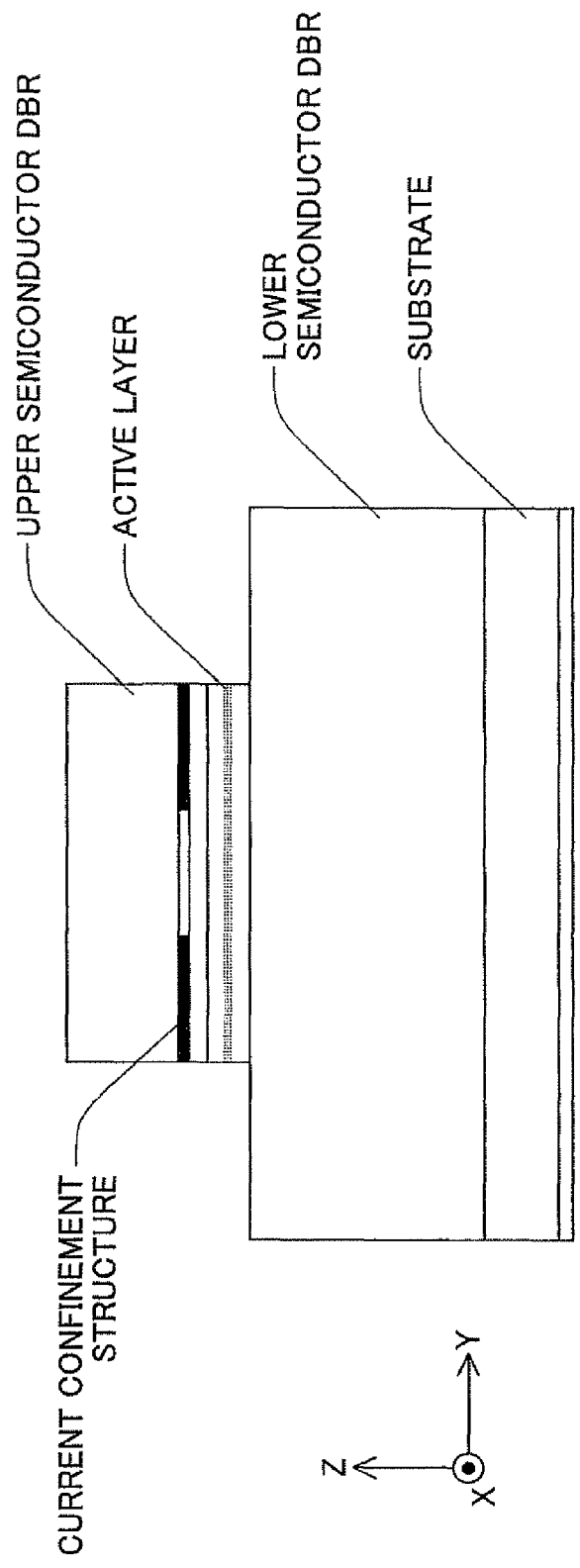
FIG. 28 shows the structure of a conventional cavity surface emitting laser device used for calculation.
Figure 29:
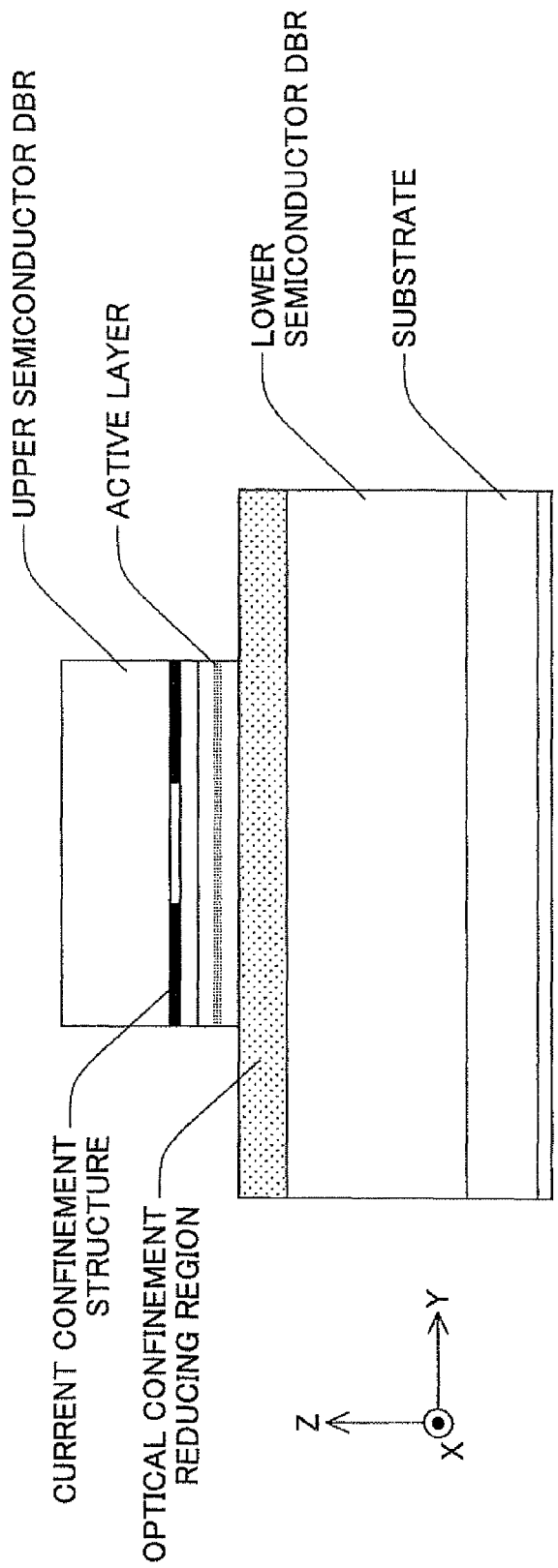
FIG. 29 shows the structure of a cavity surface emitting laser device having an optical confinement reducing region used for the calculation.

The conventional vertical cavity surface emitting laser device includes a cylindrical mesa post configuration having a diameter of 25 μm on the lower semiconductor DBR, as shown in FIG. 28. On the other hand, the vertical cavity surface emitting laser device having an optical confinement reducing region includes the optical confinement reducing region adjacent to the lower semiconductor DBR, as shown in FIG. 29.

Figure 30:
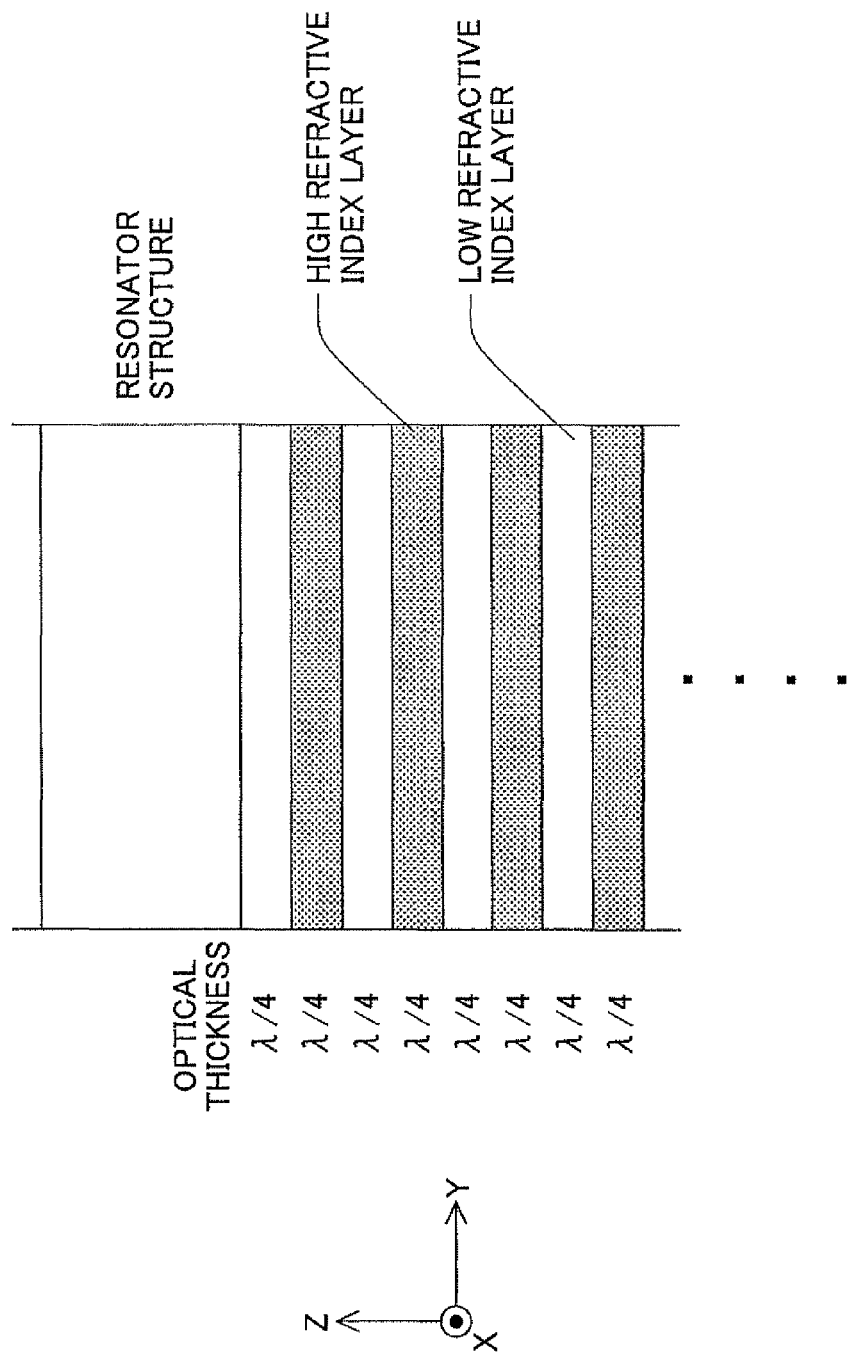
FIG. 30 shows the structure of a lower semiconductor DBR of the conventional vertical cavity surface emitting laser device used for the calculation.
Figure 31:
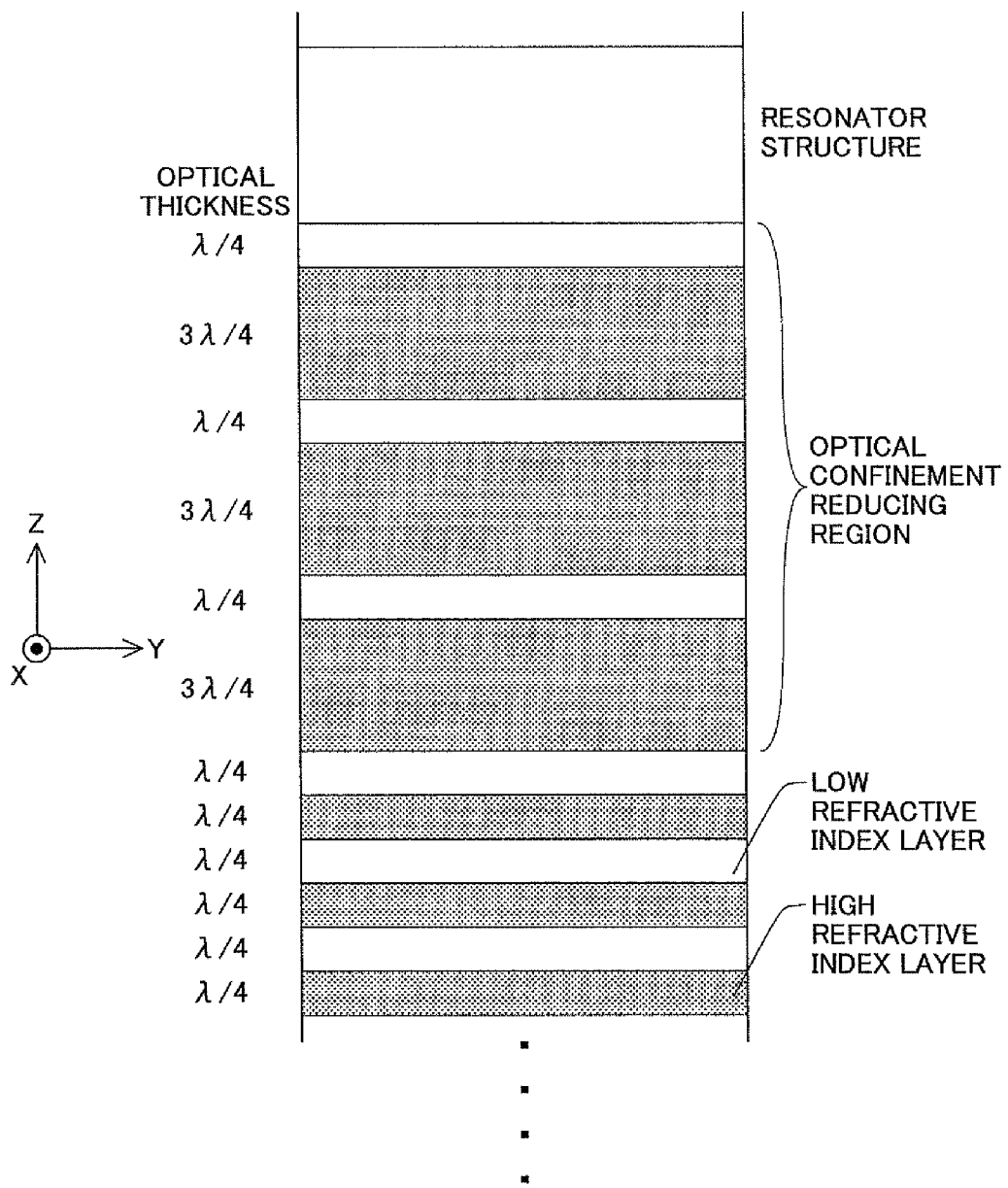
FIG. 31 shows the optical confinement reducing region A.

FIG. 30 shows the configuration of the lower semiconductor DBR of the conventional vertical cavity surface emitting laser device. Each refractive index layer has an optical thickness of $\lambda/4$. FIG. 31 shows the configuration of the lower semiconductor DBR of the vertical cavity surface emitting laser device having the optical confinement reducing region. The optical confinement reducing region has 3 pairs of a high refractive index layer having an optical thickness of $3\lambda/4$ and a low refractive index layer having an optical thickness of $\lambda/4$. Note that the optical confinement reducing region having pairs of a high refractive index layer having an optical thickness of $3\lambda/4$ and a low refractive index layer having an optical thickness of $\lambda/4$, is also referred to as "optical confinement reducing region A" below.

The conventional vertical cavity surface emitting laser device and the vertical cavity surface emitting laser device having the optical confinement reducing region A have the same number of pairs of the high and low refractive index layers in the lower semiconductor DBR. Each high refractive index layer of the optical confinement reducing region A has an optical thickness corresponding to an odd multiple of $\lambda/4$, which satisfies the phase condition of the multiple reflection. Therefore, if free carrier absorption and the like in the semiconductor materials are not taken into account, the lower semiconductor DBR of each vertical cavity surface emitting laser device having the optical confinement reducing region A has a reflectance in the vertical direction (Z direction) equal to that of the lower semiconductor DBR of the conventional vertical cavity surface emitting laser device.

FIG. 27 presents the fundamental transverse-mode optical confinement coefficients obtained in the case where the optical confinement reducing region A includes one, two or three pairs. In FIG. 27, "zero" in the number of pairs represents the conventional vertical cavity surface emitting laser device.

According to FIG. 27, it is understood that the vertical cavity surface emitting laser devices having the optical confinement reducing region A have lower fundamental transverse-mode optical confinement coefficients compared to the conventional vertical cavity surface emitting laser device. In addition, as the number of pairs in the optical confinement reducing region A increases, the optical confinement coefficient decreases.

Figure 32:
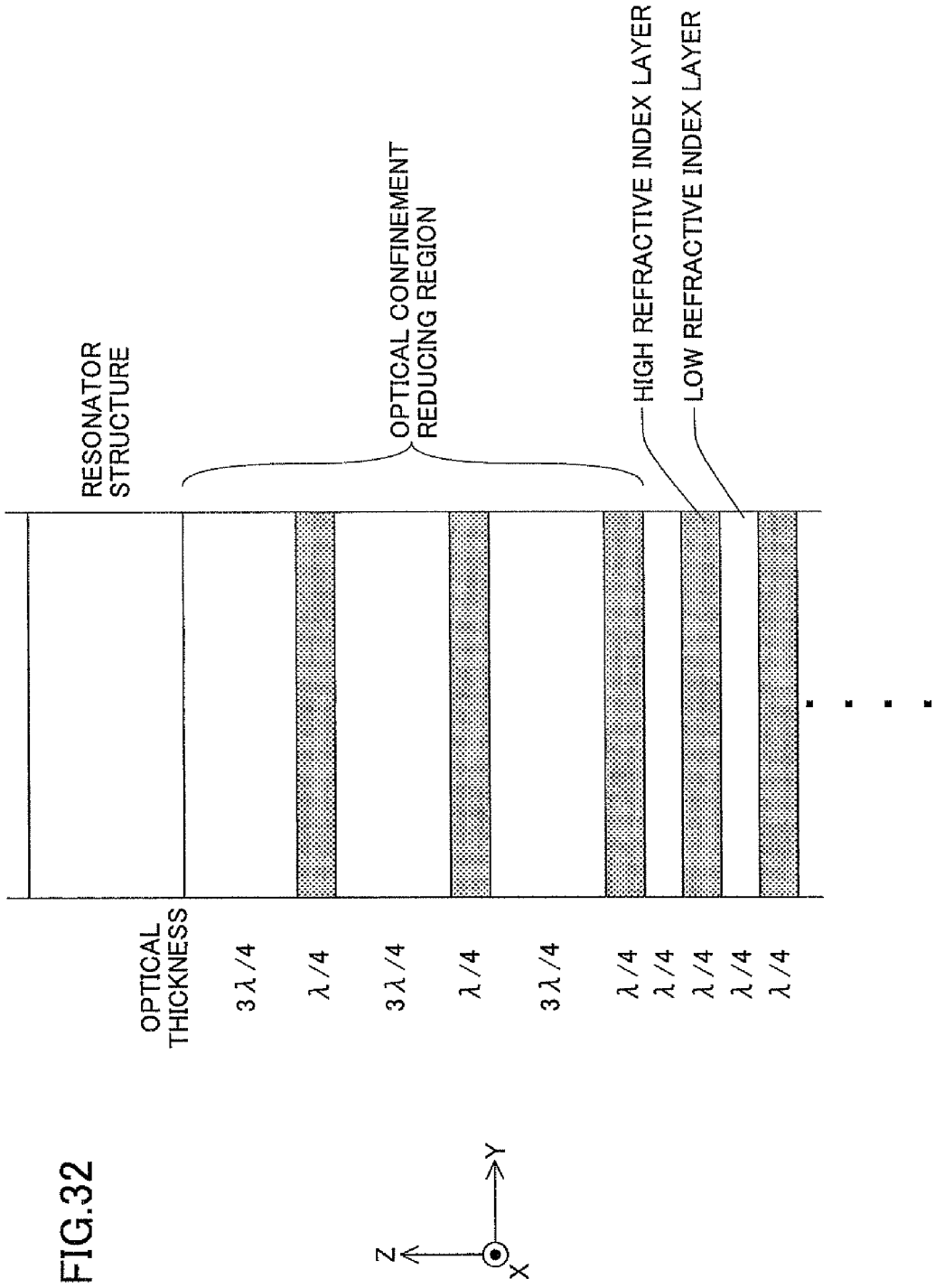
FIG. 32 shows an optical confinement reducing region B.

FIG. 32 shows another optical confinement reducing region having pairs of a high refractive index layer ($Al_{0.3}Ga_{0.7}As$) having an optical thickness of $\lambda/4$ and a low refractive index layer (AlAs) having an optical thickness of $3\lambda/4$. In this case, each low refractive index layer is formed thicker than that of the conventional vertical cavity surface emitting laser device. Note that the optical confinement reducing region including pairs of a high refractive index layer having an optical thickness of $\lambda/4$ and a low refractive index layer having an optical thickness of $3\lambda/4$, is also referred to as "optical confinement reducing region B" below.

FIG. 33 presents fundamental transverse-mode optical confinement coefficients at room temperature (300 K) of vertical cavity surface emitting laser devices having the optical confinement reducing region B, along with the fundamental transverse-mode optical confinement coefficient of the conventional vertical cavity surface emitting laser device.

According to FIG. 33, it is understood that the vertical cavity surface emitting laser devices having the optical confinement reducing region B have lower fundamental transverse-mode optical confinement coefficients compared to the conventional vertical cavity surface emitting laser device, as in the case of providing the optical confinement reducing region A. In addition, as the number of pairs in the optical confinement reducing region B increases, the optical confinement coefficient decreases. If the fundamental transverse-mode optical confinement coefficient is compared between the optical confinement reducing regions A and B having the same number of pairs, it can be seen that the optical confinement reducing region B has a larger decreasing effect than the optical confinement reducing region A. In the AlGaAs mixed crystal which is a material of the semiconductor multilayer reflector, AlAs has the highest thermal conductivity. Therefore, the thermal diffusion in the transverse direction is favorably enhanced by forming the layers made of AlAs thick, which facilitates reducing the temperature increase in the active layer. Accordingly, the temperature increase in the central portion of the vertical cavity surface emitting laser device is reduced, and therefore, changes in the effective refractive index difference become small, whereby it is possible to also obtain an effect of suppressing the negative droop characteristic.

Figure 34:
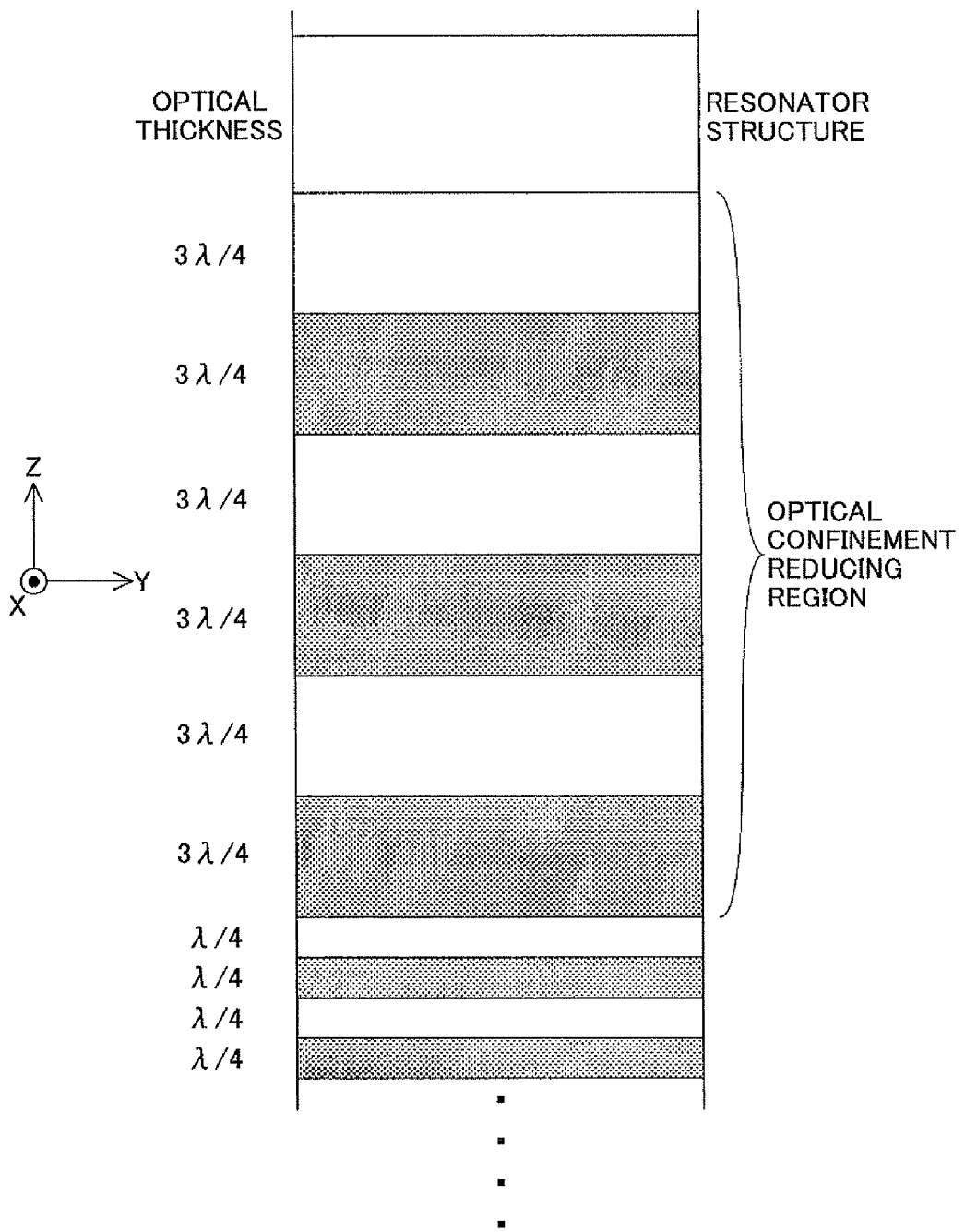
FIG. 34 shows an optical confinement reducing region C.

FIG. 34 shows yet another optical confinement reducing region having pairs of a high refractive index layer ($Al_{0.3}Ga_{0.7}As$) having an optical thickness of $3\lambda/4$ and a low refractive index layer (AlAs) having an optical thickness of $3\lambda/4$. In this case, both low and high refractive index layers are formed thicker than those of the conventional vertical cavity surface emitting laser device. Note that the optical confinement reducing region including pairs of a high refractive index layer having an optical thickness of $3\lambda/4$ and a low refractive index layer having an optical thickness of $3\lambda/4$, is also referred to as "optical confinement reducing region C" below.

Figures 35, 36:
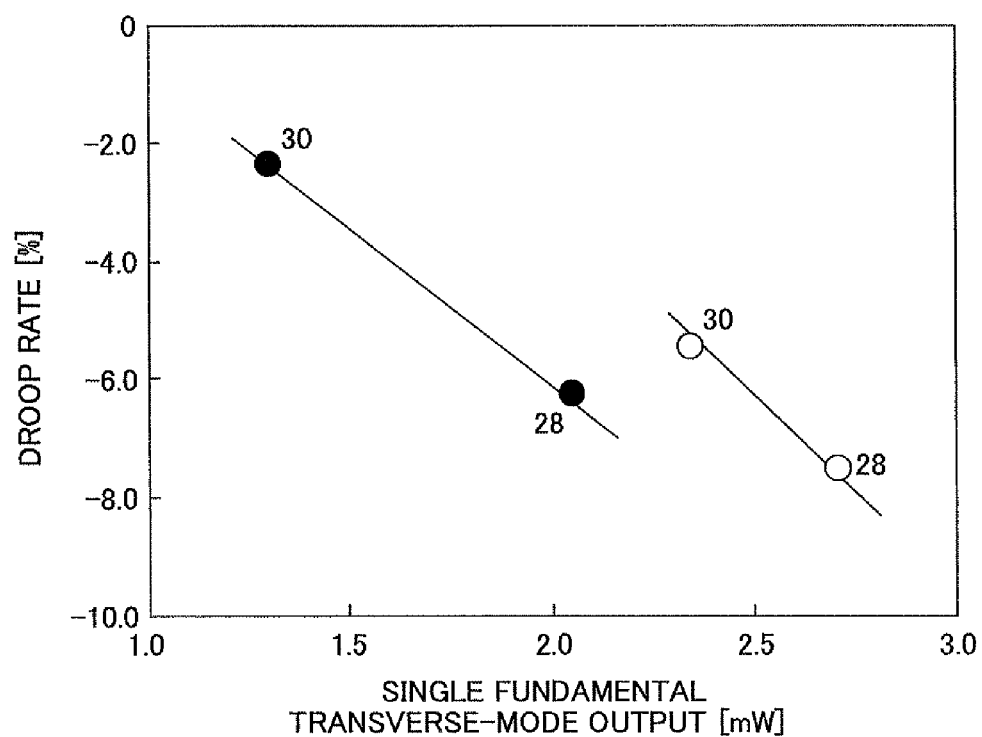
FIG. 35 shows the relationship between the number of pairs in the optical confinement reducing region C and the fundamental transverse-mode optical confinement coefficient.
FIG. 36 is a diagram showing an effect of the optical confinement reducing region.

FIG. 35 presents fundamental transverse-mode optical confinement coefficients at room temperature (300 K) of vertical cavity surface emitting laser devices having the optical confinement reducing region C, along with the fundamental transverse-mode optical confinement coefficient of the conventional vertical cavity surface emitting laser device.

According to FIG. 35, it is understood that the vertical cavity surface emitting laser devices having the optical confinement reducing region C have lower fundamental transverse-mode optical confinement coefficients compared to the conventional vertical cavity surface emitting laser devices, as in the case of providing the optical confinement reducing region A. In addition, as the number of pairs in the optical confinement reducing region C increases, the optical confinement coefficient decreases. If the fundamental transverse-mode optical confinement coefficient is compared among the optical confinement reducing regions A, B and C having the same number of pairs, it can be seen that the optical confinement reducing region C has the largest decreasing effect.

Thus, the inventors of the present invention have found that the fundamental transverse-mode optical confinement coefficient can be more effectively reduced with thicker high and low refractive index layers in the optical confinement reducing region, as well as with a larger number of pairs of the refractive index layers.

It should be particularly noted that the optical confinement decreasing effect increases the single fundamental transverse-mode output without worsening the negative droop characteristic as described below. Generally speaking, a reduction in the optical confinement coefficient has an advantage in increasing the single fundamental transverse-mode output; however, it is expected that the stability of the transverse mode becomes inferior and the negative droop characteristic is likely to occur.

FIG. 36 shows the results of an experiment conducted for examining the relationship between the signal fundamental transverse-mode output and the droop rate of vertical cavity surface emitting laser devices having a 780 nm-band oscillation wavelength. The filled circles of FIG. 36 represent the results obtained from conventional vertical cavity surface emitting laser devices, and the open circles represent the results obtained from vertical cavity surface emitting laser devices having the optical confinement reducing region B. The area of the current passage region in each vertical cavity surface emitting laser device is $16\ \mu m^2$. The number "28" of FIG. 36 indicates that the selective oxidation layer is 28 nm in thickness, and the number "30" indicates that the selective oxidation layer is 30 nm in thickness.

Both the negative droop characteristic and the single fundamental transverse-mode output are related to the optical confinement coefficient, and bear an inverse relationship to each other as shown in FIG. 36. For example, since the stability of the transverse mode increases with a larger optical confinement coefficient, the negative droop characteristic is suppressed. In addition, with a larger optical confinement coefficient, the confinement of higher-order transverse modes is improved, which facilitates oscillation, and accordingly, the single fundamental transverse-mode output decreases. If the optical confinement coefficient is the only factor for determining the droop rate and the single fundamental transverse-mode output, the correlation between the droop rate and the single fundamental transverse-mode output can be represented by one straight line, regardless of the presence or absence of the optical confinement reducing region.

However, as shown in FIG. 36, depending on whether the optical confinement reducing region is provided, the straight line correlation between the droop rate and the single fundamental transverse-mode output changes. More specifically, a vertical cavity surface emitting laser device having the optical confinement reducing region achieves a higher single fundamental transverse-mode output than one without the optical confinement reducing region even when they have the same droop rate. This indicates that the optical confinement reducing region has an effect of increasing the single fundamental transverse-mode output without influencing the droop rate.

Thus, the inventors of the present invention have newly found that the negative droop characteristic is effectively reduced by providing the optical confinement reducing region, setting the amount of detuning in such a manner that the lowest threshold current is obtained at 25° C. or less, and forming the selective oxidation layer having a thickness of 25 nm or more, whereby it is possible to increase the single fundamental transverse-mode output while favorably maintaining the droop characteristic.

The vertical cavity surface emitting laser device 100 includes the third lower semiconductor DBR $103_3$ between the optical confinement reducing region and the resonator structure. The function of the third lower semiconductor DBR $103_3$ is explained next.

In general, light absorption by free carriers occurs in a semiconductor material. The light absorption increases in proportion to the electric field intensity of the light and the free carrier concentration. The light energy absorbed by free carriers becomes the kinetic energy of the free carriers, and is eventually converted into lattice vibrational energy. This leads to an increase in the oscillation threshold current and a decrease in the external differential quantum efficiency (slope efficiency).

In each semiconductor DBR, the refractive index layers are superimposed one on top of the other so that light reflected from the interface of each refractive index layer is in the same phase and has an opposite phase with respect to the incident light, whereby the semiconductor DBR produces a strong reflection (high reflectance). At this point, since reflection occurs only at the interface, the electric field intensity (amplitude) in each refractive index layer does not attenuate and remains constant. During the laser oscillation, a standing wave is generated in the electric field distribution of the semiconductor DBR, and a node or an antinode alternately appear for every $\lambda/4$ optical thickness. In a normal semiconductor DBR that includes low and high refractive index layers each having an optical thickness of $\lambda/4$, each interface between a low refractive index layer and a high refractive index layer is a position corresponding to a node and an antinode of the standing wave. In a region adjacent to the resonator structure, the standing wave of the oscillation light has high intensity, and light absorption by free carriers is significant in this region.

Figure 37:
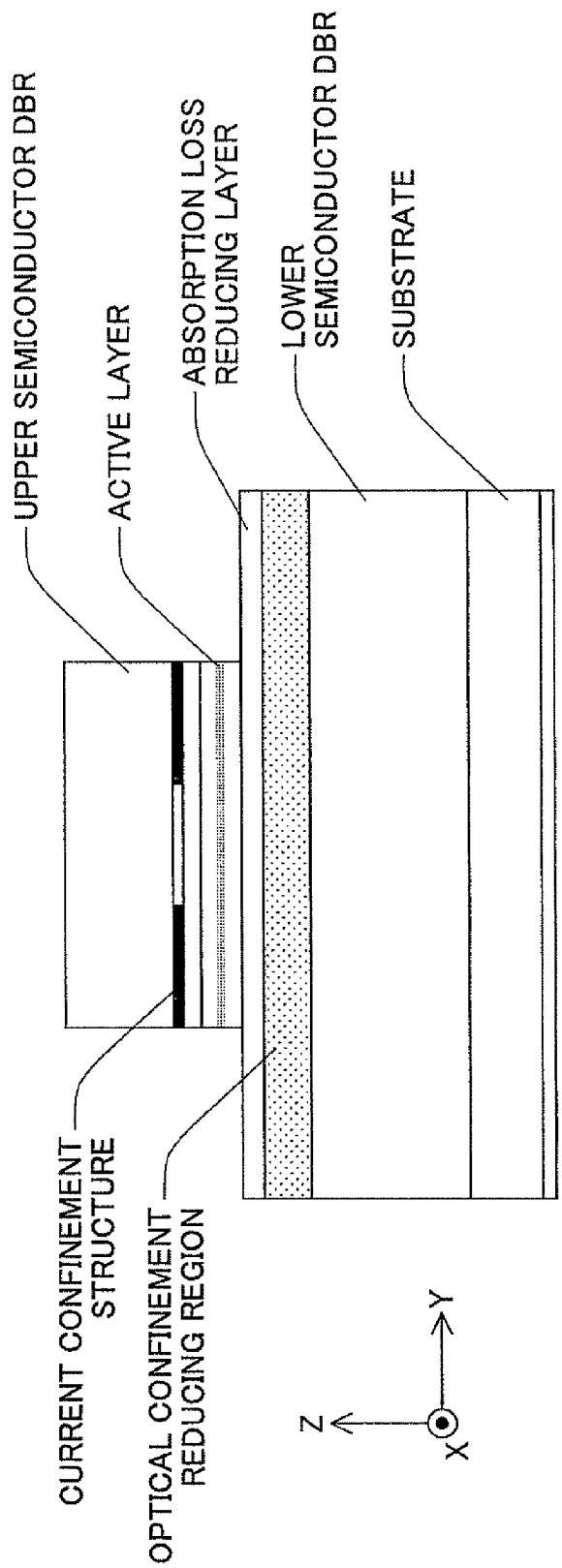
FIG. 37 is a diagram illustrating an absorption loss reducing layer (Part 1)

The decreasing effect on the absorption loss is calculated for the case in which one or more pairs of low and high refractive index layers, each having an optical thickness of $\lambda/4$, are provided between the optical confinement reducing region and the resonator structure, as shown in FIG. 37. Note that a set of the paired high and low refractive index layers is also referred to as "absorption loss reducing layer" below.

Figure 38:
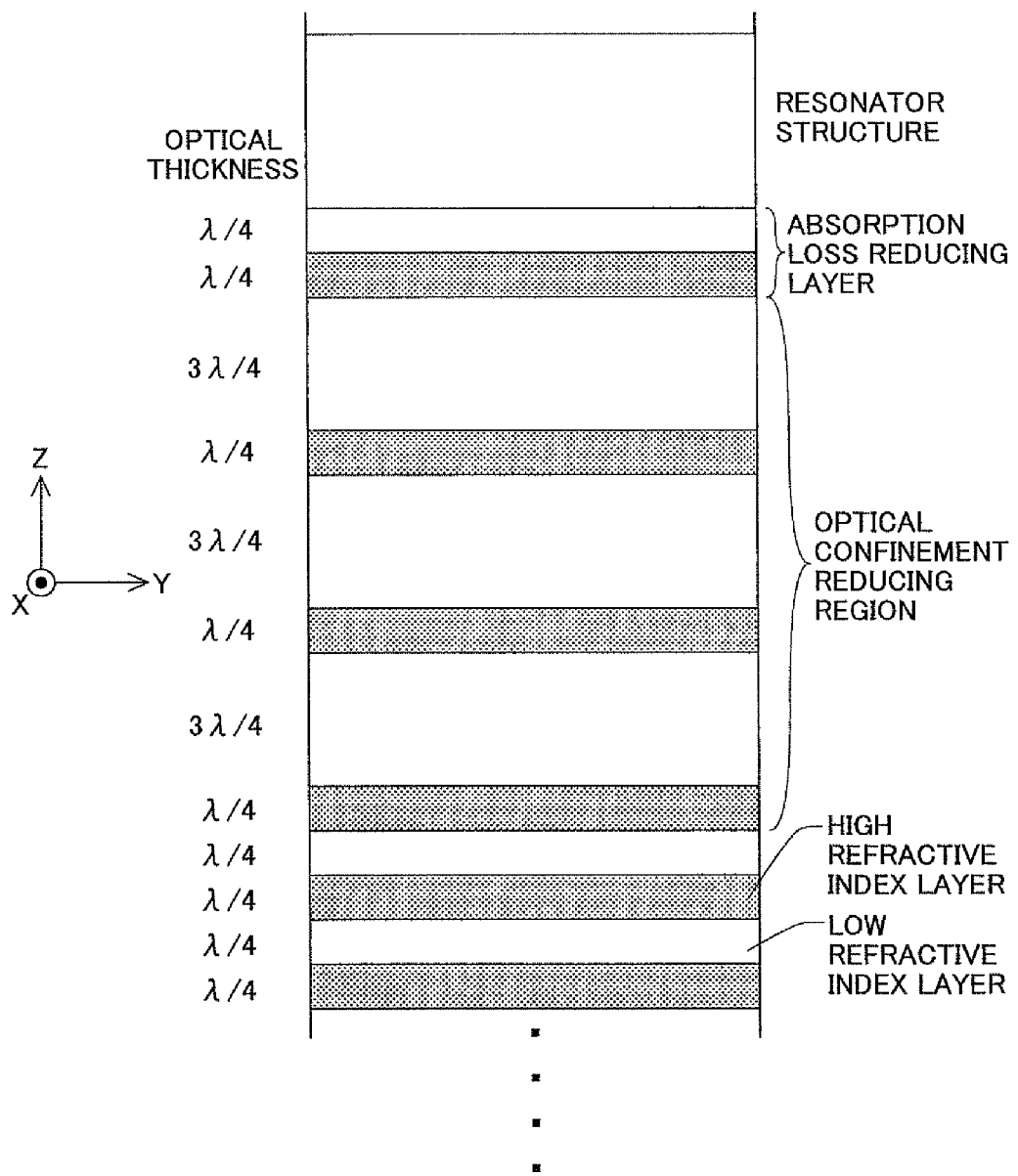
FIG. 38 is a diagram illustrating the absorption loss reducing layer (Part 2)

Assume here that the absorption loss of the conventional semiconductor DBR (see FIG. 30) is 100%. The results of the calculations show that the absorption loss is decreased by 23% in the case of providing the absorption loss reducing layer including one pair of high and low refractive index layers, as shown in FIG. 38, compared to the case of providing no absorption loss reducing layer (see FIG. 32). In addition, the absorption loss is decreased by 54% in the case of providing the absorption loss reducing layer including three pairs compared to the case of providing no absorption loss reducing layer. In the calculation, the n-type carrier concentration is changed in the range of 3 to $5 \times 10^{18}$ cm$^{-3}$ and the number of pairs included in the optical confinement reducing region is changed in the range of 1 to 5; however, little change is seen in the above-mentioned percentages.

In the vertical cavity surface emitting laser device 100, light absorption by free carriers is reduced by providing the absorption loss reducing layer including one pair. That is, in the optical confinement reducing region, each refractive index layer is great in thickness, and therefore, light absorption by free carriers increases due to the increased thickness of the optical confinement reducing region as well as inclusion of a larger number of antinodes of the standing wave because of the increased thickness. In this case, if the absorption loss reducing layer including one pair is provided, it is possible to reduce the electric field intensity in the optical confinement reducing region, thereby reducing the absorption loss.

FIG. 39 shows fundamental transverse-mode optical confinement coefficients obtained for the presence and absence of the absorption loss reducing layer of one pair. Three different optical confinement reducing regions—optical confinement reducing regions A, B and C (type A, B and C)—are provided in which each high refractive index layer is made of $Al_{0.3}Ga_{0.7}As$ and each low refractive index layer is made of AlAs. The number of pairs included in each optical confinement reducing region is three.

FIG. 39 also shows reduction percentages of the optical confinement coefficients of each type. A reduction percentage represents a reduction (%) of the optical confinement coefficient of each optical confinement reducing region when the fundamental transverse-mode optical confinement coefficient of the conventional semiconductor DBR (see FIG. 30) is 100%.

According to FIG. 39, it can be understood that change in the optical confinement coefficient produced by providing the absorption loss reducing layer including one pair is only a little.

A comparative evaluation was conducted by manufacturing a vertical cavity surface emitting laser device VCSEL1 having no optical confinement reducing region (see FIG. 30); a vertical cavity surface emitting laser device VCSEL2 having the optical confinement reducing region B but not having the absorption loss reducing layer (see FIG. 32); and a vertical cavity surface emitting laser device VCSEL3 having the optical confinement reducing region B and the absorption loss reducing layer including one pair (see FIG. 38). Note that in each vertical cavity surface emitting laser device, the oscillation wavelength is in a 780-nm band and the area of the current passage region is 16 µm$^2$. In addition, all the vertical cavity surface emitting laser devices have the same number of pairs of high and low refractive index layers in their lower semiconductor DBRs.

Figure 40:
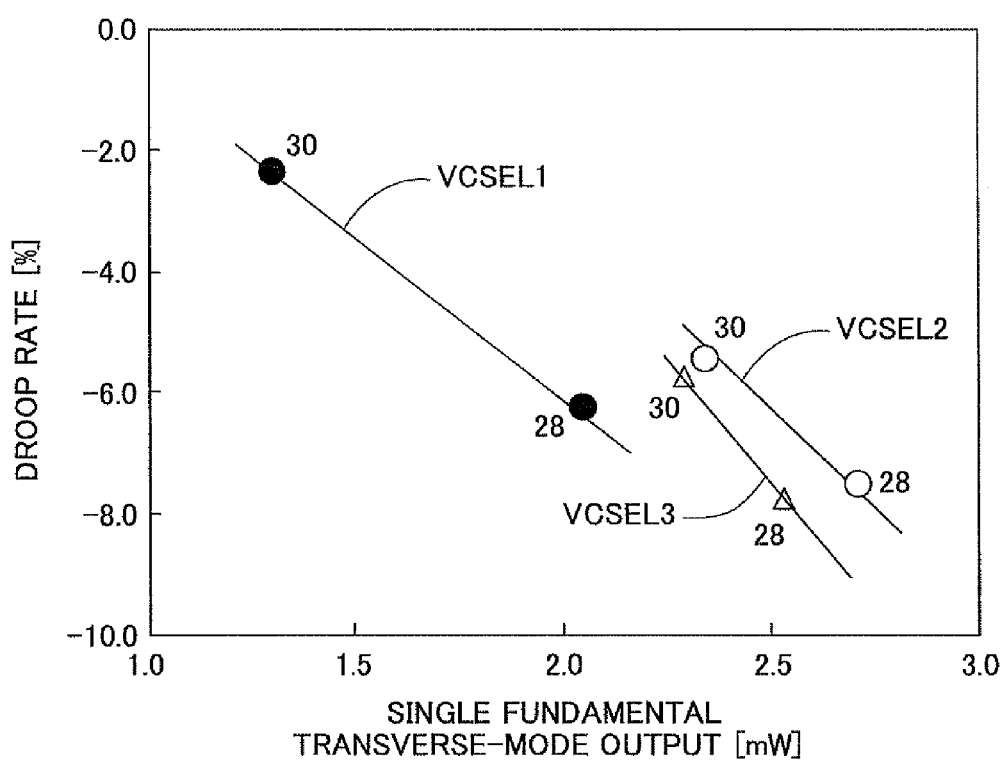
FIG. 40 is a diagram illustrating effects of the optical confinement reducing region and the absorption loss reducing layer (Part 1)

The results of the comparative evaluation show that the vertical cavity surface emitting laser devices VCSEL2 and VCSEL3 exhibit clear and substantially equal increases in the single fundamental transverse-mode output compared to the vertical cavity surface emitting laser device VCSEL1, as shown in FIG. 40. The number "30" of FIG. 40 indicates that the selective oxidation layer is 30 nm in thickness, and the number "28" of FIG. 40 indicates that the selective oxidation layer is 28 nm in thickness.

According to FIG. 40, at the same droop rate, each of the vertical cavity surface emitting laser devices VCSEL2 and VCSEL3 has a single fundamental transverse-mode output exceeding that of the vertical cavity surface emitting laser device VCSEL1 by about 0.3 to 0.5 mW.

Figure 41:
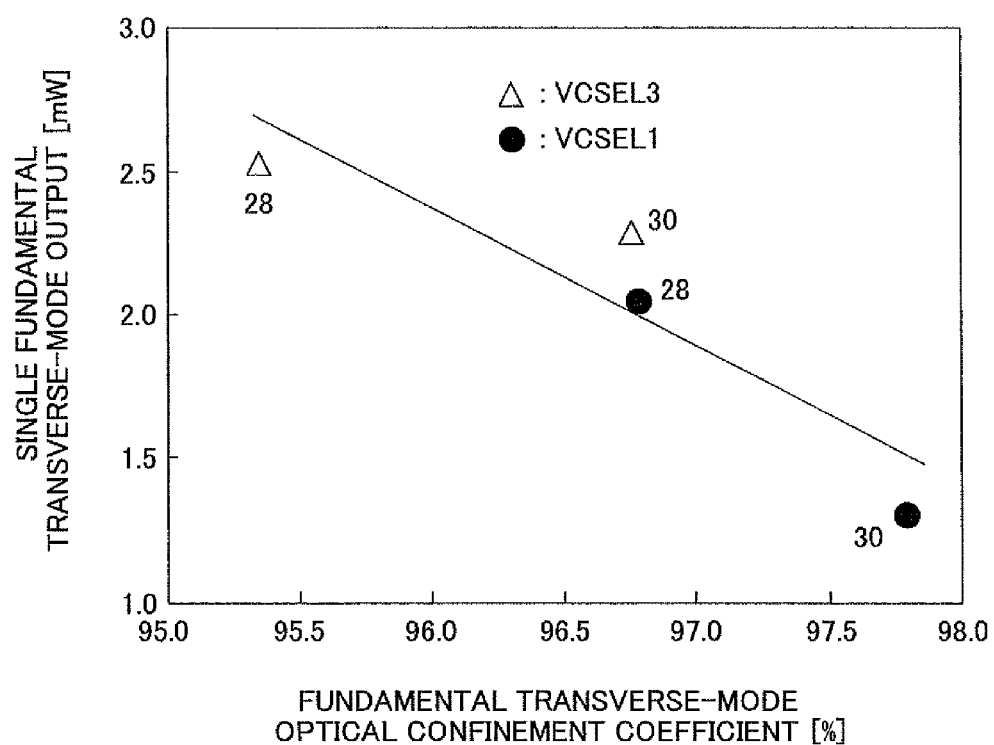
FIG. 41 is a diagram illustrating effects of the optical confinement reducing region and the absorption loss reducing layer (Part 2)

FIG. 41 shows the relationship between the single fundamental transverse-mode output (calculated values) and the fundamental transverse-mode optical confinement coefficient (calculated values). Symbols used in FIG. 41 denote the same in FIG. 40. In addition, the numbers "30" and "28" of FIG. 41 also denote the same as in FIG. 40.

According to FIG. 41, compared to the vertical cavity surface emitting laser device VCSEL1, the vertical cavity surface emitting laser device VCSEL3 clearly has a reduced optical confinement coefficient, thereby exhibiting an increased signal fundamental transverse-mode output.

In addition, compared to the vertical cavity surface emitting laser device VCSEL2, the vertical cavity surface emitting laser device VCSEL3 has a lower threshold current and a higher external differential quantum (slope efficiency). This is due to a reduction in the absorption loss.

As has been described above, the vertical cavity surface emitting laser device 100 of the present embodiment has the resonator structure including the active layer 105, and the lower semiconductor DBR 103 and the upper semiconductor DBR 107 having the resonator structure between them. The upper semiconductor DBR 107 includes the current confinement structure where the oxidized layer 108b surrounds the current passage region 108a. The oxidized layer 108b includes at least an oxide, and is generated by oxidizing a part of a selective oxidation layer which includes aluminum and has a thickness of 30 nm. Herewith, the current confinement structure is able to confine the injected current and the transverse modes of oscillation light at the same time.

The lower semiconductor DBR 103 is provided on the substrate 101 side in relation to the resonator structure, and includes the second lower semiconductor DBR $103_2$ which functions as an optical confinement reducing region for reducing the transverse-direction optical confinement. Accordingly, it is possible to perform high-power operations in a single fundamental transverse-mode oscillation while suppressing the negative droop characteristic.

In addition, the PL wavelength of the active layer is set to 772 nm when the resonance wavelength of the resonator is 780 nm and the amount of detuning $\Delta\lambda_0$ at room temperature is set to −2 nm so that the lowest threshold current is obtained at 17° C. Herewith, the negative droop characteristic is further suppressed.

Since in the second lower semiconductor DBR $103_2$, the low refractive index layers 103a are each provided in such a manner as to have an optical thickness of $3\lambda/4$, it is possible to set the interface of each refractive index layer at a position corresponding to an antinode or a node. Note that the low refractive index layers 103a of the second lower semiconductor DBR $103_2$ do not necessarily have an optical thickness of $3\lambda/4$ but should have an optical thickness of $(2n+1)\lambda/4$, where n is an integer equal to or greater than 1. Accordingly, the interface of each refractive index layer can be set at a position corresponding to an antinode or a node of the standing wave.

In the case of supplying a square wave current pulse having a pulse period of 1 ms and a pulse width of 500 μs, (P1−P2)/P2=−0.06. Thus, the negative droop characteristic is further suppressed.

In addition, the third lower semiconductor DBR $103_3$ is provided between the second lower semiconductor DBR $103_2$ and the resonator structure, and it is therefore possible to reduce the absorption loss.

As for an optical scanning apparatus 1010 of the present embodiment, since the light source 14 of the optical scanning apparatus 1010 has the vertical cavity surface emitting laser device 100, the optical scanning apparatus 1010 is capable of performing optical scanning with high accuracy.

A laser printer 1000 of the present invention includes the optical scanning apparatus 1010, and is therefore capable of forming a high quality image.

b. Modifications of First Embodiment

According to the above embodiment, the third lower semiconductor DBR $103_3$ includes a pair of the low refractive index layer 103a and the high refractive index layer 103b; however, the present invention is not limited to this case.

Figure 42:
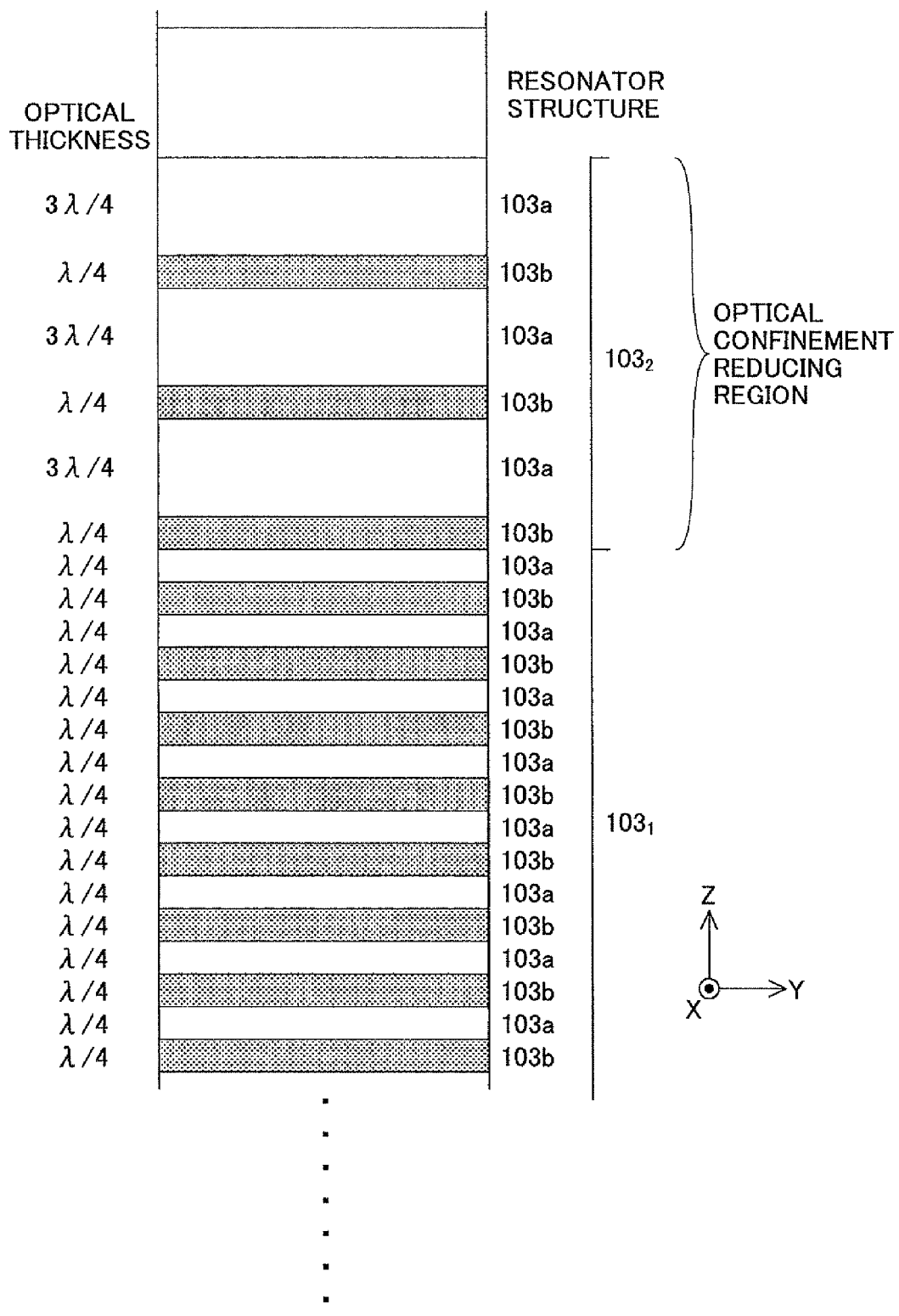
FIG. 42 illustrates a first modification of the optical confinement reducing region.

In the case where there is no need to take into account any absorption loss in the above embodiment, the second lower semiconductor DBR $103_2$ may be positioned next to the resonator structure, as shown in FIG. 42.

According to the above embodiment, the second lower semiconductor DBR $103_2$ includes three pairs of the low and high refractive index layers 103a and 103b; however, the present invention is not limited to the case.

Figure 43:
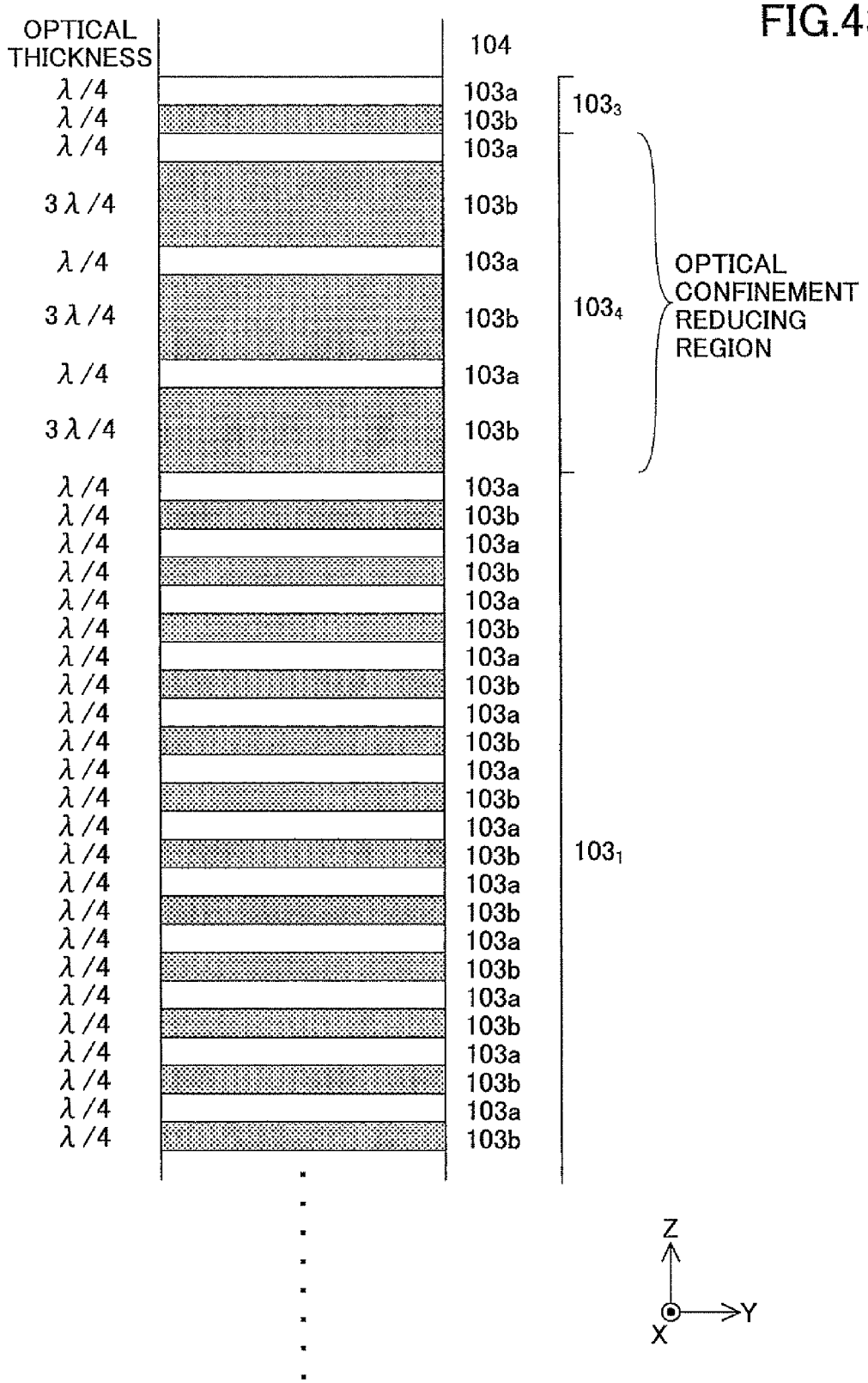
FIG. 43 illustrates a second modification of the optical confinement reducing region.

In the above embodiment, a fourth lower semiconductor DBR $103_4$ shown in FIG. 43 may be used in place of the second lower semiconductor DBR $103_2$. The fourth lower semiconductor DBR $103_4$ includes three pairs of the low and high refractive index layers 103a and 103b. As in the optical confinement reduction region B, each low refractive index layer 103a has an optical thickness of $\lambda/4$ and each high refractive index layer 103b has an optical thickness of $3\lambda/4$.

Figure 44:
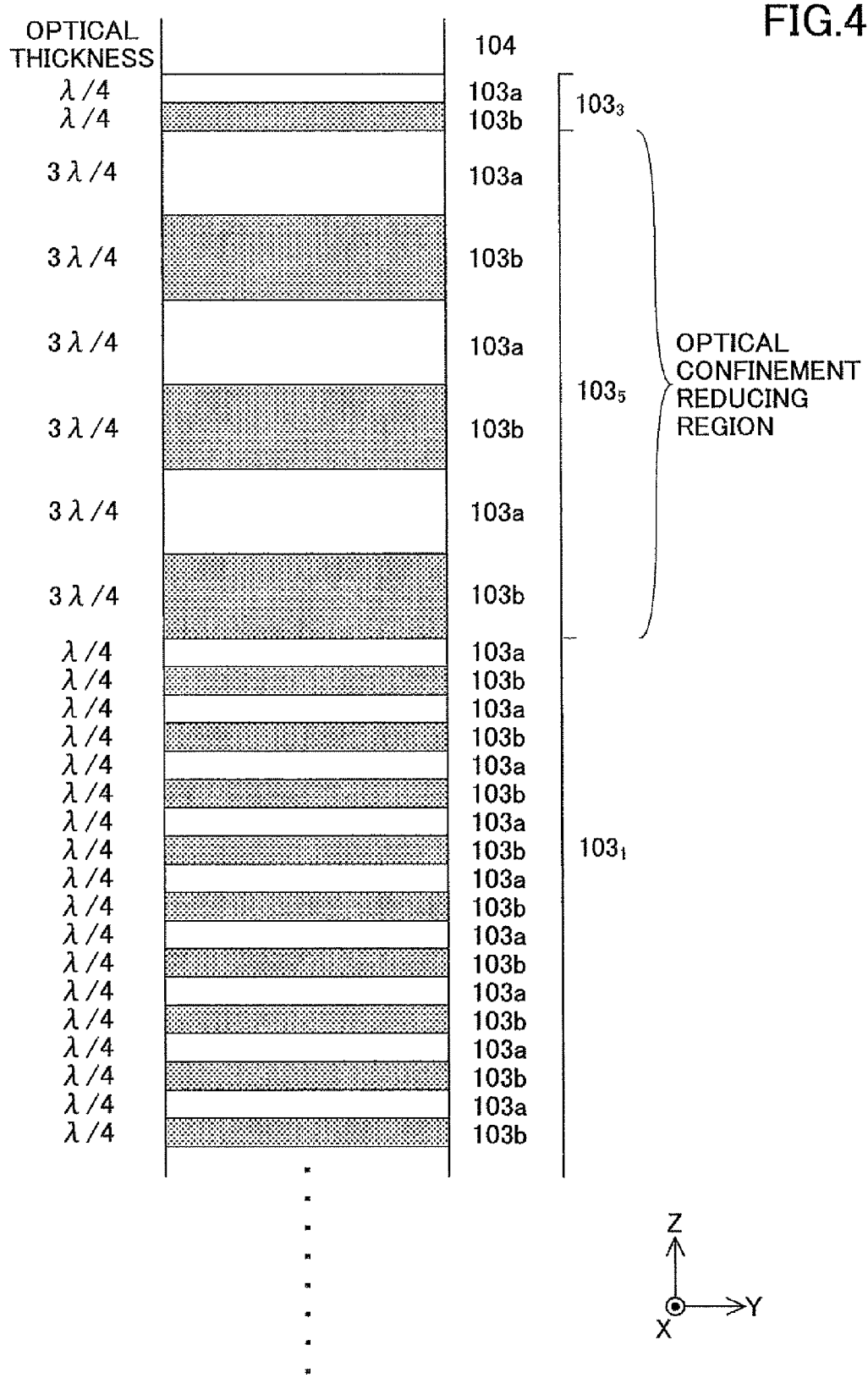
FIG. 44 illustrates a third modification of the optical confinement reducing region.

In the above embodiment, a fifth lower semiconductor DBR $103_5$ shown in FIG. 44 may be used in place of the second lower semiconductor DBR $103_2$. The fifth lower semiconductor DBR $103_5$ includes three pairs of the low and high refractive index layers 103a and 103b. As in the optical confinement reduction region C, each low refractive index layer 103a has an optical thickness of $3\lambda/4$ and each high refractive index layer 103b has an optical thickness of $3\lambda/4$.

Figure 45:
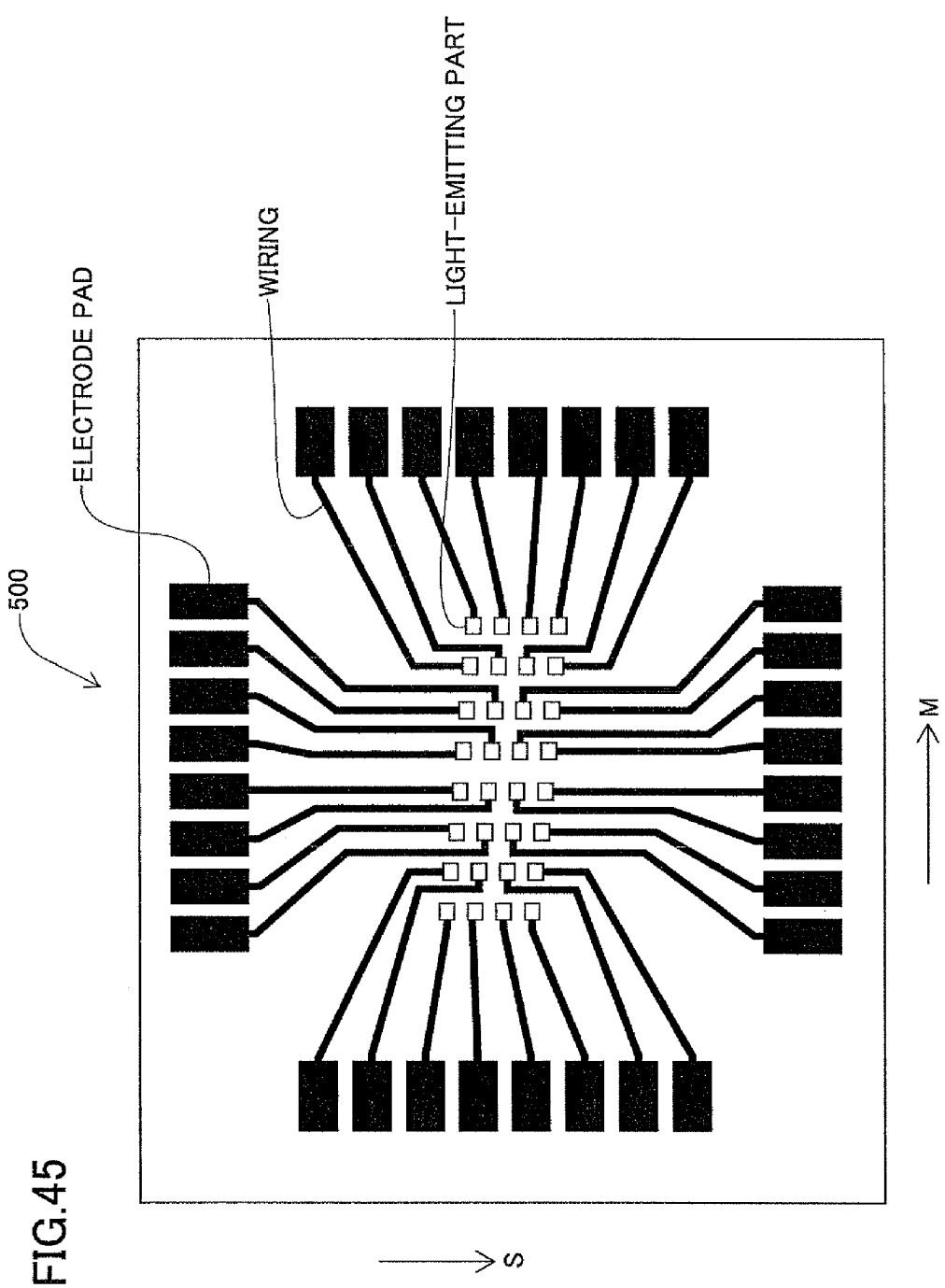
FIG. 45 shows a vertical cavity surface emitting laser array.

In the above embodiment, the light source may include a vertical cavity surface emitting laser array 500 shown in FIG. 45 as an example, in place of the vertical cavity surface emitting laser device 100.

In the vertical cavity surface emitting laser array 500, multiple (in this case, 32) light-emitting parts are arranged on a single substrate. In FIG. 45, the M direction is the main scanning corresponding direction and the S direction is the sub-scanning corresponding direction. Note that the number of light-emitting parts is not limited to 32.

The vertical cavity surface emitting laser array 500 includes light-emitting parts of four rows by eight columns, in which the columns are equally spaced along the T direction, which is tilted from the M direction to the S direction, as shown in FIG. 14. More specifically, if each light-emitting part is orthographically projected on a hypothetical line along the S direction, the center point of the light-emitting part is shifted from the center point of the nearest neighboring light-emitting part in the M direction by a uniform amount of c on the hypothetical line. Thus, in the S direction, the light-emitting parts have equal intervals of d. That is, the thirty-two light-emitting parts are aligned in a two-dimensional array. Note that in this specification, the term "light-emitting part spacing" refers to a center-to-center spacing between two neighboring light-emitting parts.

In this case the spacing c is 3 μm, the spacing d is 24 μm, and the light-emitting part spacing X in the M direction (see FIG. 46) is 30 μm.

Figure 46:
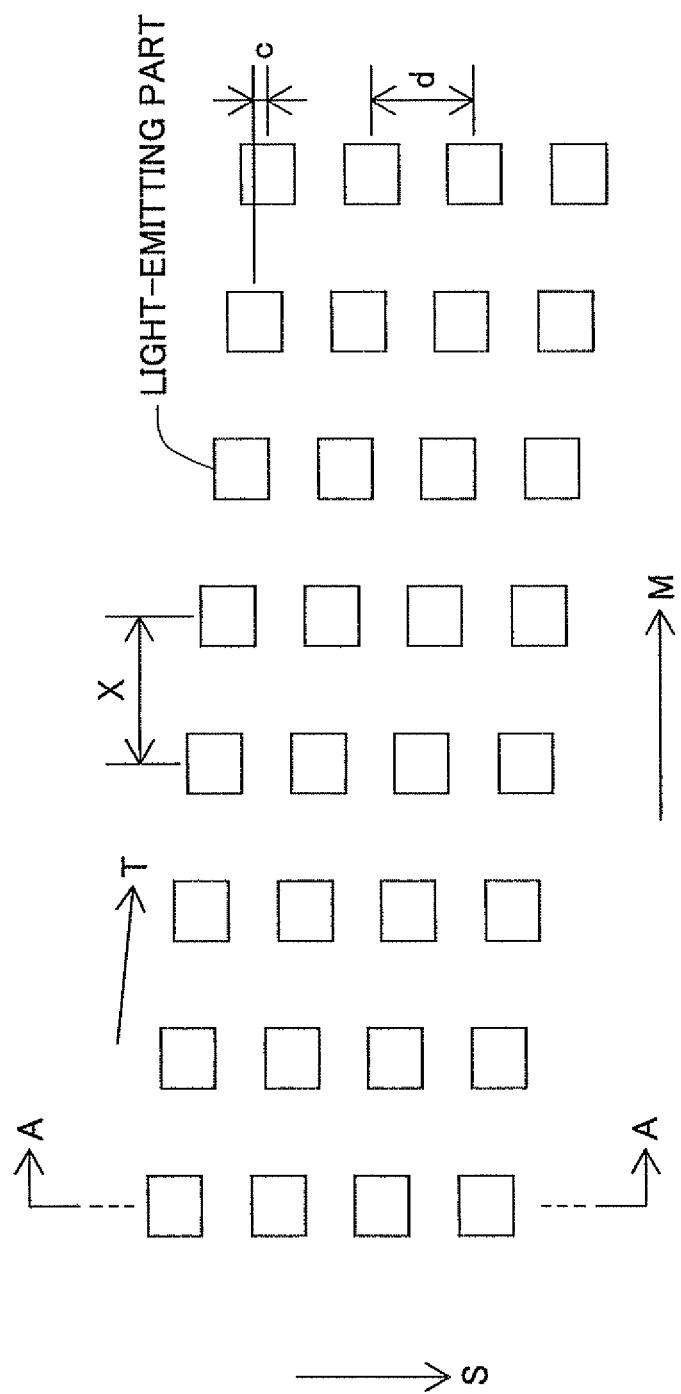
FIG. 46 shows a two-dimensional array of light-emitting parts of FIG. 45.
Figure 47:
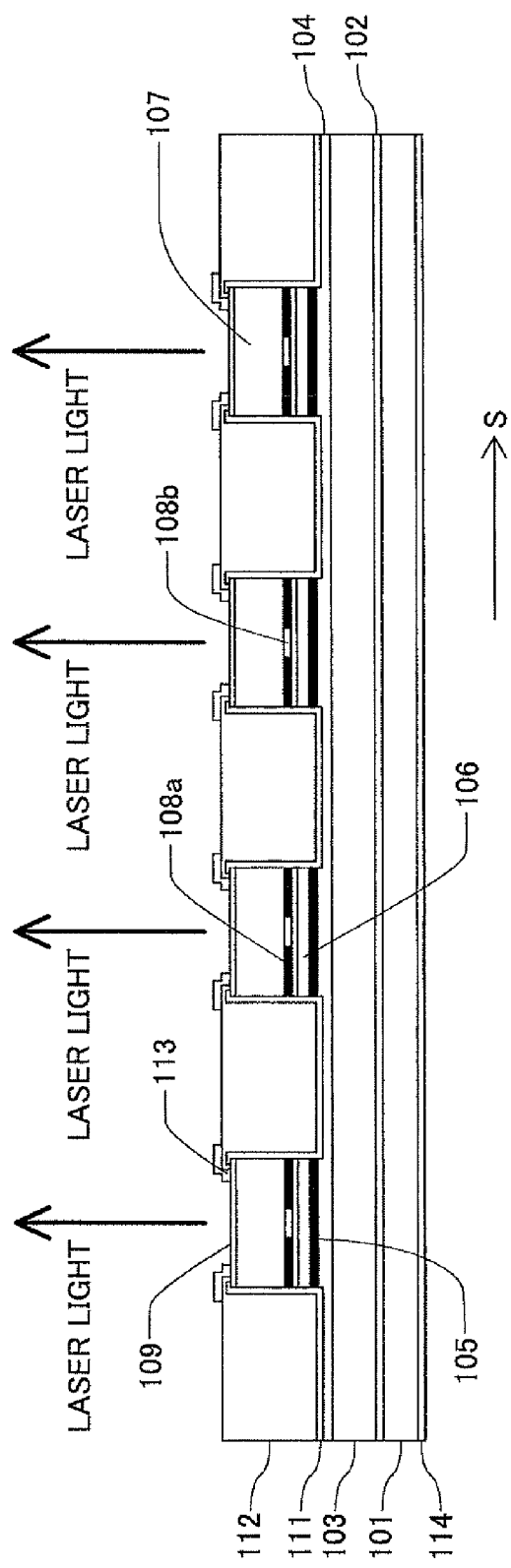
FIG. 47 is a cross-sectional view along A-A line of FIG. 46.

Each light-emitting part has the same configuration as that of the above-described vertical cavity surface emitting laser device 100, as illustrated in FIG. 47, which is a cross-sectional view along A-A line shown in FIG. 46. The vertical cavity surface emitting laser array 500 is manufactured in the same manner as described for the vertical cavity surface emitting laser device 100.

Thus, since including integrated vertical cavity surface emitting laser devices 100, the vertical cavity surface emitting laser array 500 is able to achieve the same effect as the vertical cavity surface emitting laser device 100. Especially in the case of taking the array configuration, variation in the thickness profile of the oxidized layer 108a and variation in the oxidation spread among the light-emitting parts are significantly small. Therefore, various characteristics including the droop characteristic are uniform, and therefore, the drive control is readily performed. Variation in the operating life among the light-emitting parts is also small, and long operating life is achieved.

According to the vertical cavity surface emitting laser array 500, if each light-emitting part is orthographically projected on a hypothetical line along the sub-scanning corresponding direction, the center point of the light-emitting part is shifted from the center point of the nearest neighboring light-emitting part in the M direction by the uniform amount of c on the hypothetical line. Accordingly, by adjusting the lighting timing of the light-emitting parts, the configuration of the vertical cavity surface emitting laser array 500 is regarded on the photoreceptor drum 1030 as if the light-emitting parts are aligned at equal intervals in the sub-scanning direction.

Since the spacing c is 3 μm, if the magnification of the optical system of the optical scanning apparatus 1010 is set to about 1.8 times, high-density writing with a density of 4800 dpi (dots/inch) can be achieved. In addition, a further increase in density can be achieved by increasing the number of light-emitting parts in the main scanning corresponding direction, narrowing the spacing d so as to reduce the spacing c in the array configuration, or reducing the magnification of the optical system, whereby higher quality printing is achieved. Note that the writing interval in the main scanning direction is readily controlled by adjusting the lighting timing of the light-emitting parts.

In this case, even if the writing dot density is increased, the laser printer 1000 performs printing without slowing down the printing speed. Or in the case of not changing the writing dot density, the printing speed can be increased.

A trench between two adjacent light-emitting parts is preferably 5 μm or more in order to allow each light-emitting part to be electrically and spatially isolated from each other. This is because if the trench is too narrow, it is difficult to control etching during the manufacturing process. Note that the mesa preferably has a size of 10 μm or more (length of one side). This is because if the mesa is too small, heat is kept inside during operations, which may cause characteristic degradation.

According to the above embodiment, the mesa shape is square on a cross section perpendicular to the laser oscillation direction; however, the present invention is not limited to this case. The mesa shape may be arbitrary, for example, circular, elliptical or rectangular.

The above embodiment describes the case in which the oscillation wavelength of the light-emitting part is in the 780 nm band; however, the present invention is not limited to this case. The oscillation wavelength of the light-emitting part may be changed according to the characteristics of the photoreceptor.

The vertical cavity surface emitting laser device 100 and the vertical cavity surface emitting laser array 500 may be used in apparatuses other than image forming apparatuses. In such a case, the oscillation wavelength may be changed to a 650 nm band, 850 nm band, 980 nm band, 1.3 μm band, 1.5 μm band or the like according to application needs.

In the above embodiment, a vertical cavity surface emitting laser array having one-dimensionally arranged light-emitting parts similar to the vertical cavity surface emitting laser devices 100 may be used in place of the vertical cavity surface emitting laser device.

In the above embodiment, the laser printer 1000 is used as an example of the image forming apparatus; however, the present invention is not limited to this case.

For example, the present invention may be an image forming apparatus for projecting laser light directly onto a medium (e.g. paper), on which a color is developed with the laser light.

The present invention may be applied to an image forming apparatus using a silver salt film as an image carrier. In this case, a latent image is formed on the silver salt film by optical scanning, and then visible by a process equivalent to the development process of regular silver halide photography. The visualized image is transferred to printing paper by a process equivalent to the printing process of the regular silver halide photography. Such an image forming apparatus can be used as an optical plate making apparatus or an optical plotting apparatus for plotting CT scanned images and the like.

Figure 48:
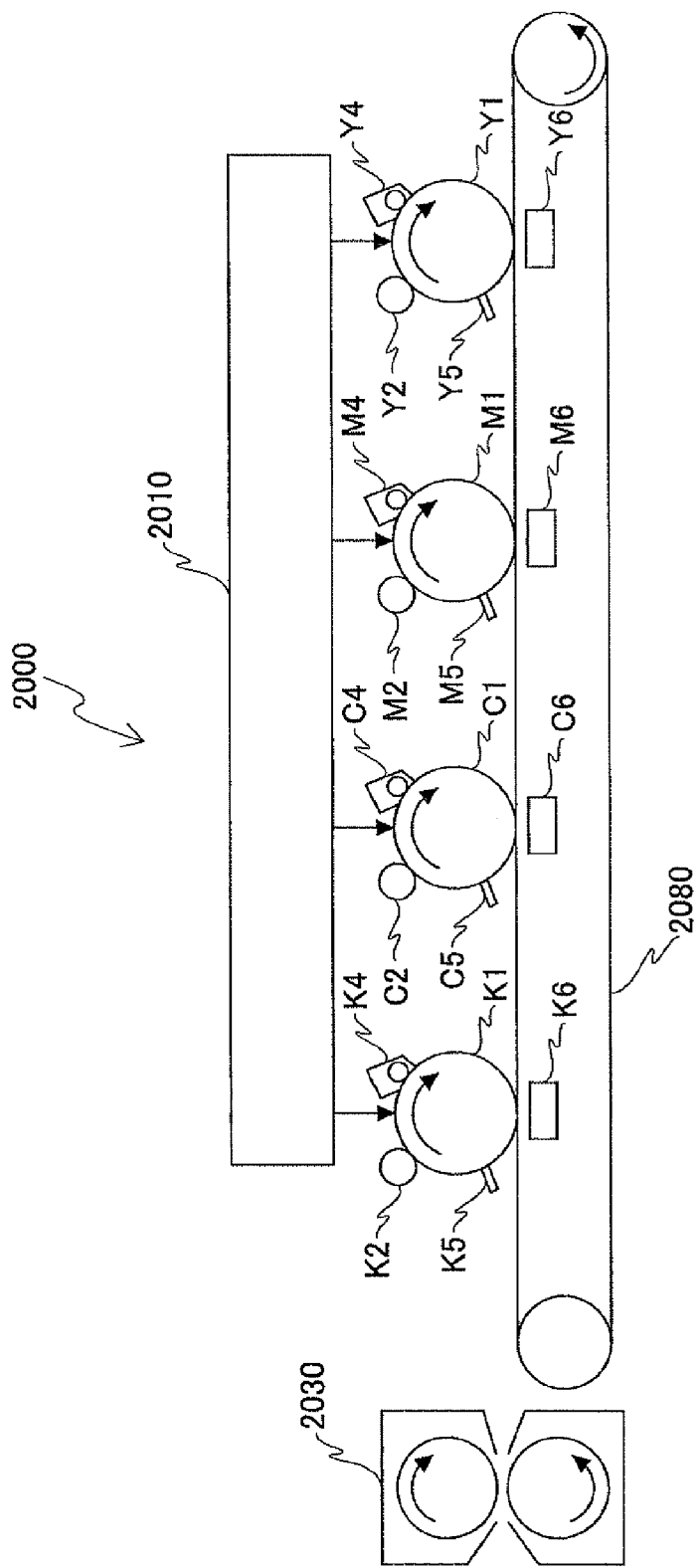
FIG. 48 is a schematic structure of a color printer.

The present invention may be a color printer 2000 having multiple photoreceptor drums, as an example as shown in FIG. 48.

The color printer 2000 is a tandem-type multi-color printer for forming a full color image by superimposing four colors (black, cyan, magenta and yellow). The color printer 2000 includes a black photoreceptor drum K1, a black charging device K2, a black developing device K4, a black cleaning unit K5 and a black transfer device K6; a cyan photoreceptor drum C1, a cyan charging device C2, a cyan developing device C4, a cyan cleaning unit C5 and a cyan transfer device C6; a magenta photoreceptor drum M1, a magenta charging device M2, a magenta developing device M4, a magenta cleaning unit M5 and a magenta transfer device M6; a yellow photoreceptor drum Y1, a yellow charging device Y2, a yellow developing device Y4, a yellow cleaning unit Y5 and a yellow transfer device Y6; an optical scanning apparatus 2010; a transfer belt 2080; a fixing unit 2030 and the like.

Each photoreceptor drum rotates in the direction of the arrow shown in FIG. 48, and the corresponding charging device, developing device, transfer device and cleaning unit are sequentially disposed around the photoreceptor drum along the rotation direction. Each charging device uniformly charges the surface of the corresponding photoreceptor. The surface of the photoreceptor drum charged by the charging device is irradiated with light emitted from the optical scanning apparatus 2010, and a latent image is formed on the photoreceptor drum. Then, a toner image is formed on the surface of each photoreceptor drum by the corresponding developing device. Each transfer device transfers the corresponding color toner image onto a recording sheet on the transfer belt 2080, and, eventually, the transferred superimposed toner images are fixed on the recording sheet by the fixing unit 2030.

The optical scanning apparatus 2010 has a light source for each color, which includes either one of a vertical cavity surface emitting laser device similar to the vertical cavity surface emitting laser device 100 and a vertical cavity surface emitting laser array similar to the vertical cavity surface emitting laser array 500. Accordingly, the optical scanning apparatus 2010 produces an effect similar to that of the optical scanning apparatus 1010. The color printer 2000 includes the optical scanning apparatus 2010, and therefore is able to produce an effect similar to that of the laser printer 1000.

The color printer 2000 may cause color misregistration due to manufacturing errors, positional errors and the like. Even in such a case, if each light source of the optical scanning apparatus 2010 includes a vertical cavity surface emitting laser array equivalent to the vertical cavity surface emitting laser array 500, the color printer 2000 selects light-emitting parts to be lit, thereby reducing color misregistration.

c. Second Embodiment

The second embodiment of the present invention aims at providing a vertical cavity surface emitting laser device and a vertical cavity surface emitting laser array that have longer operating life, high luminous efficiency and excellent temperature characteristics.

The vertical cavity surface emitting laser device 100 of the present embodiment can also be applied to the light source 14 of the laser printer 1000, as in the first embodiment. In the present embodiment, the same reference numerals are given to the components which are common to those of the first embodiment, and their explanations are omitted.

The vertical cavity surface emitting laser device 100 of the present embodiment is designed to have an oscillation wavelength of 780 nm band, and includes the substrate 101, the lower semiconductor DBR 103, the lower spacer layer 104, the active layer 105, the upper spacer layer 106, the upper semiconductor DBR 107 and the contact layer 109.

The substrate 101 is an n-GaAs monocrystalline substrate.

The lower semiconductor DBR 103 includes the first lower semiconductor DBR $103_1$, the second lower semiconductor DBR $103_2$ and the third lower semiconductor DBR $103_3$, as an example as shown in FIG. 51.

Figure 65:
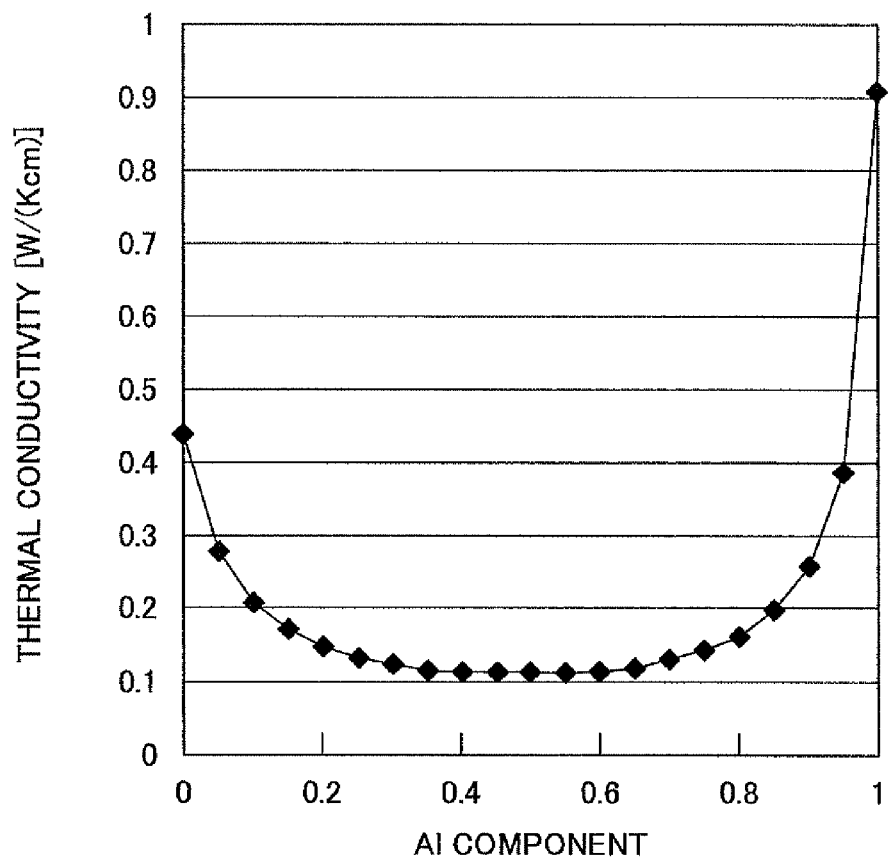
FIG. 65 shows a relationship between an Al component and thermal conductivity of an AlGaAs material.

The first lower semiconductor DBR $103_1$ is laid over a +Z-direction surface of the substrate 101 with a buffer layer (not shown) interposed between them. The first lower semiconductor DBR $103_1$ includes 36.5 pairs of the n-AlAs low refractive index layer 103a and the n-$Al_{0.3}Ga_{0.7}As$ high refractive index layer 103b. The low refractive index layer 103a has higher thermal conductivity compared to the high refractive index layer 103b (see FIG. 65). In order to reduce electrical resistance, a compositionally graded layer (not shown) is provided between each two neighboring refractive index layers. In the compositionally graded layer, the composition is gradually changed from one to another. It is designed that each refractive index layer has an optical thickness of $\lambda/4$, where $\lambda$ is an oscillation wavelength, by including ½ the thickness of its neighboring compositionally graded layer.

The second lower semiconductor DBR $103_2$ is laid on a +Z-direction surface of the first lower semiconductor DBR $103_1$, and includes three pairs of the low refractive index layer 103a and the high refractive index layer 103b. In order to reduce electrical resistance, a compositionally graded layer (not shown) is provided between each two neighboring refractive index layers. It is designed that each low refractive index layer 103a has an optical thickness of $3\lambda/4$ by including ½ the thickness of its neighboring compositionally graded layer, and each high refractive index layer 103b has an optical thickness of $\lambda/4$ by including ½ the thickness of its neighboring compositionally graded layer. The second lower semiconductor DBR $103_2$ is a "heat-releasing structure". The low refractive index layers 103a in the second lower semiconductor DBR $103_2$ are "heat-releasing layers".

The third lower semiconductor DBR $103_3$ is laid on a +Z-direction surface of the second lower semiconductor DBR $103_2$, and includes a pair which includes the low refractive index layer 103a and the high refractive index layer 103b. In order to reduce electrical resistance, a compositionally graded layer (not shown) is provided between each two neighboring refractive index layers. It is designed that each refractive index layer has an optical thickness of $\lambda/4$ by including ½ the thickness of its neighboring compositionally graded layer.

Thus, the lower semiconductor DBR 103 includes 40.5 pairs of low and high refractive index layers.

The lower spacer layer 104 is laid on a +Z-direction surface of the third lower semiconductor DBR $103_3$, and is a non-doped $(Al_{0.1}Ga_{0.9})_{0.5}In_{0.5}P$ layer.

The active layer 105 is laid on a +Z-direction surface of the lower spacer layer 104, and includes three quantum well layers 105a and four barrier layers 105b, as an example as shown in FIG. 5. Each quantum well layer 105a is made of GaInPAs, which is a composition inducing compressive strain, and has a band gap wavelength of about 780 nm. Each barrier layer 105b is made of $Ga_{0.6}In_{0.4}P$, which is a composition inducing tensile strain.

The upper spacer layer 106 is laid on a +Z-direction surface of the active layer 105, and is a non-doped $(Al_{0.1}Ga_{0.9})_{0.5}In_{0.5}P$ layer.

A section including the lower spacer layer 104, the active layer 105 and the upper spacer layer 106 is referred to as a resonator structure, which is designed to have an optical thickness of $\lambda$. The active layer 105 is provided in the center of the resonator structure, which corresponds to antinodes of the standing wave of the electric field, in order to achieve a high stimulated emission rate.

Heat generated in the active layer 105 is designed to be released to the substrate 101 mainly via the lower semiconductor DBR 103. The back side of the substrate 101 is attached to a package using a conductive adhesive or the like, and heat is released from the substrate 101 to the package.

The upper semiconductor DBR 107 is laid on a +Z-direction surface of the upper spacer layer 106, and includes 24 pairs of a p-$Al_{0.9}Ga_{0.1}As$ low refractive index layer 107a and a p-$Al_{0.3}Ga_{0.7}As$ high refractive index layer 107b. In order to reduce electrical resistance, a compositionally graded layer (not shown) is provided between each two neighboring refractive index layers. It is designed that each refractive index layer has an optical thickness of $\lambda/4$ by including ½ the thickness of its neighboring compositionally graded layer.

In one low refractive index layer of the upper semiconductor DBR 107, a p-AlAs selective oxidation layer having a thickness of 30 nm is inserted. The selective oxidation layer is optically $5\lambda/4$ away from the upper spacer layer 106 and is disposed within the low refractive index layer of the third pair counted from the upper spacer layer 106.

The contact layer 109 is a p-GaAs layer laid on a +Z-direction surface of the upper semiconductor DBR 107.

Next is a brief description of a method for manufacturing the vertical cavity surface emitting laser device 100 of the present embodiment.

(1) The above-described laminated body is created by a crystal growth method, such as metal-organic chemical vapor deposition (MOCVD method) or molecular beam epitaxy (MBE method).

In this step, trimethylaluminium (TMA), trimethyl gallium (TMG) and trimethyl indium (TMI) are used as the group-III materials, and arsine ($AsH_3$) gas and phosphine ($PH_3$) gas are used as the group-V materials. In addition, carbon tetrabromide ($CBr_4$) is used as a p-type dopant, and hydrogen selenide ($H_2Se$) is used as an n-type dopant.

(2) A square resist pattern, each side of which is 20 μm, is formed on the surface of the laminated body.

(3) Using the square resist pattern as a photomask, a square columnar mesa is formed by ECR etching using $Cl_2$ gas. The etching bottom is positioned in the lower space layer 104. Note that the mesa preferably has a size of 10 μm or more (length of one side). This is because if the mesa is too small, heat is kept inside during operation, which may cause characteristic degradation.

(4) The photomask is removed.

(5) The laminated body is heat-treated in water vapor. In this step, Al in the selective oxidation layer is selectively oxidized from the periphery of the mesa. Accordingly, an unoxidized region 108a which is surrounded by an AL oxidized layer 108b is left in the center of the mesa. In this manner, an oxidized current confinement structure is formed, in which a pathway of the current for driving a light-emitting part is limited to the center of the mesa. The unoxidized region 108a functions as a current passage region (current injection region). Appropriate conditions of the heat treatment (holding temperature, holding time and the like) are selected based on results of various preliminary experiments so that the current passage region 108a has a desired size.

(6) The protective layer 111 made of SiN or $SiO_2$ is formed by chemical vapor deposition (CVD method).

(7) Polyimide 112 is used to planarize the laminated body.

(8) Apertures for p-electrode contact are provided on the top of the mesa. In this step, a photoresist mask is provided on the top of the mesa, and then, locations on the mesa, at which the apertures are to be formed, are exposed to light to remove the photoresist mask from the locations. Subsequently, the apertures are formed by buffered HF (BHF) etching the polyimide 112 and the protective layer 111.

(9) A square resist pattern, each side of which is 10 μm, is formed on the top of the mesa at a region to be a light emitting part, and p-electrode materials are then vapor-deposited. The p-electrode materials include Cr/AuZn/Au or Ti/Pt/Au and are deposited in multilayer form.

(10) The p-electrode materials over the region to be a light emitting part are lifted off, whereby a p-electrode 113 is formed.

(11) The back side of the substrate 101 is polished so as to have a predetermined thickness (about 100 μm, for example), and then, an n-electrode 114 is formed. The n-electrode 114 is a multilayer film made of AuGe/Ni/Au.

(12) The p-electrode 113 and the n-electrode 114 are ohmically connected by annealing. Accordingly, the mesa becomes a light-emitting part.

(13) The laminated body is cut into chips.

Figure 52:
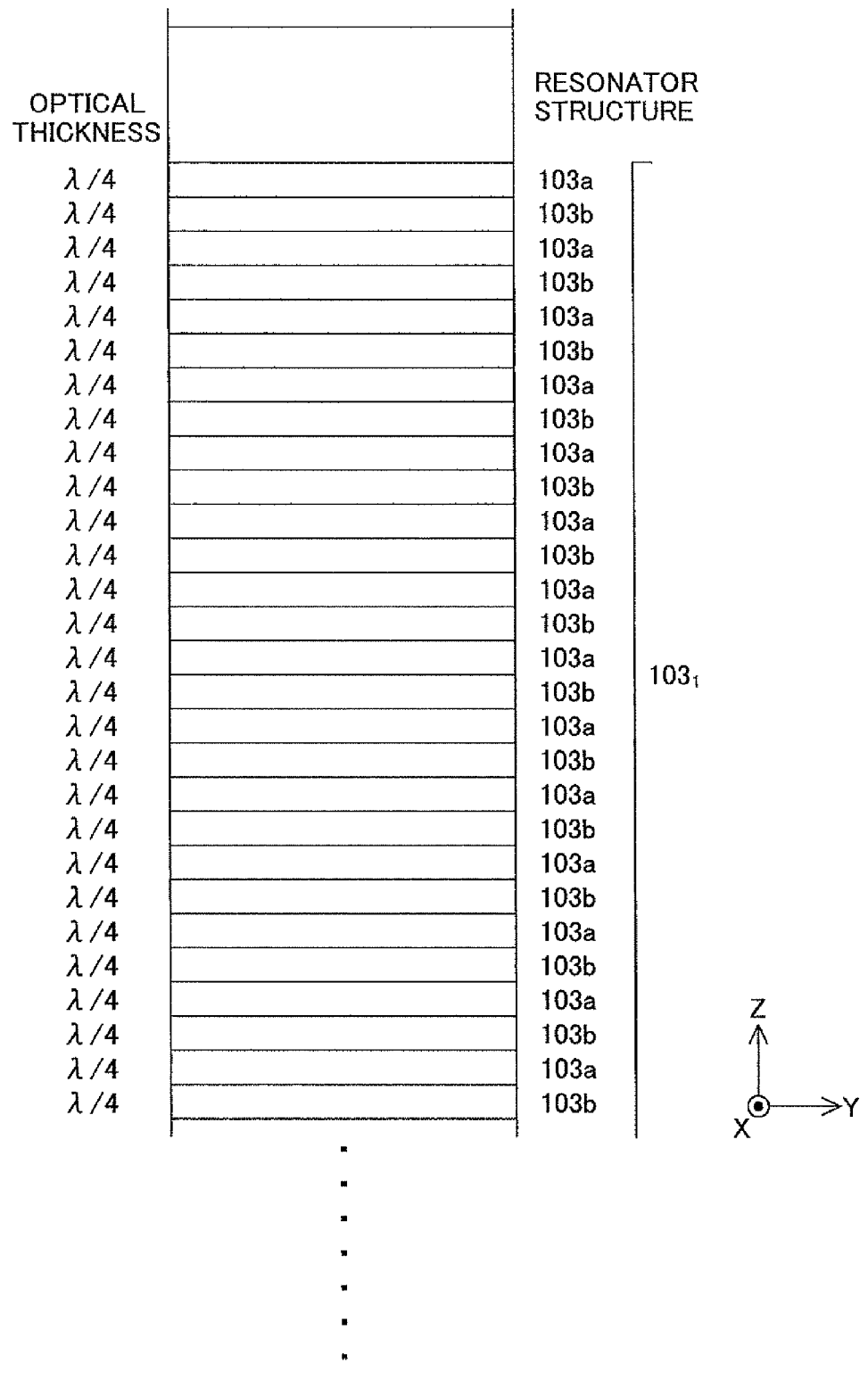
FIG. 52 shows the lower semiconductor DBR of Example 1.
Figure 53:
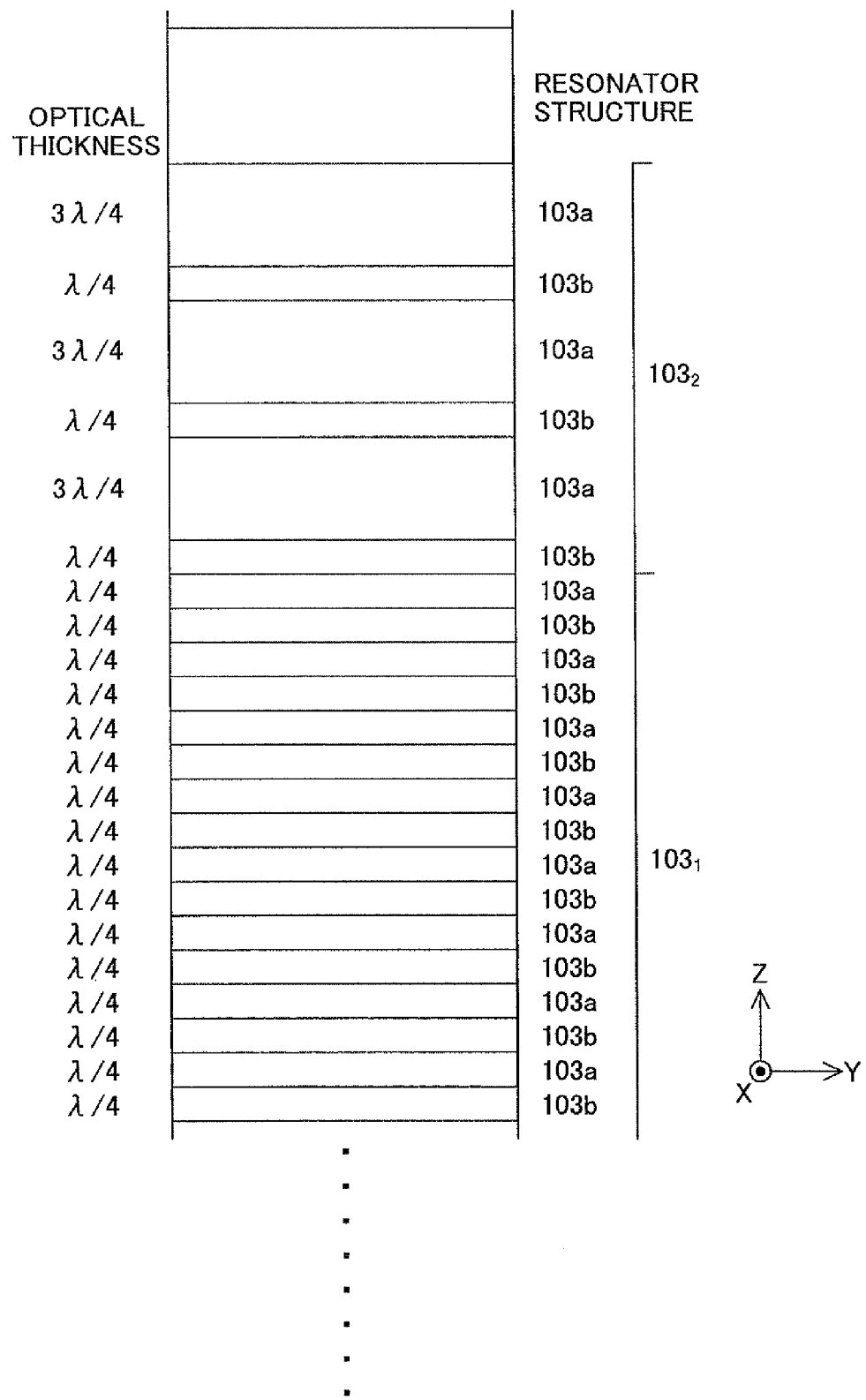
FIG. 53 shows the lower semiconductor DBR of Example 2.
Figure 54:
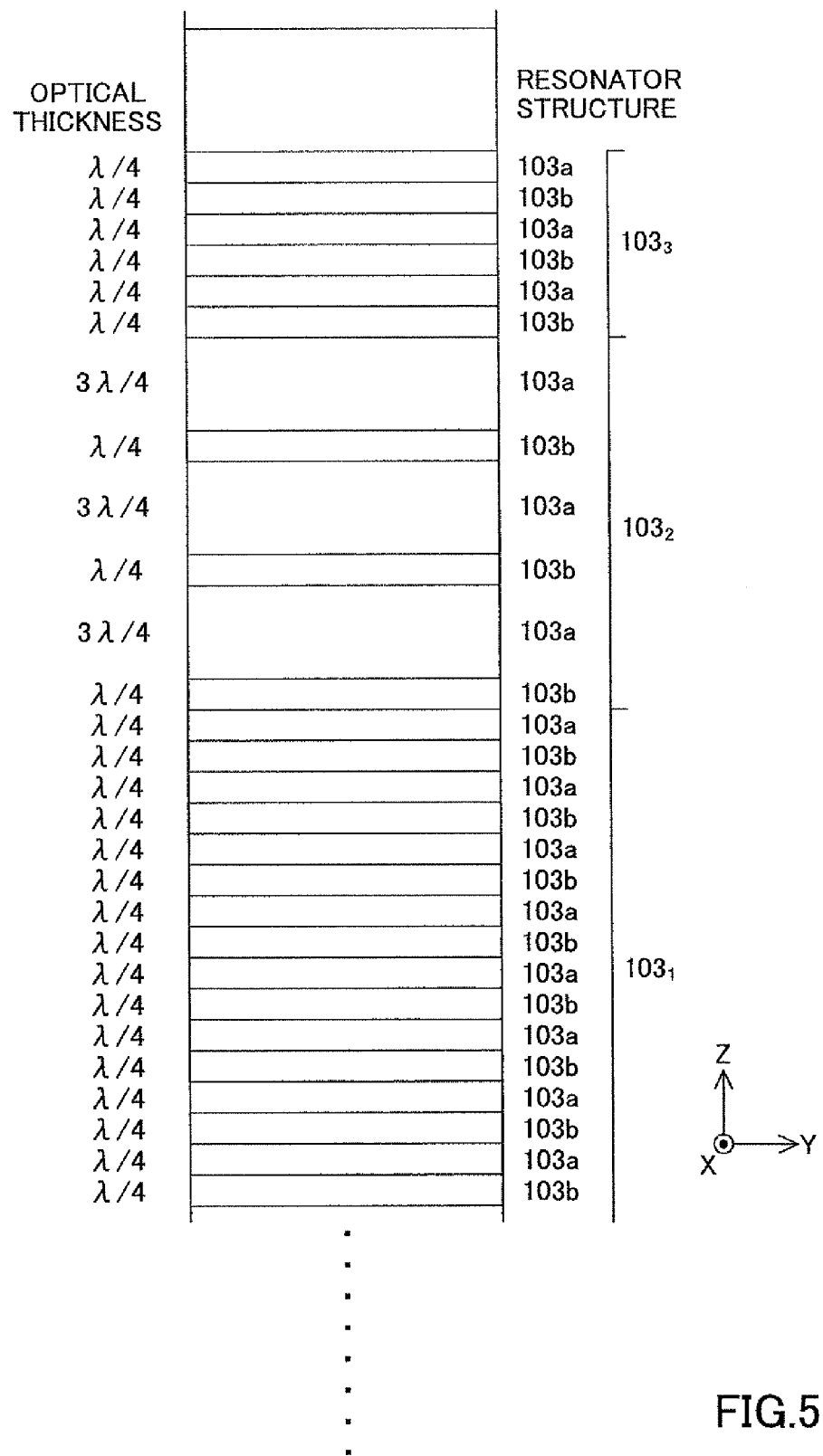
FIG. 54 shows the lower semiconductor DBR in which a third lower semiconductor DBR includes three pairs of refractive index layers.

In an experiment, absorption losses were determined for the following three examples: Example 1 in which the lower semiconductor DBR 103 includes only the first lower semiconductor DBR 103$_1$ with 40.5 pairs of refractive index layers (see FIG. 52); Example 2 in which the lower semiconductor DBR 103 includes the first lower semiconductor DBR 103$_1$ with 37.5 pairs of refractive index layers and the second lower semiconductor DBR 103$_2$ with three pairs of refractive index layers (see FIG. 53); and Example 3 in which the lower semiconductor DBR 103 includes the first lower semiconductor DBR 103$_1$ with 36.5 pairs of refractive index layers, the second lower semiconductor DBR 103$_2$ with three pairs of refractive index layers, and the third lower semiconductor DBR 103$_3$ with a pair of refractive index layers, as in the case of the present embodiment. According to the experiment, an increase in the absorption loss of Example 3 compared to the absorption loss of Example 1 is about 77%, when an increase in the absorption loss of Example 2 compared to the absorption loss of Example 1 is regarded as 100%. That is, it is understood that the third lower semiconductor DBR 103$_3$ reduces the increase in the absorption loss by about 23%. Note that in the case where the third lower semiconductor DBR 103$_3$ includes three pairs of refractive index layers (see FIG. 54), an increase in the absorption loss compared to the absorption loss of Example 1 is about 46%.

The experiment also shows that, even if the impurity concentration (impurity doping concentration) is changed between $3 \times 10^{18}$ (cm$^{-3}$) and $5 \times 10^{18}$ (cm$^{-3}$), the same decreasing effect on the absorption loss is obtained. In addition, although the wavelength is changed, the same decreasing effect on the absorption loss is obtained. Furthermore, even if 5 pairs of refractive index layers are provided in the second lower semiconductor DBR 103$_2$, the same decreasing effect on the absorption loss is obtained.

The heat resistance of the lower semiconductor DBR 103 of the present embodiment is 2720 (K/W). On the other hand, the heat resistance of Example 1 (see FIG. 52) and Example 2 (see FIG. 53) are 3050 (K/W) and 2670 (K/W), respectively. Accordingly, it is understood that the third lower semiconductor DBR 103$_3$ has little adverse effect on the heat resistance of the lower semiconductor DBR 103.

Figure 55:
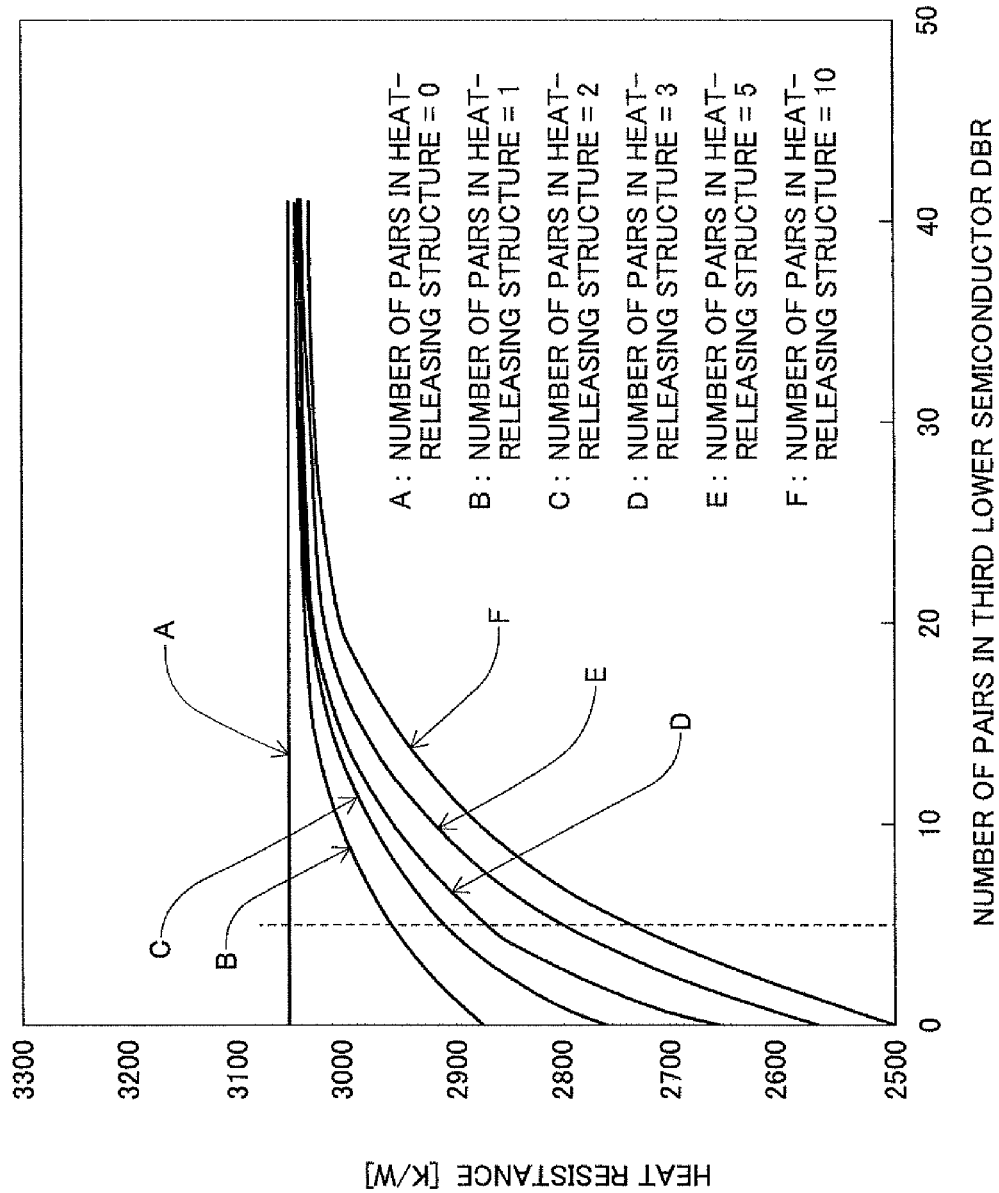
FIG. 55 shows calculated results of heat resistance.

FIG. 55 shows a relationship between the number of pairs of refractive index layers in the third lower semiconductor DBR 103$_3$ and the heat resistance of the lower semiconductor DBR 103. According to FIG. 55, if the number of pairs exceeds 5, the heat release effect by the second lower semiconductor DBR 103$_2$ becomes half or less. Accordingly, the third lower semiconductor DBR 103$_3$ preferably includes one to five pairs of refractive index layers.

A heat release layer causes an increase in the absorption loss but also may reduce crystallinity of a layer laid on top of the heat release layer. If the active layer laid on top (+z direction in this case) of the heat release layer has less crystallinity, the luminous efficiency is decreased. In the case where the lower semiconductor DBR 103 includes only the second lower semiconductor DBR 103$_2$ with 40.5 pairs of refractive index layers, a significant effect of heat release is achieved; however, the crystallinity of the active layer is difficult to maintain. Therefore, the second lower semiconductor DBR 103$_2$ preferably includes one to five pairs of refractive index layers. The third lower semiconductor DBR 103$_3$ also restores the crystallinity of the active layer laid on top of the third lower semiconductor DBR 103$_3$, thus reducing an adverse effect on the active layer.

As for a vertical cavity surface emitting laser having an oxidized current confinement structure, etching is applied during the manufacturing process to obtain a mesa shape or the like in order to provide electrical or spatial isolation from the surroundings. At this point, etching should be performed deeper than the selective oxidation layer so as to allow selective oxidation of Al. The selective oxidation layer is in general provided near the active layer of a A-side semiconductor DBR (the upper semiconductor DBR disposed on the upper side of the active layer) in order to reduce current spread, and more specifically, provided at a position corresponding to the first to fifth node of the laser-light standing wave of the electric field from the active layer. However, due to problems with controllability of the etching depth, it is difficult to control etching so that the bottom of etching reaches deeper than the selective oxidation layer but does not reach the lower semiconductor DBR. Especially, to control the etching depth across the entire wafer requires not only control of the etching time but also uniformity of etching over the wafer surface and uniformity of thickness of the crystal growth layer. Thus, it is extremely difficult from the production standpoint to perform etching in such a manner that the bottom of etching does not reach the lower semiconductor DBR.

Given this factor, it has been proposed to make the lower semiconductor DBR two-tier (see Japanese Laid-open Patent Application Publication No. 2003-347670, for example). According to the proposal, AlAs having a markedly higher thermal conductivity than AlGaAs is used for, in the lower semiconductor DBR, most of the low refractive index layers disposed closer to the substrate, and AlGaAs is used as in the conventional manner for, in the lower semiconductor DBR, low refractive index layers disposed closer to the active layer. In this case, however, it is difficult to increase the thermal conductivity of refractive index layers disposed near the resonator structure.

According to the vertical cavity surface emitting laser device 100 of the present embodiment, the semiconductor DBRs are mainly made of an AlGaAs material and the resonator structure is made of an AlGaInPAs material, which includes In. In this case, the etching rate of the resonator structure can be set lower than the etching rate of the semiconductor DBRs. Accordingly, it is possible to readily detect whether the bottom of etching reaches the resonator structure, using an etching monitor. Herewith, it is possible to perform etching up to the vicinity of the center of the resonator structure with high accuracy and reduce the spread of carriers, thus reducing carriers which do not contribute to oscillation.

As clear from the above explanation, according to the vertical cavity surface emitting laser device 100 of the present embodiment, the lower semiconductor DBR 103 is a first semiconductor multilayer reflector and the upper semiconductor DBR 107 is a second semiconductor multilayer reflector, as described in the appended claims. In addition, the second lower semiconductor DBR $103_2$ is a first partial reflector, and the third lower semiconductor DBR $103_3$ is a second partial reflector.

The high refractive index layer 103b is a first layer and the low refractive index layer 103a is a second layer.

As has been described above, the vertical cavity surface emitting laser device 100 of the present embodiment has the resonator structure including the active layer 105 between the lower semiconductor DBR 103 and the upper semiconductor DBR 107, both of which include multiple pairs of low and high refractive index layers. The lower semiconductor DBR 103 includes the first lower semiconductor DBR $103_1$ including 36.5 pairs of refractive index layers; the second lower semiconductor DBR $103_2$ including 3 pairs of refractive index layers; and the third lower semiconductor DBR $103_3$ including a pair of refractive index layers. In the lower semiconductor DBR 103, each pair includes the n-AlAs low refractive index layer 103a having high thermal conductivity and the n-$Al_{0.3}Ga_{0.7}As$ high refractive index layer 103b having thermal conductivity lower than that of the low refractive index layer 103a.

In the second lower semiconductor DBR $103_2$, the low refractive index layer 103a is designed to have an optical thickness of $3\lambda/4$ by including ½ the thickness of its neighboring compositionally graded layer, and the high refractive index layer 103b is designed to have an optical thickness of $\lambda/4$ by including ½ the thickness of its neighboring compositionally graded layer.

The second lower semiconductor DBR $103_3$ is disposed between the resonator structure and the second lower semiconductor DBR $103_2$. Each refractive index layer is designed to have an optical thickness of $\lambda/4$ by including ½ the thickness of its neighboring compositionally graded layer.

According to the above-described configuration, it is possible to increase the heat release efficiency while reducing an increase in the absorption loss. Herewith, the vertical cavity surface emitting laser device 100 of the present embodiment has longer operating life, high luminous efficiency and excellent temperature characteristics.

As to the optical scanning apparatus 1010 of the present embodiment, since the light source 14 of the optical scanning apparatus 1010 has the vertical cavity surface emitting laser device 100, the optical scanning apparatus 1010 is capable of performing stable optical scanning.

As to the laser printer 1000 of the present embodiment, the laser printer 1000 is capable of forming a high quality image since including the optical scanning apparatus 1010.

In addition, the operating life of the vertical cavity surface emitting laser device 100 is dramatically increased, which allows the writing unit or the light source unit to be used again.

d. Modifications of Second Embodiment

According to the above embodiment, in the second lower semiconductor DBR $103_2$, the low refractive index layer 103a is designed to have an optical thickness of $3\lambda/4$ by including ½ the thickness of its neighboring compositionally graded layer. However, the present invention is not limited to this case, and it suffices if the low refractive index layer 103a has an optical thickness satisfying $(2n+1)\lambda/4$ (n is an integer equal to or greater than 1) by including ½ the thickness of its neighboring compositionally graded layer.

According to the above embodiment, the second lower semiconductor DBR $103_2$ includes three pairs of the low refractive index layer 103a and the high refractive index layer 103b; however, the present invention is not limited to this case.

According to the above embodiment, the third lower semiconductor DBR $103_3$ includes a pair of the low refractive index layer 103a and the high refractive index layer 103b; however, the present invention is not limited to this case. The third lower semiconductor DBR $103_3$ may includes one to five pairs of the low refractive index layer 103a and the high refractive index layer 103b.

According to the above embodiment, the mesa shape is square on a cross section perpendicular to the laser oscillation direction; however, the present invention is not limited to this case. The mesa shape may be an arbitrary, for example, circular, elliptical or rectangular.

In the above embodiment, the impurity concentration of a part of the lower semiconductor DBR 103 adjacent to the resonator structure may be lowered as compared to the remaining part. The amount of absorption increases with an increase in the impurity concentration. Therefore, the impurity concentration of a part subjected to an influence of the absorption to a greater degree is made lower than that of a part having less influence of the absorption. In this way, it is possible to reduce the increase in the absorption, which is produced by increasing the thickness of the low refractive index layer. For example, the impurity concentration of four pairs in the lower semiconductor DBR 103 adjacent to the resonator structure may be $5\times10^{17}$ (cm$^{-3}$), and the impurity concentration of the remaining pairs may be $1\times10^{18}$ (cm$^{-3}$).

The above embodiment describes the case in which the oscillation wavelength of the light-emitting part is in the 780 nm band; however, the present invention is not limited to this case. The oscillation wavelength of the light-emitting part may be changed according to the characteristics of the photoreceptor.

The vertical cavity surface emitting laser device 100 may be used in apparatuses other than image forming apparatuses. In such a case, the oscillation wavelength may be changed to a 650 nm band, 850 nm band, 980 nm band, 1.3 µm band, 1.5 µm band or the like according to application needs.

Figure 56:
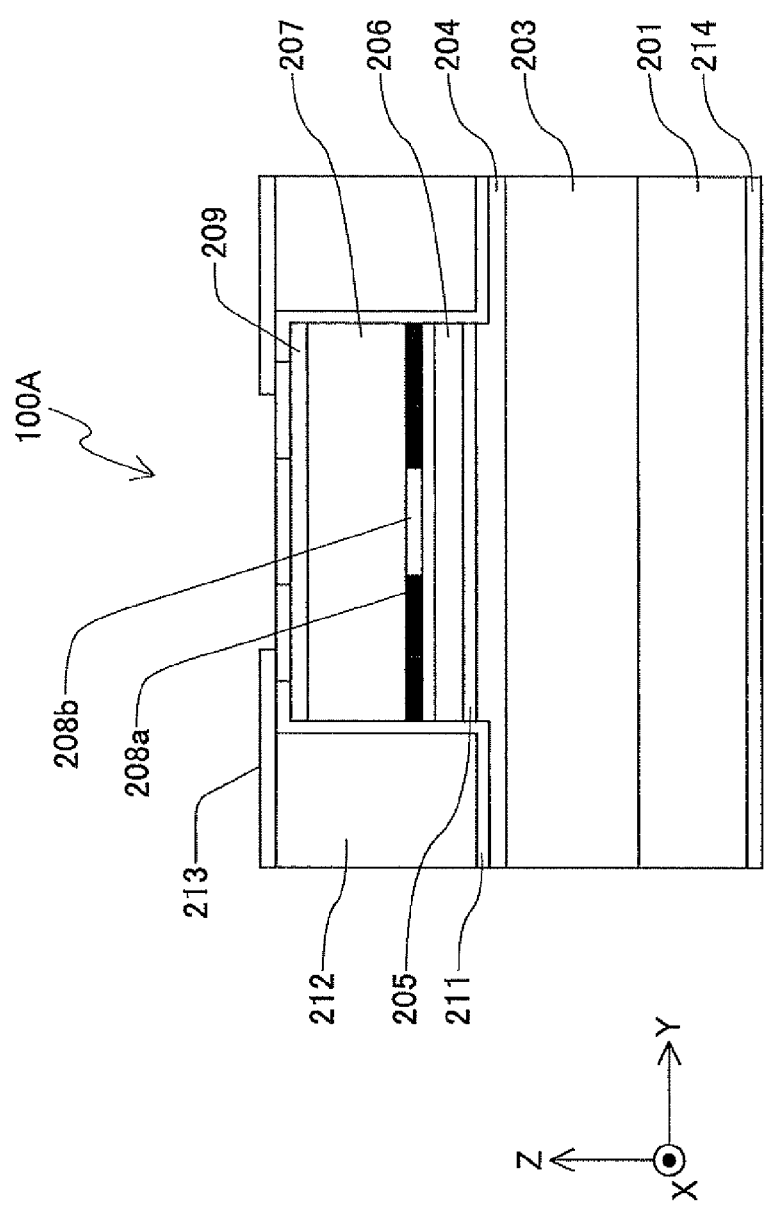
FIG. 56 shows a modification of the vertical cavity surface emitting laser device.

As an example, FIG. 56 shows a vertical cavity surface emitting laser device 100A designed to have an oscillation wavelength of 850 nm band.

The vertical cavity surface emitting laser device 100A includes a substrate 201, a lower semiconductor DBR 203, a lower spacer layer 204, an active layer 205, an upper spacer layer 206, an upper semiconductor DBR 207, a contact layer 209 and the like.

The substrate 201 is an n-GaAs monocrystalline substrate.

Figure 57:
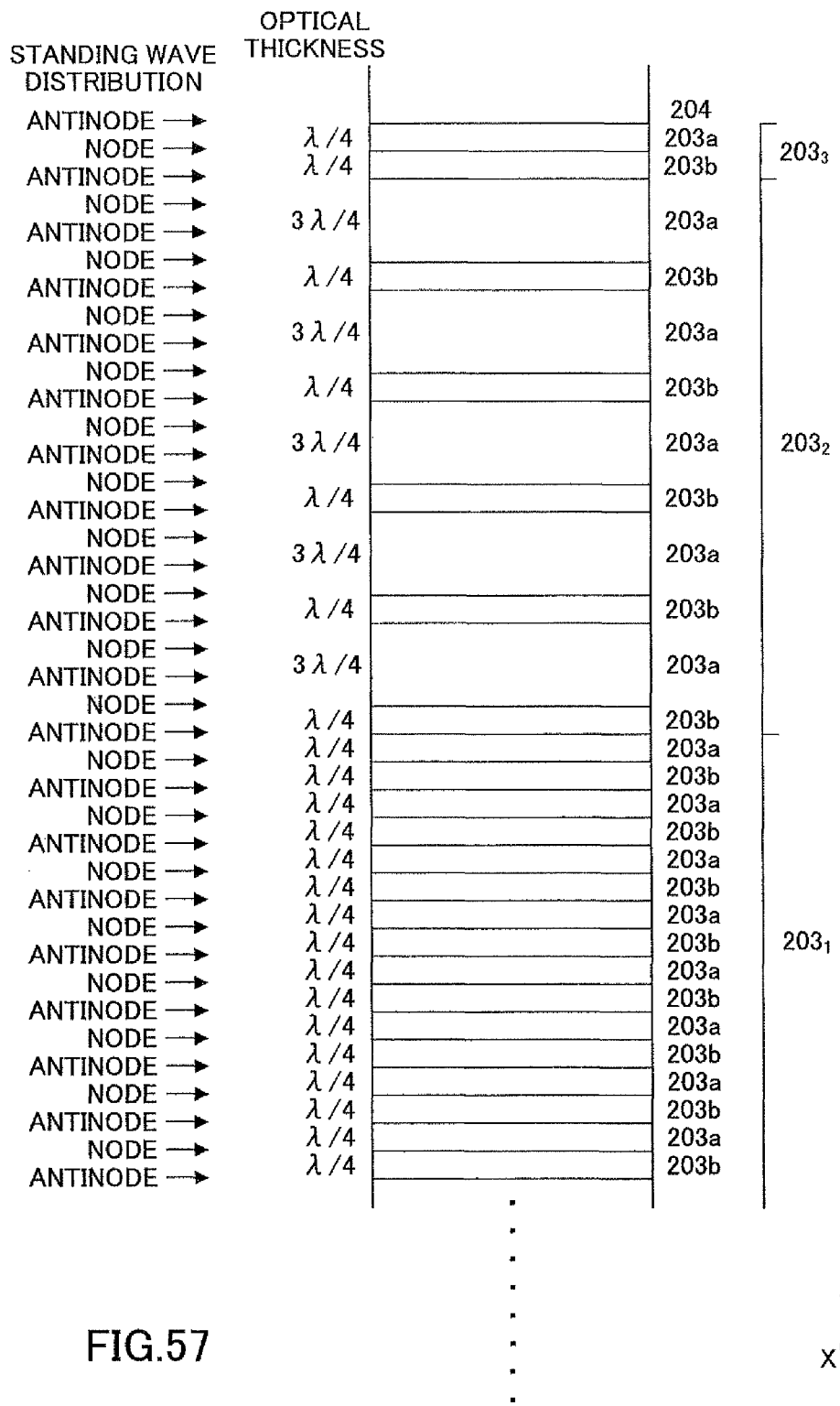
FIG. 57 shows an enlarged view of a part of the lower semiconductor DBR.
Figure 58:
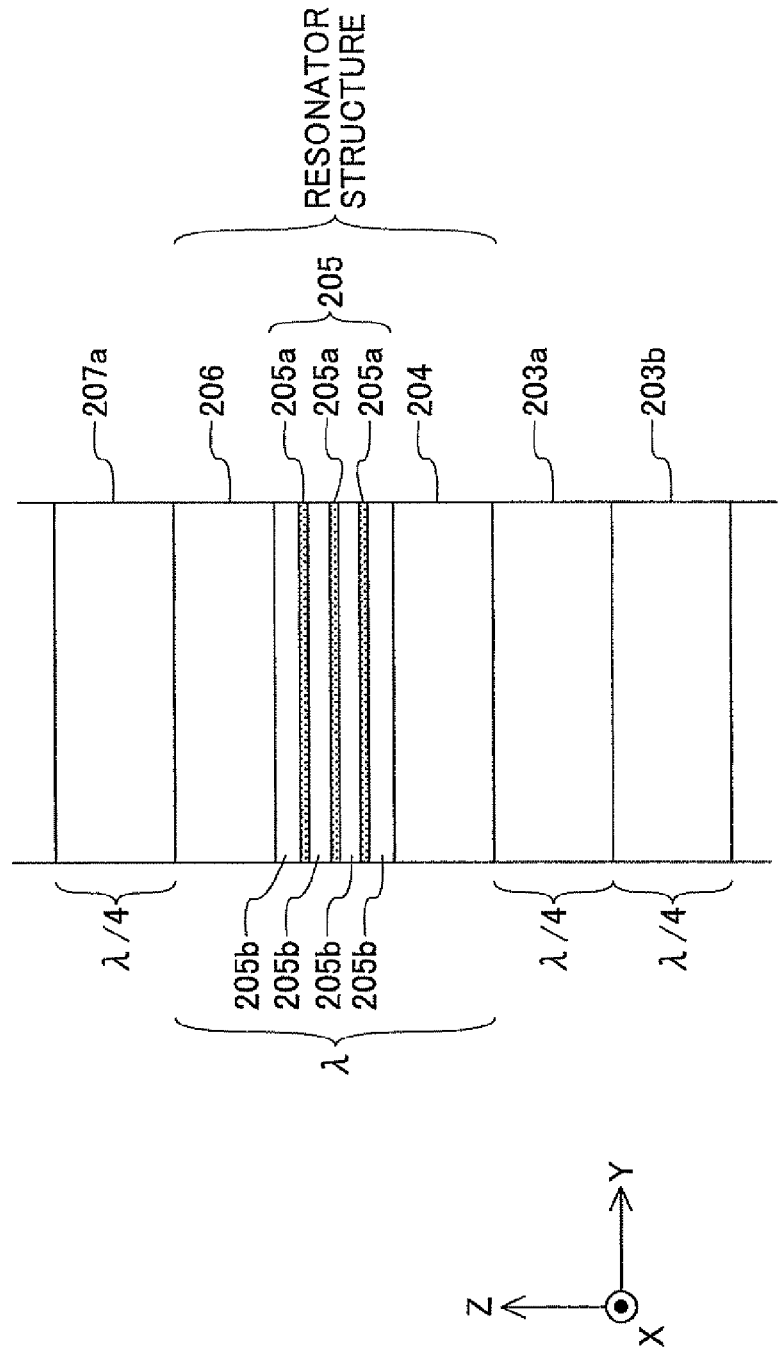
FIG. 58 is an enlarged view showing the vicinity of the active layer.

The lower semiconductor DBR 203 includes a first lower semiconductor DBR $203_1$, a second lower semiconductor DBR $203_2$ and a third lower semiconductor DBR $203_3$, as an example as shown in FIG. 57.

The first lower semiconductor DBR $203_1$ is laid over a +Z-direction surface of the substrate 201 with a buffer layer (not shown) interposed between them. The first lower semiconductor DBR $203_1$ includes 30.5 pairs of an n-AlAs low refractive index layer 203a and an n-$Al_{0.1}Ga_{0.9}As$ high refractive index layer 203b. The low refractive index layer 203a has higher thermal conductivity compared to the high refractive index layer 203b (see FIG. 65). In order to reduce electrical resistance, a compositionally graded layer (not shown) is provided between each two neighboring refractive index layers. In the compositionally graded layer, the composition is gradually changed from one to another. It is designed that each refractive index layer has an optical thickness of $\lambda/4$, where $\lambda$ is an oscillation wavelength, by including ½ the thickness of its neighboring compositionally graded layer.

The second lower semiconductor DBR $203_2$ is laid on a +Z-direction surface of the first lower semiconductor DBR $203_1$, and includes five pairs of the low refractive index layer 203a and the high refractive index layer 203b. In order to reduce electrical resistance, a compositionally graded layer (not shown) is provided between each two neighboring refractive index layers. It is designed that each low refractive index layer 203a has an optical thickness of $3\lambda/4$ by including ½ the thickness of its neighboring compositionally graded layer, and each high refractive index layer 203b has an optical thickness of $\lambda/4$ by including ½ the thickness of its neighboring compositionally graded layer.

The third lower semiconductor DBR $203_3$ is laid on a +Z-direction surface of the second lower semiconductor DBR $203_2$, and includes a pair of the low refractive index layer 203a and the high refractive index layer 203b. In order to reduce electrical resistance, a compositionally graded layer (not shown) is provided between each two neighboring refractive index layers. It is designed that each refractive index layer has an optical thickness of $\lambda/4$ by including ½ the thickness of its neighboring compositionally graded layer.

The lower spacer layer 204 is laid on a +Z-direction surface of the third lower semiconductor DBR $203_3$, and is a non-doped $Al_{0.4}Ga_{0.6}As$ layer.

The active layer 205 is laid on a +Z-direction surface of the lower spacer layer 204, and includes three quantum well layers 205a and four barrier layers 205b, as an example as shown in FIG. 12. Each quantum well layer 205a is made of $Al_{0.12}Ga_{0.88}As$, and each barrier layer 205b is made of $Al_{0.3}Ga_{0.7}As$.

The upper spacer layer 206 is laid on a +Z-direction surface of the active layer 205, and is a non-doped $Al_{0.4}Ga_{0.6}As$ layer.

A section including the lower spacer layer 204, the active layer 205 and the upper spacer layer 206 is referred to as a resonator structure, which is designed to have an optical thickness of $\lambda$. The active layer 205 is provided in the center of the resonator structure, which corresponds to an antinode of the standing wave of the electric field, in order to achieve a high stimulated emission rate. Heat generated in the active layer 105 is designed to be released to the substrate 201 mainly via the lower semiconductor DBR 203.

The upper semiconductor DBR 207 is laid on a +Z-direction surface of the upper spacer layer 206, and includes 24 pairs of a p-$Al_{0.9}Ga_{0.1}As$ low refractive index layer 207a and a p-$Al_{0.1}Ga_{0.9}As$ high refractive index layer 207b. In order to reduce electrical resistance, a compositionally graded layer (not shown) is provided between each two neighboring refractive index layers. It is designed that each refractive index layer has an optical thickness of $\lambda/4$ by including ½ the thickness of its neighboring compositionally graded layer.

In one low refractive index layer of the upper semiconductor DBR 207, a p-AlAs selective oxidation layer having a thickness of 30 nm is inserted. The selective oxidation layer is disposed at a position optically $\lambda/4$ away from the upper spacer layer 206.

The contact layer 209 is a p-GaAs layer laid on a +Z-direction surface of the upper semiconductor DBR 207.

The vertical cavity surface emitting laser device 100A is manufactured in the same manner as described for the vertical cavity surface emitting laser device 100. Note that in FIG. 56, reference numeral 211 denotes a protective layer; reference numeral 212 denotes polyimide; reference numeral 213 denotes a p-electrode; reference numeral 214 denotes an n-electrode; reference numeral 208a denotes an oxidized layer; and reference numeral 208b denotes a current passage region. The vertical cavity surface emitting laser device 100A is able to achieve the same effect as the vertical cavity surface emitting laser device 100.

In this embodiment also, the light source 14 may include the vertical cavity surface emitting laser array 500 shown in FIG. 45 as an example, in place of the vertical cavity surface emitting laser device 100 of the present embodiment.

In general, a desired etching depth is different for each light-emitting part due to variation in the thickness of the crystal growth layer and variation in the etching rate over the substrate (wafer) surface. However, it is difficult to control etching for all the light-emitting parts so that the bottom of etching reaches deeper than the selective oxidation layer but does not reach a low refractive index layer of the lower semiconductor DBR, which low refractive index layer has an Al component equivalent to that of the selective oxidation layer.

Especially in the case of a vertical cavity surface emitting laser array, if an etching width is different due to a difference in the light-emitting part spacing, the etching rate changes. In such a case, even if the above variations are not present, the etching depth is changed for each light-emitting part.

According to the vertical cavity surface emitting laser array 500, the semiconductor DBR is mainly made of an AlGaAs material and the resonator structure is made of an AlGaInPAs material, which includes In. Accordingly, the etching rate of the resonator structure can be set lower than the etching rate of the semiconductor DBRs. Herewith, across the wafer and the array chip, the bottom of etching does not reach the lower semiconductor DBR, and accordingly, it is possible to control etching so that the bottom of etching remains in the resonator structure.

Thus, according to the vertical cavity surface emitting laser array 500, etching is controlled by not providing a layer for stopping etching at a predetermined position but slowing the etching rate. Accordingly, etching can be readily controlled since it is possible to readily detect whether the bottom of etching reaches the resonator structure, using an etching monitor. In addition, it is possible to perform etching up to the vicinity of the center of the resonator structure with high accuracy and reduce the spread of carriers, thus reducing carriers which do not contribute to oscillation.

In the case of providing a layer for stopping etching at a predetermined position, etching in the depth direction (in this case, −Z direction) can be controlled; however, etching in the lateral direction (in this case, a direction parallel to the X-Y plane) cannot be controlled, which causes problems, such as lot-to-lot variation in the mesa size.

The vertical cavity surface emitting laser array 500 is a multibeam light source with 32 channels; however, heat interference of each light-emitting part to neighboring light-emitting parts is mitigated since heat releasing measures are provided. Accordingly, when multiple light-emitting parts are driven at the same time, the vertical cavity surface emitting laser array 500 has only a small characteristic change and exhibits a longer operating life.

The present embodiment is described using the laser printer 1000 as an example of the image forming apparatus; however, the present embodiment of the present invention is not limited to this case. As described in the first embodiment, the image forming apparatus of the present embodiment may be an image forming apparatus for projecting laser light directly onto a medium (e.g. paper), on which colors are developed with the laser light; an image forming apparatus using a silver salt film as an image carrier; or the color printer 2000 having multiple photoreceptor drums.

Figure 59:
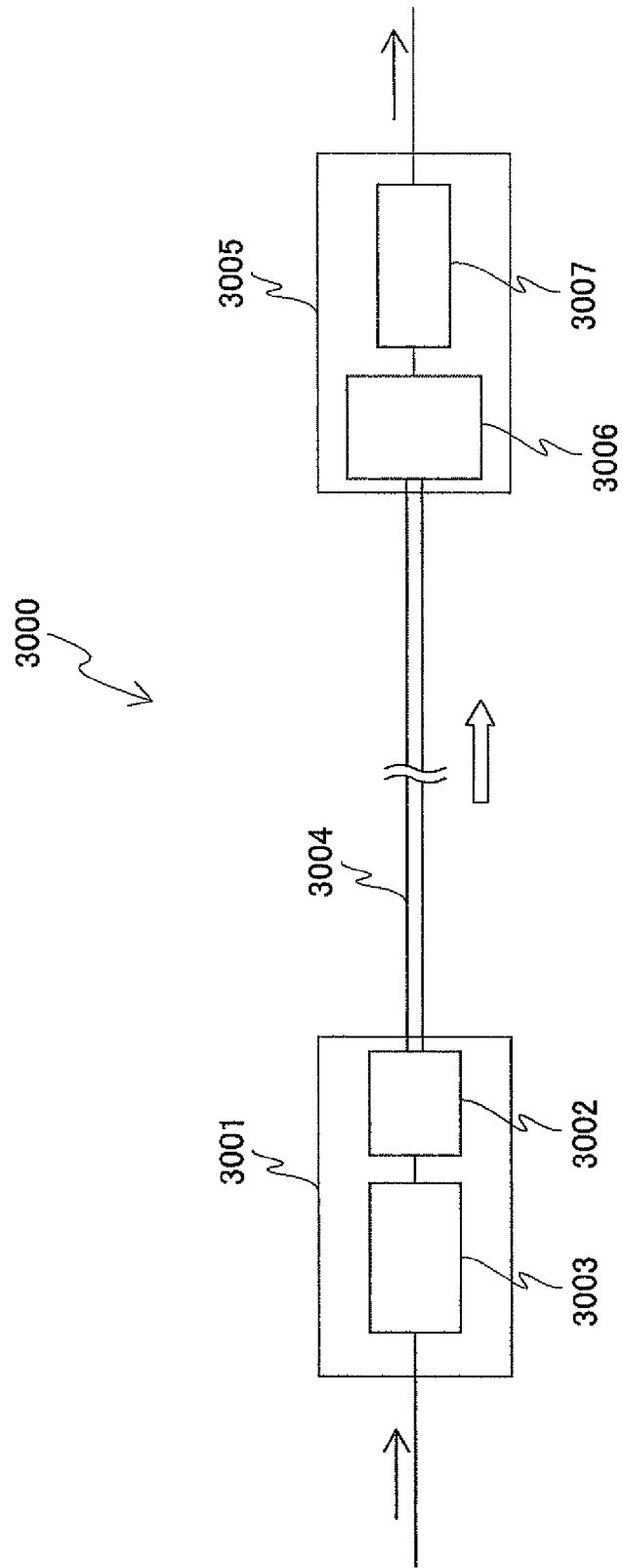
FIG. 59 shows a schematic structure of an optical transmission module and an optical transmission system.

FIG. 59 shows a schematic structure of an optical transmission system 3000. In the optical transmission system 3000, an optical transmitter module 3001 and an optical receiver module 3005 are connected by an optical fiber cable 3004, thereby enabling unidirectional optical communication from the optical transmitter module 3001 to the optical receiver module 3005.

The optical transmitter module 3001 includes a light source 3002 and a drive circuit 3003 for modulating the light intensity of the laser light emitted from the light source 3002 according to an electrical signal input from the outside.

Figure 60:
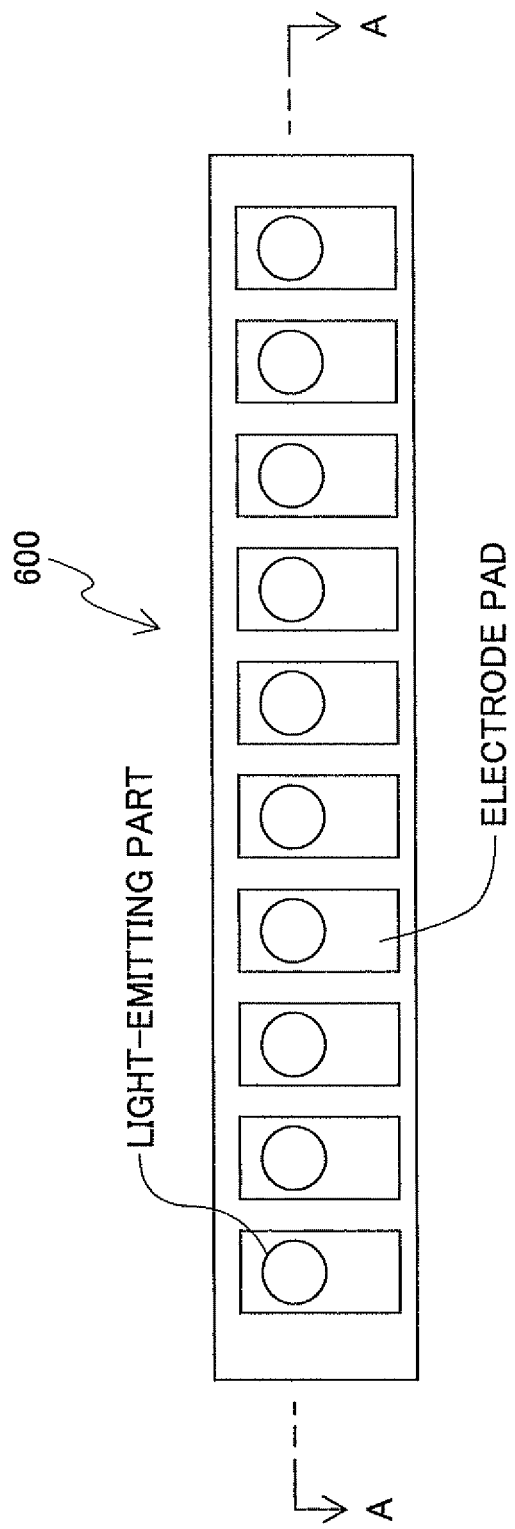
FIG. 60 shows a vertical cavity surface emitting laser array included in a light source.

The light source 3002 includes a vertical cavity surface emitting laser array 600, as an example as shown in FIG. 60.

The vertical cavity surface emitting laser array 600 includes multiple (in this case, ten) light-emitting parts aligned on a single substrate in one dimension. Note that the number of light-emitting parts is not limited to ten.

Figure 61:
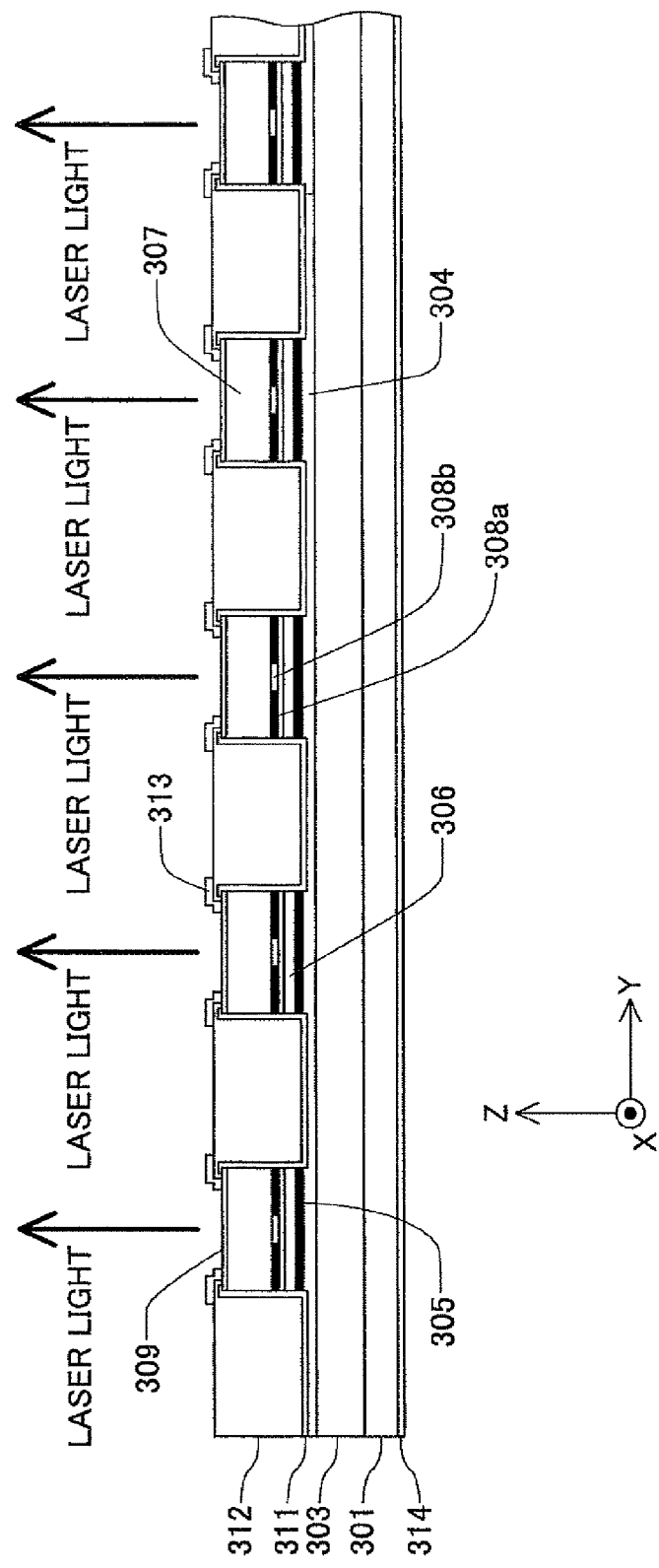
FIG. 61 shows a sectional view along A-A line shown in FIG. 60.

Each light-emitting part of the vertical cavity surface emitting laser array 600 is designed to be a vertical cavity surface emitting laser having an oscillation wavelength of 1.3 μm band. As illustrated in FIG. 61 which is a sectional view along A-A line shown in FIG. 60, each light-emitting part includes a substrate 301, a lower semiconductor DBR 303, a lower spacer layer 304, an active layer 305, an upper spacer layer 306, an upper semiconductor DBR 307, a contact layer 309 and the like.

The substrate 301 is an n-GaAs monocrystalline substrate.

Figure 62:
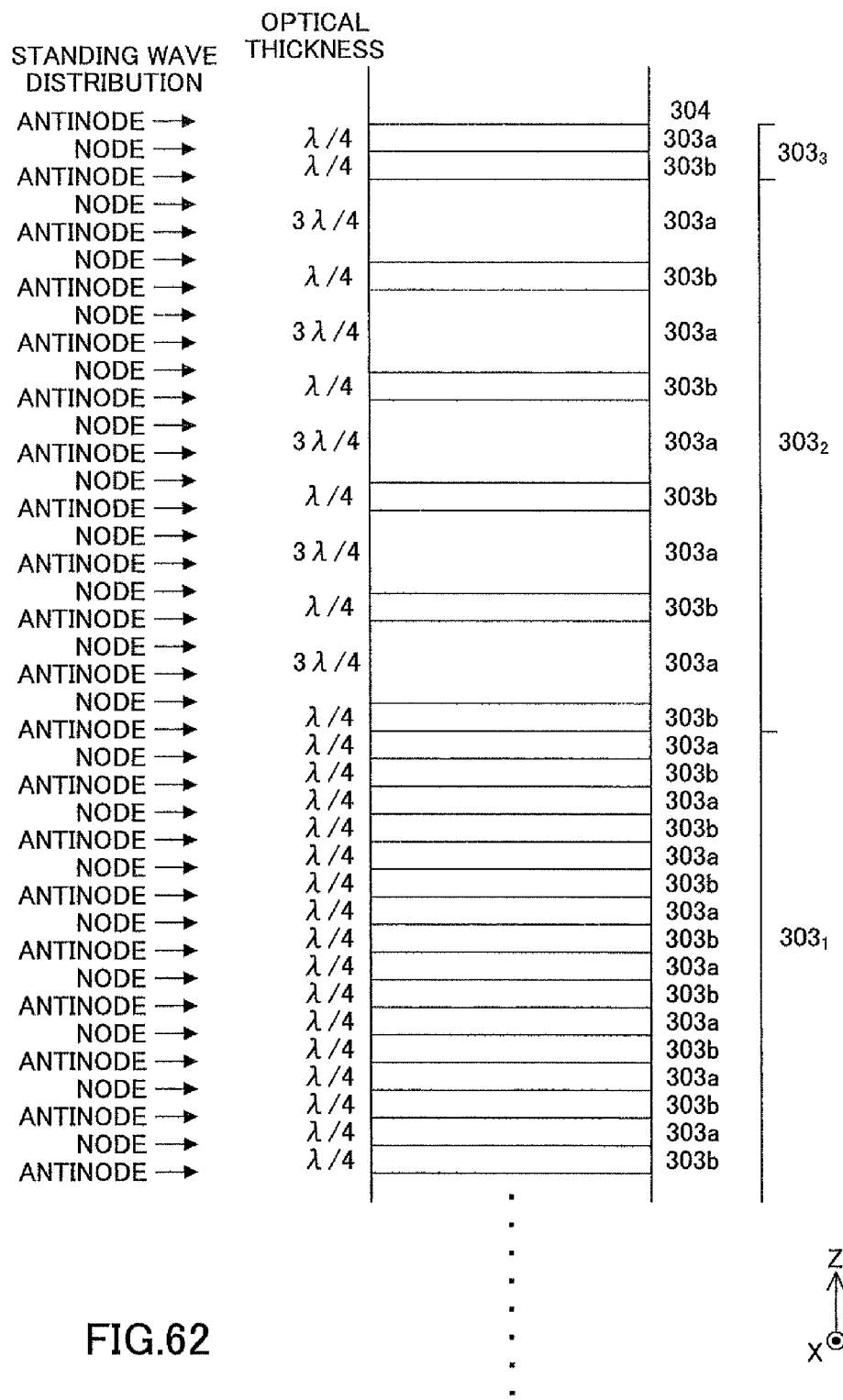
FIG. 62 shows an enlarged view of a part of the lower semiconductor DBR of FIG. 61.

The lower semiconductor DBR 303 includes a first lower semiconductor DBR $303_1$, a second lower semiconductor DBR $303_2$ and a third lower semiconductor DBR $303_3$, as an example as shown in FIG. 62.

The first lower semiconductor DBR $303_1$ is laid over a +Z-direction surface of the substrate 301 with a buffer layer (not shown) interposed between them. The first lower semiconductor DBR $303_1$ includes 30.5 pairs of an n-AlAs low refractive index layer 303a and an n-GaAs high refractive index layer 303b. The low refractive index layer 303a has higher thermal conductivity compared to the high refractive index layer 303b. In order to reduce electrical resistance, a compositionally graded layer (not shown) is provided between each two neighboring refractive index layers. In the compositionally graded layer, the composition is gradually changed from one to another. It is designed that each refractive index layer has an optical thickness of λ/4, where λ is an oscillation wavelength, by including ½ the thickness of its neighboring compositionally graded layer.

The second lower semiconductor DBR $303_2$ is laid on a +Z-direction surface of the first lower semiconductor DBR $303_1$, and includes five pairs of the low refractive index layer 303a and the high refractive index layer 303b. In order to reduce electrical resistance, a compositionally graded layer (not shown) is provided between each two neighboring refractive index layers. It is designed that each low refractive index layer 303a has an optical thickness of 3λ/4 by including ½ the thickness of its neighboring compositionally graded layer, and each high refractive index layer 303b has an optical thickness of λ/4 by including ½ the thickness of its neighboring compositionally graded layer.

The third lower semiconductor DBR $303_3$ is laid on a +Z-direction surface of the second lower semiconductor DBR $303_2$, and includes a pair of the low refractive index layer 303a and the high refractive index layer 303b. In order to reduce electrical resistance, a compositionally graded layer (not shown) is provided between each two neighboring refractive index layers. It is designed that each refractive index layer has an optical thickness of λ/4 by including ½ the thickness of its neighboring compositionally graded layer.

The lower spacer layer 304 is laid on a +Z-direction surface of the third lower semiconductor DBR $303_3$, and is a non-doped GaAs layer.

Figure 63:
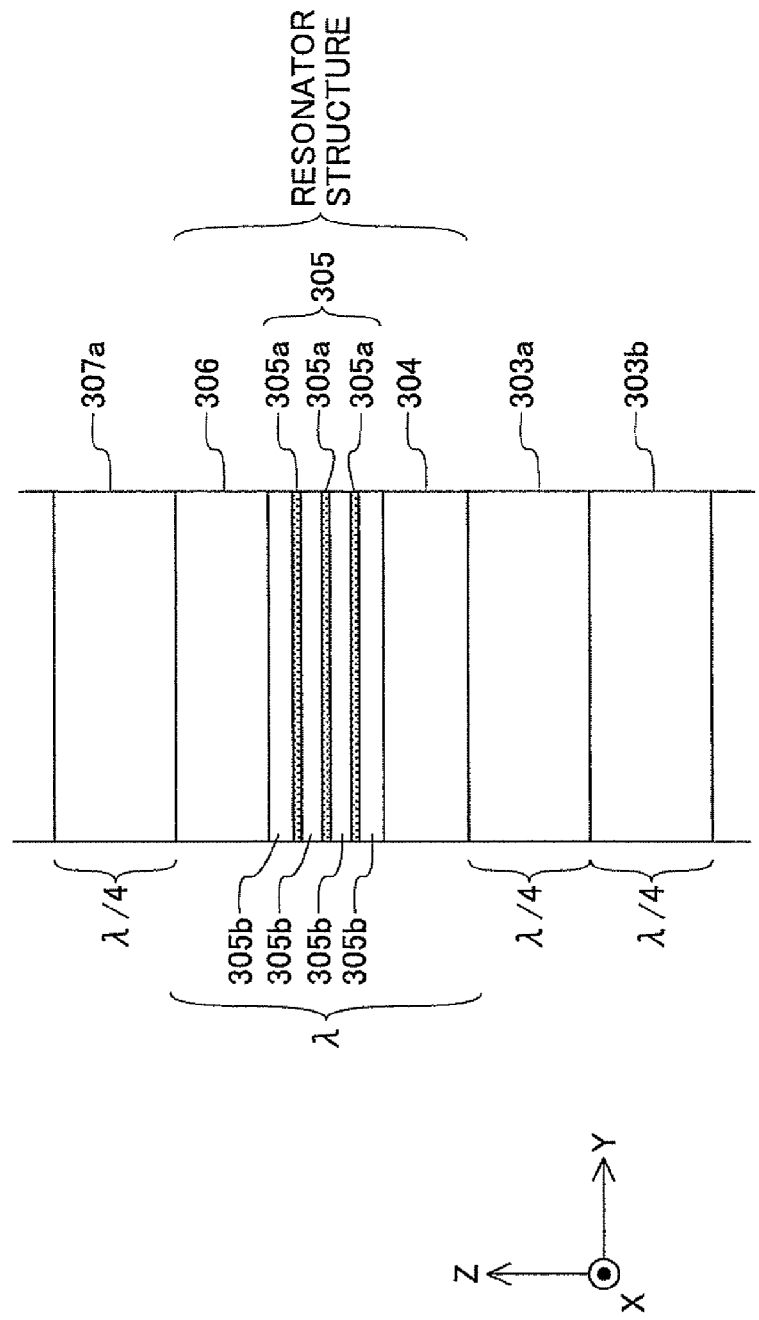
FIG. 63 is an enlarged view showing the vicinity of the active layer of FIG. 61.

The active layer 305 is laid on a +Z-direction surface of the lower spacer layer 304, and includes three quantum well layers 305a and four barrier layers 305b, as an example as shown in FIG. 63. Each quantum well layer 305a is made of GaInNAs, and each barrier layer 305b is made of GaAs.

The upper spacer layer 306 is laid on a +Z-direction surface of the active layer 305, and is a non-doped GaAs layer.

A section including the lower spacer layer 304, the active layer 305 and the upper spacer layer 306 is referred to as a resonator structure, which is designed to have an optical thickness of λ. The active layer 305 is provided in the center of the resonator structure, which corresponds to an antinode of the standing wave of the electric field, in order to achieve a high stimulated emission rate. Heat generated in the active layer 305 is designed to be released mainly via the lower semiconductor DBR 303.

The upper semiconductor DBR 307 is laid on a +Z-direction surface of the upper spacer layer 306, and includes 26 pairs of a low refractive index layer 307a and a p-GaAs high refractive index layer 307b. In order to reduce electrical resistance, a compositionally graded layer (not shown) is provided between each two neighboring refractive index layers. It is designed that each refractive index layer has an optical thickness of λ/4 by including ½ the thickness of its neighboring compositionally graded layer.

In one low refractive index layer of the upper semiconductor DBR 307, a p-AlAs selective oxidation layer having a thickness of 20 nm is inserted. The selective oxidation layer is disposed at a position optically 5λ/4 away from the upper spacer layer 306.

The low refractive index layer including the selective oxidation layer is a p-$Al_{0.6}Ga_{0.4}As$ layer, and other low refractive index layers are p-$Al_{0.9}Ga_{0.1}As$ layers. In the low refractive index layer including the selective oxidation layer, a p-$Al_{0.8}Ga_{0.2}As$ intermediate layer (not shown) having a thickness of 35 nm is disposed adjacent to the selective oxidation layer.

The vertical cavity surface emitting laser array 600 is manufactured in the same manner as described for the vertical cavity surface emitting laser device 100. Note that in FIG. 61, reference numeral 311 denotes a protective layer; reference numeral 312 denotes polyimide; reference numeral 313 denotes a p-electrode; reference numeral 314 denotes an n-electrode; reference numeral 308a is an oxidized layer; and reference numeral 308b is a current passage region.

The vertical cavity surface emitting laser array 600 produces an effect similar to that of the vertical cavity surface emitting laser array 500 since the lower semiconductor DBR 303 of each light-emitting part has a structure similar to that of the low semiconductor DBR 103 of the vertical cavity surface emitting laser device 100.

Note that when the mesa is formed, a GaInP layer which includes In (indium) may be used in place of the GaAs spacer layer in order to stop etching within the resonator structure.

Figure 64:
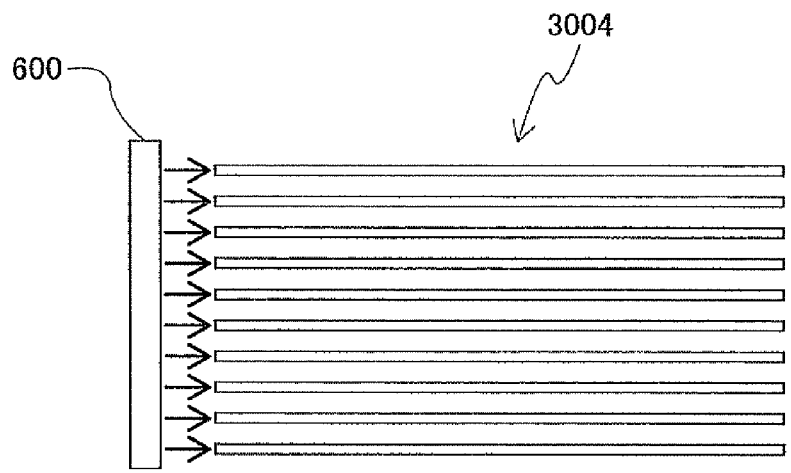
FIG. 64 shows an optical fiber cable of FIG. 59.

An optical signal output from the light source 3002 enters and passes through the optical fiber cable 3004, and is then input to the optical receiver module 3005. The optical fiber cable 3004 includes multiple optical fibers corresponding one-to-one with the multiple light-emitting parts of the vertical cavity surface emitting laser array 600, as an example as shown in FIG. 64.

The optical receiver module 3005 includes a light receiving element 3006 for converting an optical signal into an electrical signal and a receiving circuit 3007 for performing signal amplification, waveform-shaping and the like on the electrical signal output from the light receiving element 3006.

The optical transmitter module 3001 of the present embodiment is capable of producing a stable optical signal since the light source 3002 includes the vertical cavity surface emitting laser array 600. As a result, the optical transmission system 3000 is able to perform high-quality optical transmission.

Accordingly, the optical transmission system 3000 is also effective for short distance data communication used in home, office, devices and the like.

In addition, since multiple light-emitting parts having uniform characteristics are mounted on a single substrate, data transmission simultaneously using a great number of beams can be readily achieved, thereby enabling high-speed communication.

Furthermore, since the vertical cavity surface emitting laser operates with low power consumption, it is possible to reduce the temperature increase especially in the case when the vertical cavity surface emitting laser is integrated and used in a device.

Note that the above embodiment describes the case where the light-emitting parts correspond one-to-one with the optical fibers; however, multiple vertical cavity surface emitting laser devices having different oscillation wave lengths may be arranged in one dimension or in a two-dimensional array so as to perform multiple-wavelength transmission, thereby further increasing the transmission rate.

A unidirectional communication structure is shown above as an example; however, the present invention is also applicable to a bidirectional communication structure.

INDUSTRIAL APPLICABILITY

As has been described above, the vertical cavity surface emitting laser device and the vertical cavity surface emitting laser array of the present invention are capable of suppressing the negative droop characteristic and performing high-power operations in single fundamental transverse-mode oscillation. The optical scanning apparatus of the present invention is capable of performing optical scanning with a high degree of accuracy. The image forming apparatus of the present invention is capable of forming high-quality images.

Also, the vertical cavity surface emitting laser device and the vertical cavity surface emitting laser array of the present invention are capable of achieving longer operating life, high luminous efficiency and excellent temperature characteristics. The optical scanning apparatus of the present invention is capable of performing stable optical scanning. The image forming apparatus of the present invention is capable of forming high-quality images. The optical transmission module of the present invention is capable of producing a stable optical signal. The optical transmission system of the present invention is capable of performing high-quality optical transmission.

This application is based upon and claims the benefit of priority of Japanese Patent Applications No. 2008-120062 filed on May 2, 2008, No. 2008-152427 filed on Jun. 11, 2008 and No. 2009-093021 filed on Apr. 7, 2009, the entire contents of which are hereby incorporated herein by reference.

The invention claimed is:

1. A vertical cavity surface emitting laser device that emits light orthogonally in relation to a substrate, the vertical cavity surface emitting laser device comprising:
a resonator structure including an active layer; and
semiconductor multilayer reflectors disposed in such a manner as to sandwich therebetween the resonator structure and including a confinement structure which confines an injected current and transverse modes of oscillation light at the same time, the confinement structure having an oxidized region which surrounds a current passage region, the oxidized region being formed by oxidizing a part of a selective oxidation layer which includes aluminum and including at least an oxide,
wherein the selective oxidation layer is at least 25 nm in thickness, and
the semiconductor multilayer reflectors include an optical confinement reducing section which reduces optical confinement in a transverse direction, and the optical confinement reducing section is disposed on a substrate side in relation to the resonator structure, and
wherein the semiconductor multilayer reflectors include a plurality of pairs of low refractive index layer and high refractive index layer, the optical confinement reducing section includes at least one of the pairs of low refractive index layer and high refractive index layer having uniform refractive index in the transverse direction from one edge of the device to another edge of the device, and at least one of the low refractive index layer and the high refractive index layer of the at least one of the pairs has an optical thickness of $(2n+1)\lambda/4$, where $\lambda$ is an oscillation wavelength and n is an integer equal to or greater than 1,
wherein at least one of the pairs is disposed between the optical confinement reducing section and the resonator structure, and both the low refractive index layer and the high refractive index layer of the at least one of the pairs have an optical thickness of $\lambda/4$.

2. The vertical cavity surface emitting laser device as claimed in claim 1, wherein a lowest oscillation threshold current is obtained at 25° C. or less.

3. The vertical cavity surface emitting laser device as claimed in claim 1, wherein an expression $-2.54d^2-0.14t^2-0.998d\cdot t+53.4d+12.9t-216\geq0.9$ is satisfied, where d is a width of the current passage region in μm and t is thickness of the oxidized region in nm.

4. The vertical cavity surface emitting laser device as claimed in claim 1, wherein the selective oxidation layer is 30 nm or more in thickness, and a lowest oscillation threshold current is obtained at 35° C. or less.

5. The vertical cavity surface emitting laser device as claimed in claim 1, wherein when a square wave current pulse having a pulse period of 1 ms and a pulse width of 500 μs is applied, an expression of $(P1-P2)/P2\geq-0.1$ is satisfied, where P1 is an optical output obtained 10 ns after the application and P2 is an optical output obtained 1 μs after the application.

6. An optical scanning apparatus for scanning a scanning surface with light, the optical scanning apparatus comprising:
a light source including the vertical cavity surface emitting laser device of claim 1;
a deflector configured to deflect light emitted from the light source; and
a scanning optical system configured to focus the deflected light on the scanning surface.

7. An image forming apparatus comprising:
at least one image carrier; and
one or more of the optical scanning apparatuses of claim 6 configured to irradiate, on the at least one image carrier, light which includes image information.

8. An image forming apparatus as claimed in claim 7, wherein the image information is multi-color image information.

* * * * *